US012601045B2

(12) United States Patent
Yamazaki et al.

(10) Patent No.: US 12,601,045 B2
(45) Date of Patent: Apr. 14, 2026

(54) MANUFACTURING EQUIPMENT FOR LIGHT-EMITTING DEVICE

(71) Applicant: Semiconductor Energy Laboratory Co., Ltd., Atsugi (JP)

(72) Inventors: Shunpei Yamazaki, Setagaya (JP); Ryota Hodo, Atsugi (JP); Yasuhiro Jinbo, Isehara (JP); Kenichi Okazaki, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 392 days.

(21) Appl. No.: 18/280,517

(22) PCT Filed: Mar. 11, 2022

(86) PCT No.: PCT/IB2022/052186
§ 371 (c)(1),
(2) Date: Sep. 6, 2023

(87) PCT Pub. No.: WO2022/200906
PCT Pub. Date: Sep. 29, 2022

(65) Prior Publication Data
US 2024/0155870 A1    May 9, 2024

(30) Foreign Application Priority Data

| | | |
|---|---|---|
| Mar. 25, 2021 | (JP) | 2021-051710 |
| Apr. 8, 2021 | (JP) | 2021-065856 |
| Jan. 10, 2022 | (JP) | 2022-001992 |

(51) Int. Cl.
*H10K 59/12* (2023.01)
*C23C 14/56* (2006.01)
(Continued)

(52) U.S. Cl.
CPC ....... *C23C 14/568* (2013.01); *H10K 59/1201* (2023.02); *H10K 71/10* (2023.02); *H10K 71/231* (2023.02); *H10K 71/40* (2023.02)

(58) Field of Classification Search
CPC .......................... C23C 14/568; H10K 59/1201
See application file for complete search history.

(56) References Cited

U.S. PATENT DOCUMENTS

| | | | |
|---|---|---|---|
| 5,953,985 | A | 9/1999 | Kobayashi |
| 6,120,338 | A | 9/2000 | Hirano et al. |

(Continued)

FOREIGN PATENT DOCUMENTS

| | | |
|---|---|---|
| CN | 001941288 A | 4/2007 |
| CN | 102760698 A | 10/2012 |

(Continued)

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.

(Continued)

*Primary Examiner* — Douglas M Menz
(74) *Attorney, Agent, or Firm* — Eric J. Robinson; Robinson Intellectual Property Law Office, P.C.

(57) ABSTRACT

Manufacturing equipment in which processes from processing to sealing of an organic compound film can be successively performed is provided. A patterning process of a light-emitting device and a sealing process that is performed to prevent the surface and side surface of an organic layer from being exposed to the air can be performed successively, whereby a minute light-emitting device with high luminance and high reliability can be formed. Moreover, the manufacturing equipment can be incorporated in in-line manufacturing equipment where apparatuses are arranged in the (Continued)

order of processes for a light-emitting device, resulting in high throughput manufacturing.

16 Claims, 27 Drawing Sheets

(51) Int. Cl.
| | |
|---|---|
| *H10K 71/10* | (2023.01) |
| *H10K 71/20* | (2023.01) |
| *H10K 71/40* | (2023.01) |

(56) References Cited

U.S. PATENT DOCUMENTS

| | | | |
|---|---|---|---|
| 7,723,205 | B2 | 5/2010 | Kakehata |
| 9,219,253 | B2 | 12/2015 | Izumi et al. |
| 10,185,066 | B2 | 1/2019 | Chae et al. |
| 2002/0072139 | A1 | 6/2002 | Kashiwabara |
| 2007/0069401 | A1 | 3/2007 | Kakehata |
| 2009/0023236 | A1* | 1/2009 | Miyairi .............. H10D 30/0316 |
| | | | 438/30 |
| 2011/0148290 | A1 | 6/2011 | Oota |
| 2012/0256204 | A1 | 10/2012 | Yoshizumi et al. |
| 2012/0273804 | A1 | 11/2012 | Hatano |
| 2012/0276484 | A1 | 11/2012 | Izumi et al. |
| 2013/0084531 | A1 | 4/2013 | Hamaguchi et al. |
| 2013/0084664 | A1 | 4/2013 | Yoshitoku et al. |
| 2013/0084666 | A1 | 4/2013 | Oshige |
| 2013/0280839 | A1 | 10/2013 | Sonoda et al. |
| 2013/0295705 | A1 | 11/2013 | Sonoda et al. |
| 2014/0004640 | A1 | 1/2014 | Hamaguchi et al. |
| 2014/0004642 | A1 | 1/2014 | Otsuka et al. |
| 2015/0060826 | A1 | 3/2015 | Matsumoto. et al. |
| 2015/0069360 | A1 | 3/2015 | Sato |
| 2015/0076476 | A1 | 3/2015 | Odaka et al. |
| 2016/0120054 | A1 | 4/2016 | Yamazaki et al. |
| 2016/0147109 | A1 | 5/2016 | Yamazaki et al. |
| 2016/0172595 | A1 | 6/2016 | Malinowski et al. |
| 2016/0315133 | A1 | 10/2016 | Sato |
| 2017/0141167 | A1 | 5/2017 | Naganuma |
| 2017/0256754 | A1 | 9/2017 | Defranco et al. |
| 2017/0338108 | A1 | 11/2017 | Yamazaki et al. |
| 2017/0352540 | A1 | 12/2017 | Watanabe et al. |
| 2018/0045866 | A1 | 2/2018 | Chae et al. |
| 2018/0190908 | A1 | 7/2018 | Ke et al. |
| 2020/0185636 | A1* | 6/2020 | Yen ........................ H01L 21/677 |
| 2020/0203662 | A1 | 6/2020 | Mollard et al. |
| 2023/0040161 | A1 | 2/2023 | Asami |
| 2023/0274935 | A1 | 8/2023 | Yamazaki et al. |

FOREIGN PATENT DOCUMENTS

| | | | |
|---|---|---|---|
| CN | 107728368 | A | 2/2018 |
| EP | 3282310 | A | 2/2018 |
| JP | 2000-036385 | A | 2/2000 |
| JP | 2002-324673 | A | 11/2002 |
| JP | 2003-059663 | A | 2/2003 |
| JP | 2007-123849 | A | 5/2007 |
| JP | 2008-098106 | A | 4/2008 |
| JP | 2008-147072 | A | 6/2008 |
| JP | 2008-251270 | A | 10/2008 |
| JP | 2012-160473 | A | 8/2012 |
| JP | 2012-238580 | A | 12/2012 |
| JP | 2014-120218 | A | 6/2014 |
| JP | 2014-135251 | A | 7/2014 |
| JP | 2014-232568 | A | 12/2014 |
| JP | 2015-115178 | A | 6/2015 |
| JP | 2016-197494 | A | 11/2016 |
| JP | 2018-025802 | A | 2/2018 |
| JP | 2019-179696 | A | 10/2019 |
| JP | 2020-160305 | A | 10/2020 |
| KR | 2018-0018945 | A | 2/2018 |
| TW | 201813080 | | 4/2018 |

OTHER PUBLICATIONS

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

International Search Report (Application No. PCT/IB2022/052186) Dated May 24, 2022.

Written Opinion (Application No. PCT/IB2022/052186) Dated May 24, 2022.

* cited by examiner 72 display devices
Φ＝12 inch 56 display device
Φ＝12 inch 49 display devices
Φ＝12 inch

FIG. 18A
FIG. 18B
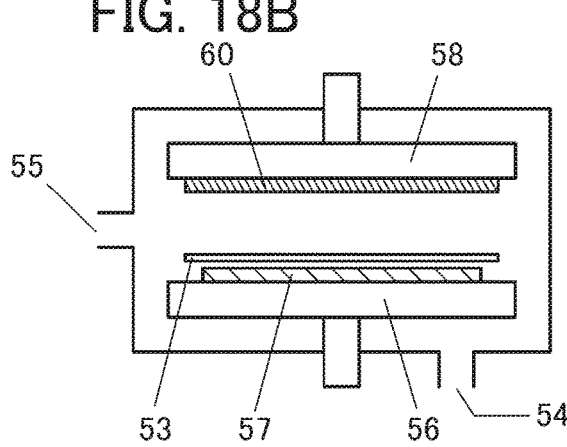
FIG. 18C
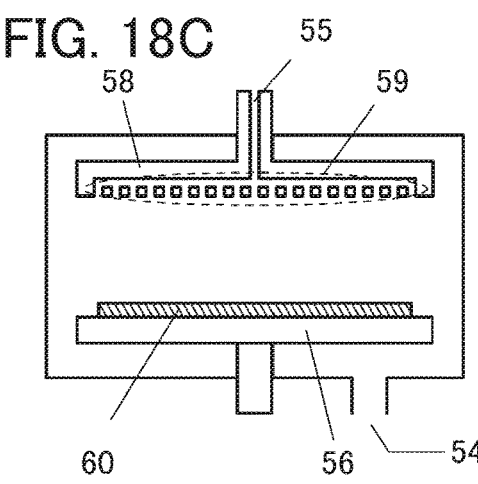
FIG. 18D
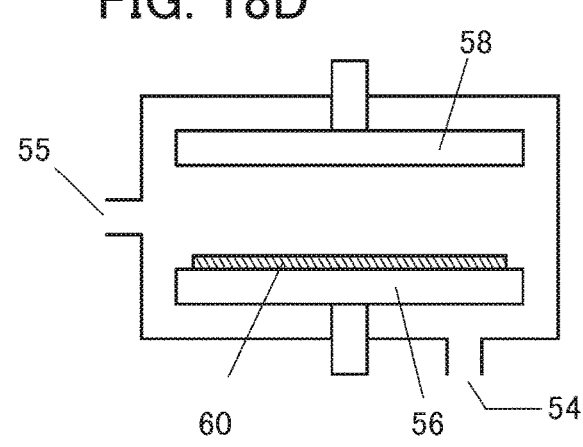
FIG. 18E
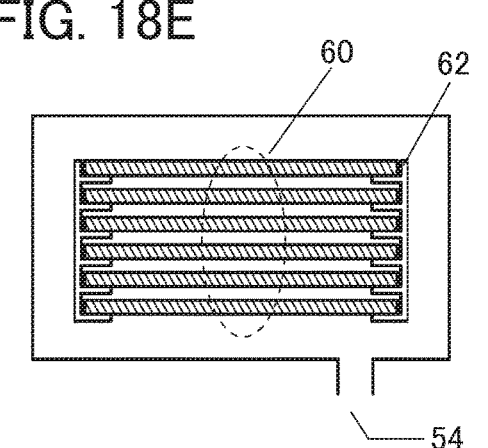
FIG. 18F
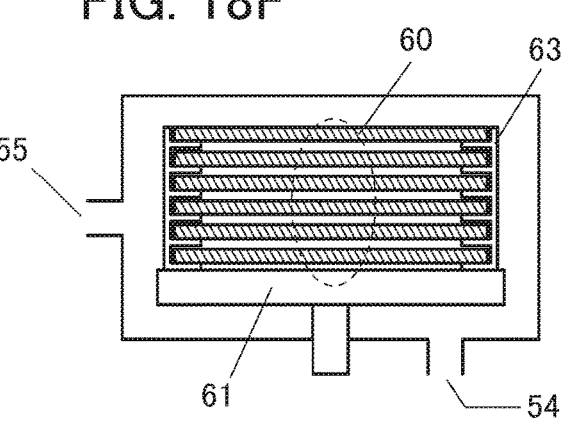
FIG. 18G
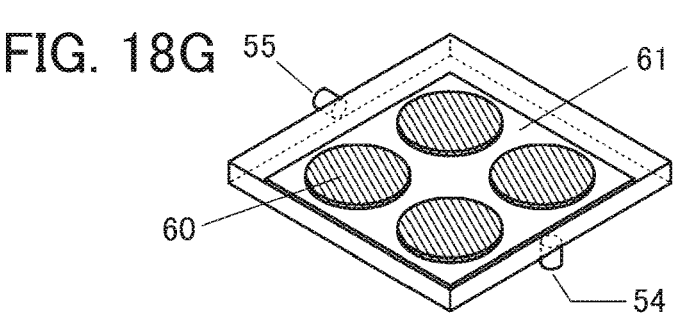

111

125Rf 111    112Rf

143a

125Rf 111    112Rf

125R 111    112Rf

125R 111    112R 125R   126Rf   128Rf 111    112R

FIG. 22A
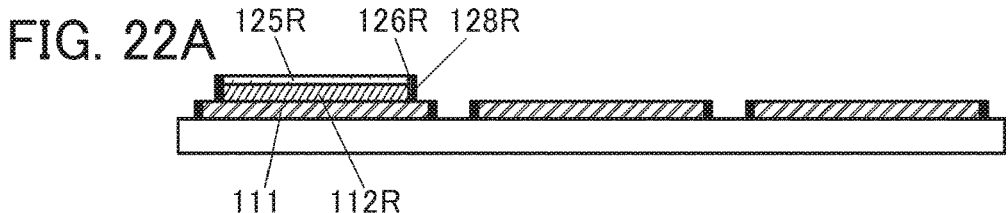
125R   126R   128R
111   112R
FIG. 22B
125R   126R   128R   125Gf
111   112R   112Gf
FIG. 22C
143b
125R   126R   128R   125Gf
111   112R   112Gf
FIG. 22D
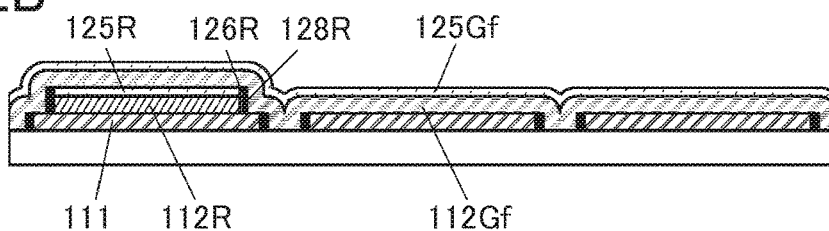
125R   126R   128R   125G
111   112R   112Gf
FIG. 22E
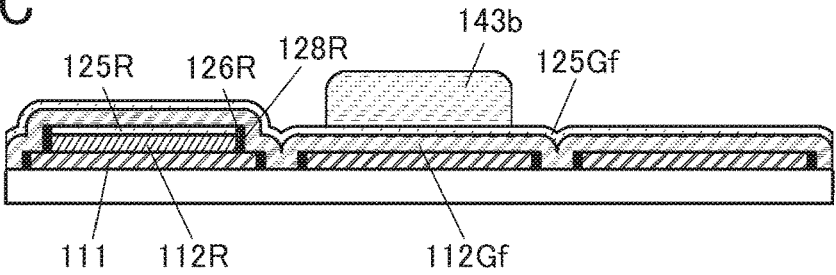
125R   126R   128R   125G
111   112R   112G
FIG. 22F
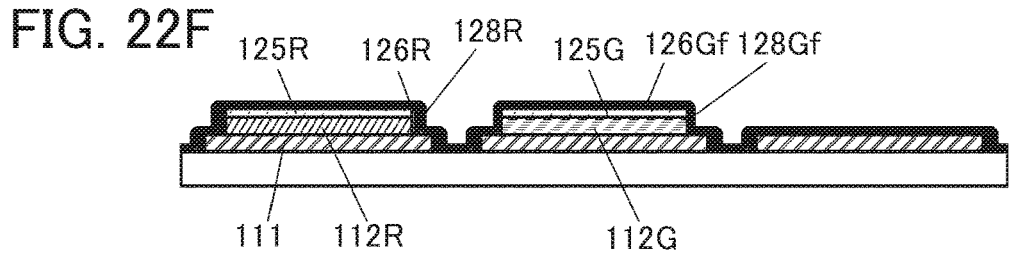
125R   126R   128R   125G   126Gf   128Gf
111   112R   112G 125R   126R   128R   125G   126G   128G 111   112R   112G 125R   126R   128R   125G   126G   128G   125Bf 111   112R   112G   112Bf 125R   126R   128R   125G   126G   128G   143c   125Bf 111   112R   112G   112Bf 125R   126R   128R   125G   126G   128G   125B 111   112R   112G   112Bf 125R   126R   128R   125G   126G   128G   125B 111   112R   112G   112B 125R   126R   128R   125G   126G   128G   125B   126Bf   128Bf 111   112R   112G   112B FIG. 24A
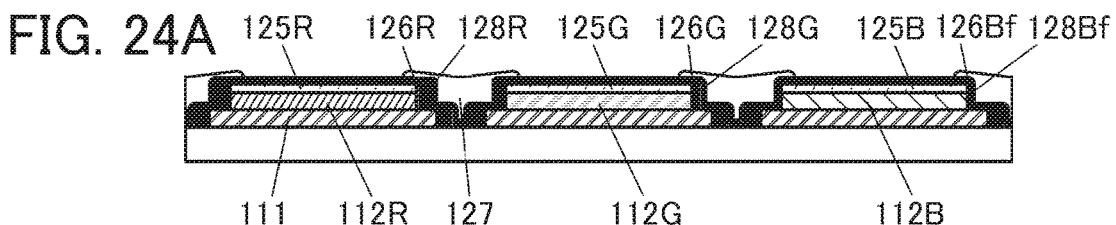
FIG. 24B
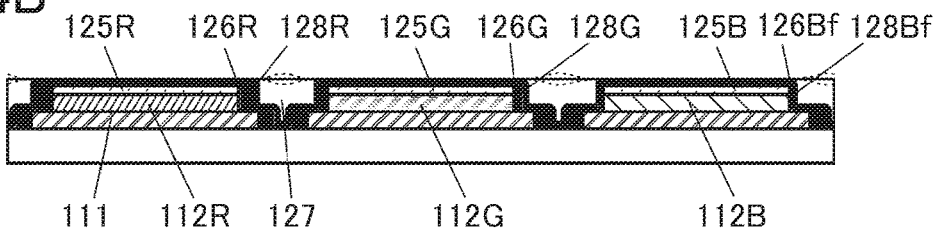
FIG. 24C
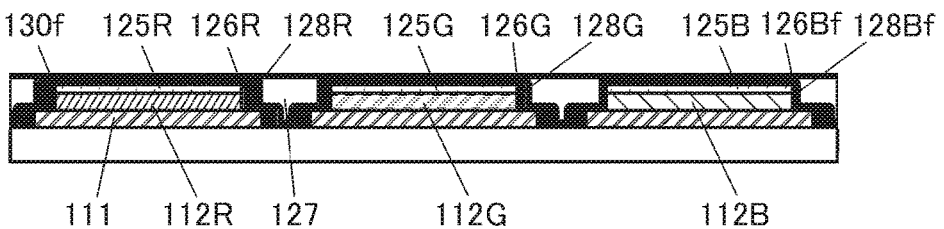
FIG. 24D
FIG. 24E
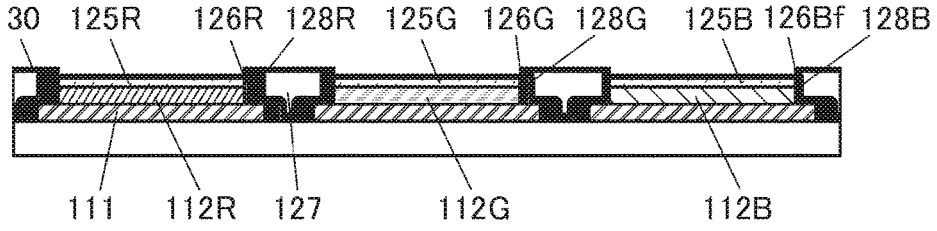
FIG. 24F
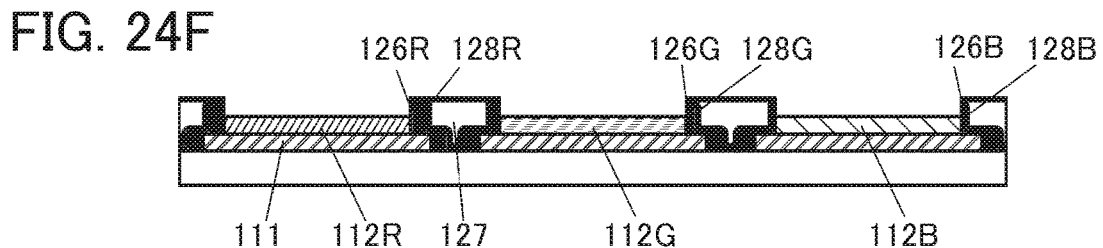

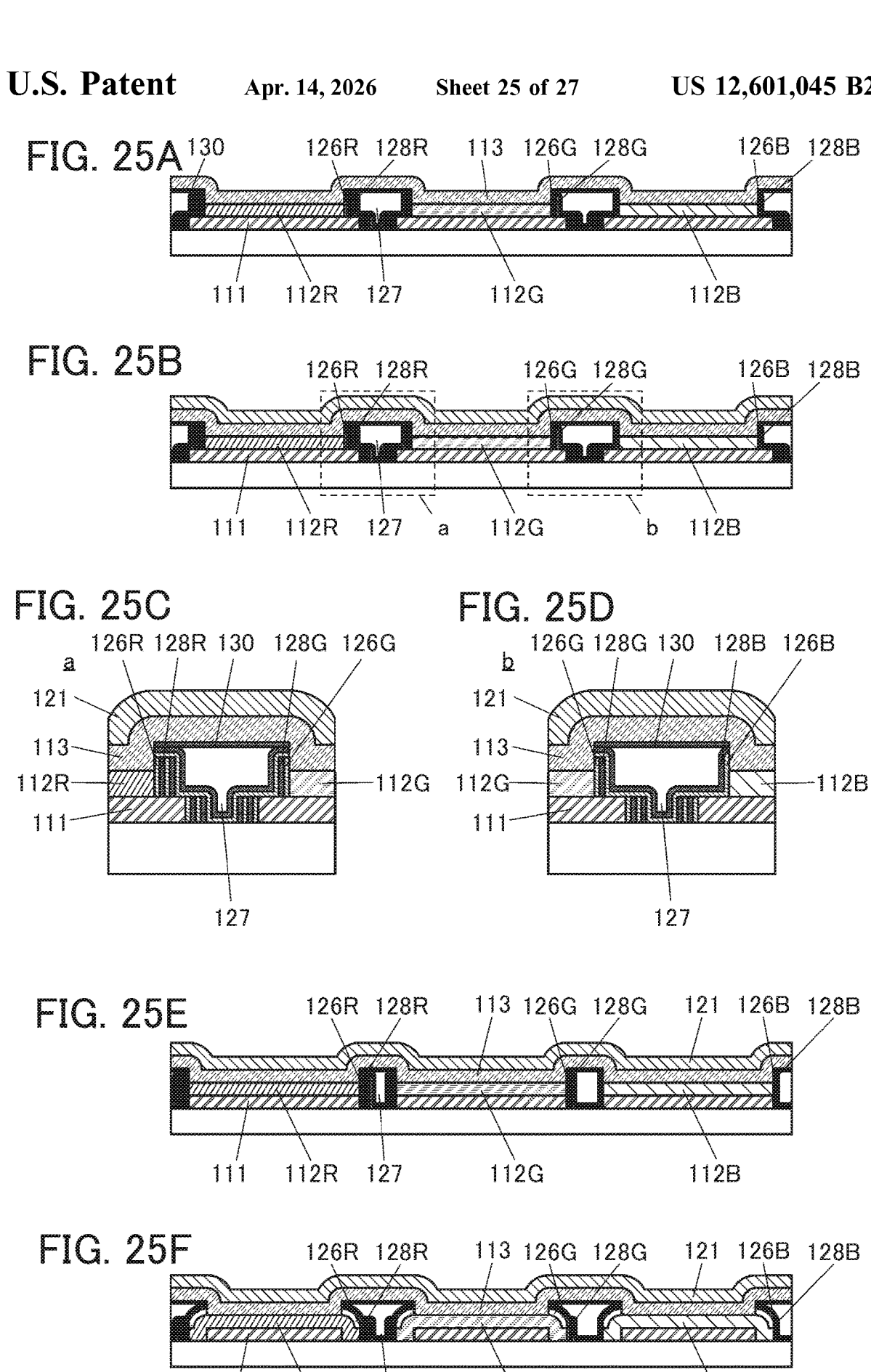

FIG. 27

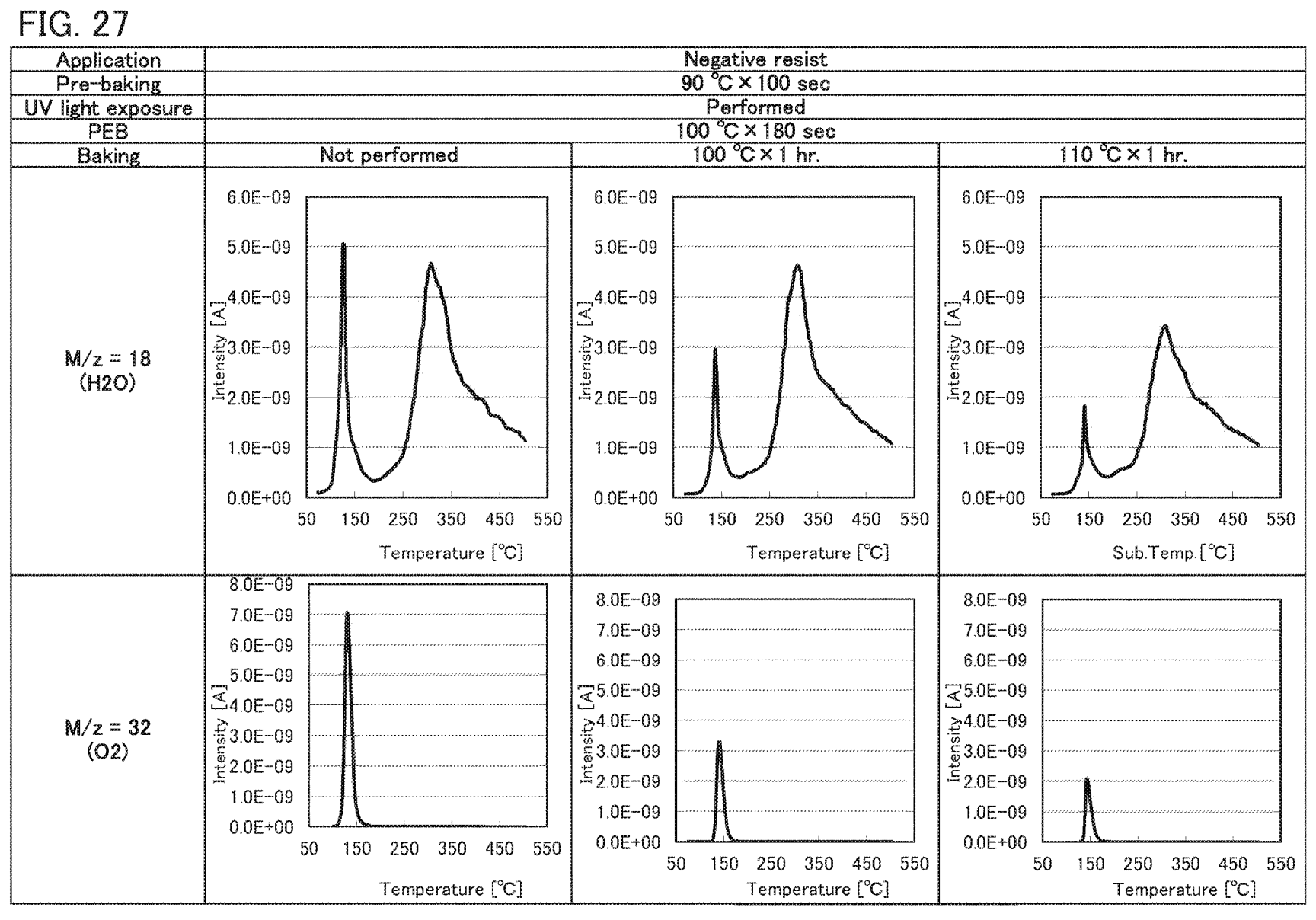

| Application | Negative resist | | |
|---|---|---|---|
| Pre-baking | 90 °C × 100 sec | | |
| UV light exposure | Performed | | |
| PEB | 100 °C × 180 sec | | |
| Baking | Not performed | 100 °C × 1 hr. | 110 °C × 1 hr. |

M/z = 18 (H2O)

M/z = 32 (O2)

MANUFACTURING EQUIPMENT FOR LIGHT-EMITTING DEVICE

TECHNICAL FIELD

One embodiment of the present invention relates to manufacturing equipment and a manufacturing method of a light-emitting device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Accordingly, more specific examples of the technical field of one embodiment of the present invention disclosed in this specification include a semiconductor device, a display device, a liquid crystal display device, a light-emitting apparatus, a lighting device, a power storage device, a memory device, an image capturing device, an operation method thereof, and a manufacturing method thereof.

BACKGROUND ART

In recent years, higher-resolution display panels have been required. Examples of devices that require high-resolution display panels include a smartphone, a tablet terminal, and a laptop computer. Furthermore, higher resolution has been required for a stationary display device such as a television device or a monitor device along with an increase in definition. An example of a device required to have the highest resolution is a device for virtual reality (VR) or augmented reality (AR).

Examples of a display device that can be used for a display panel include, typically, a liquid crystal display device, a light-emitting apparatus including a light-emitting device such as an organic EL (Electro Luminescence) element or a light-emitting diode (LED), and electronic paper performing display by an electrophoretic method or the like.

For example, the basic structure of an organic EL element that is a light-emitting element is a structure where a layer containing a light-emitting organic compound is provided between a pair of electrodes. By voltage application to this element, light emission can be obtained from the light-emitting organic compound. A display device using such an organic EL element does not need a backlight that is necessary for a liquid crystal display device and the like; thus, a thin, lightweight, high-contrast, and low-power display device can be achieved. Patent Document 1, for example, discloses an example of a display device using an organic EL element.

REFERENCE

Patent Document

[Patent Document 1] Japanese Published Patent Application No. 2002-324673

SUMMARY OF THE INVENTION

Problems to be Solved by the Invention

As an organic EL display device capable of full-color display, a structure in which white-light-emitting devices and color filters are combined and a structure in which R, G, and B light-emitting devices are formed in the same plane are known.

The latter structure is ideal in terms of power consumption, and light-emitting materials are separately deposited using a metal mask or the like in manufacture of medium- and small-sized panels under the existing circumstances. However, the process using a metal mask has low alignment accuracy and needs a reduction in the area occupied by light-emitting devices in a pixel, resulting in difficulty in increasing an aperture ratio.

Therefore, an issue of the process using a metal mask is to increase the density of pixels and emission intensity. It is preferable to increase the area of a light-emitting device with the use of a lithography process or the like for increasing the aperture ratio. However, the reliability of a material included in the light-emitting device is lowered when impurities (e.g., water, oxygen, and hydrogen) in the air enter the material, necessitating performing a plurality of processes in a controlled atmosphere.

In the case where a light-emitting device is fabricated with a vacuum evaporation method using a metal mask, an issue such as necessity of a plurality of manufacturing equipment lines arises. For example, since a metal mask has to be cleaned regularly, at least two or more manufacturing equipment lines need to be prepared, and one manufacturing equipment needs to be used for fabrication while the other manufacturing equipment is being under maintenance. In consideration of mass production, a plurality of manufacturing equipment lines are required. Thus, the issue is that the initial investment for introducing manufacturing equipment significantly increases.

Furthermore, there is a demand for small-size high-resolution displays for AR and VR. Displays for AR and VR are incorporated into devices with small volume, such as glasses-type or goggle-type devices, and accordingly preferably have narrow bezels. Therefore, drivers for a pixel circuit and the like of the displays are preferably provided below the pixel circuit.

In view of this, an object of one embodiment of the present invention is to provide manufacturing equipment for a light-emitting device, in which processes from processing to sealing of an organic compound film can be successively performed without exposure to the air. Another object is to provide manufacturing equipment for a light-emitting device, in which processes from formation to sealing of a light-emitting device can be successively performed. Another object is to provide manufacturing equipment for a light-emitting device, in which a light-emitting device can be formed without using a metal mask. Another object is to provide a method for manufacturing a light-emitting device.

Note that the description of these objects does not preclude the existence of other objects. Note that one embodiment of the present invention does not have to achieve all these objects. Other objects will be apparent from and can be derived from the description of the specification, the drawings, the claims, and the like.

Means for Solving the Problems

One embodiment of the present invention relates to manufacturing equipment for a light-emitting device.

One embodiment of the present invention is manufacturing equipment for a light-emitting device, which includes a load chamber, a first etching apparatus, a plasma treatment apparatus, a standby chamber, a deposition apparatus, a second etching apparatus, an unload chamber, a transfer chamber, and a carrying device. The carrying device is provided in the transfer chamber. The load chamber, the first etching apparatus, the plasma treatment apparatus, the standby chamber, the deposition apparatus, the second etching apparatus, and the unload chamber are each connected to the transfer chamber through a gate valve. The carrying device is capable of transferring an object to be processed from any one of the load chamber, the first etching apparatus, the plasma treatment apparatus, the standby chamber, the deposition apparatus, the second etching apparatus, and the unload chamber to any one of the others. The object to be processed in which an organic compound film, a first inorganic film, and a resist mask are stacked sequentially over a silicon substrate is carried into the load chamber. The object to be processed is carried to the first etching apparatus, the plasma treatment apparatus, the standby chamber, the deposition apparatus, and the second etching apparatus in sequence. The organic compound film is processed into an island-shaped organic compound layer, a protective layer is formed on a side surface of the organic compound layer, and the object to be processed is carried out to the unload chamber.

The first etching apparatus is a dry etching apparatus in which the first inorganic film can be formed to have an island shape using the resist mask as a mask and the organic compound film can be processed into the island-shaped organic compound layer using the island-shaped first inorganic film as a mask.

The first etching apparatus can have an ashing function of removing the resist mask.

In the plasma treatment apparatus, a side surface of the island-shaped organic compound layer can be irradiated with plasma generated from an inert gas to perform cleaning on the side surface of the island-shaped organic compound layer.

The standby chamber is capable of storing a plurality of objects to be processed.

The deposition apparatus is an ALD apparatus in which a second inorganic film covering the island-shaped first inorganic film and the island-shaped organic compound layer can be deposited. The deposition apparatus can be of a batch processing type.

The second etching apparatus is a dry etching apparatus in which the protective layer can be formed on the side surface of the island-shaped organic compound layer by performing anisotropic etching on the second inorganic film.

Manufacturing equipment for a light-emitting device can be configured such that the above-described manufacturing equipment for a light-emitting device is a third cluster, a plurality of apparatuses in which a photolithography process with the resist mask is performed is a second cluster, and a plurality of apparatuses in which a deposition process of the organic compound film and the first inorganic film is performed is a first cluster.

The first cluster, the second cluster, and the third cluster can be connected in sequence.

An object to be processed stored in a container whose atmosphere is controlled to an inert gas atmosphere may be transferred between the first cluster and the second cluster and between the second cluster and the third cluster.

Three combinations of the first cluster, the second cluster, and the third cluster may be included in the manufacturing equipment for a light-emitting device.

The first cluster may include a surface treatment apparatus. The surface treatment apparatus can use plasma generated from a halogen-containing gas.

The first cluster can include one or more deposition apparatuses selected from an evaporation apparatus, a sputtering apparatus, a CVD apparatus, and an ALD apparatus.

The second cluster can include an application apparatus, a light exposure apparatus, a development apparatus, and a baking apparatus.

Effect of the Invention

According to one embodiment of the present invention, manufacturing equipment for a light-emitting device, in which processes from processing to sealing of an organic compound film can be successively performed without exposure to the air can be provided. Alternatively, manufacturing equipment for a light-emitting device, in which processes from formation to sealing of a light-emitting device can be successively performed can be provided. Alternatively, manufacturing equipment for a light-emitting device, in which a light-emitting device can be formed without using a metal mask can be provided. Alternatively, a method for manufacturing a light-emitting device can be provided.

Note that the description of these effects does not preclude the existence of other effects. One embodiment of the present invention does not need to have all of these effects. Note that effects other than these can be derived from the description of the specification, the drawings, the claims, and the like.

BRIEF DESCRIPTION OF THE DRAWINGS

FIG. 18A to FIG. 18G are diagrams illustrating vacuum process apparatuses.

FIG. 22A to FIG. 22F are diagrams illustrating a manufacturing method of a display device.

FIG. 24A to FIG. 24F are diagrams illustrating a manufacturing method of a display device.

FIG. 25A and FIG. 25B are diagrams illustrating a manufacturing method of a display device.

FIG. 25C and FIG. 25D are enlarged views of FIG. 25B. FIG. 25E and FIG. 25F are diagrams each illustrating a display device.

FIG. 27 are graphs showing results of TDS measurement.

MODE FOR CARRYING OUT THE INVENTION

Figure 1:
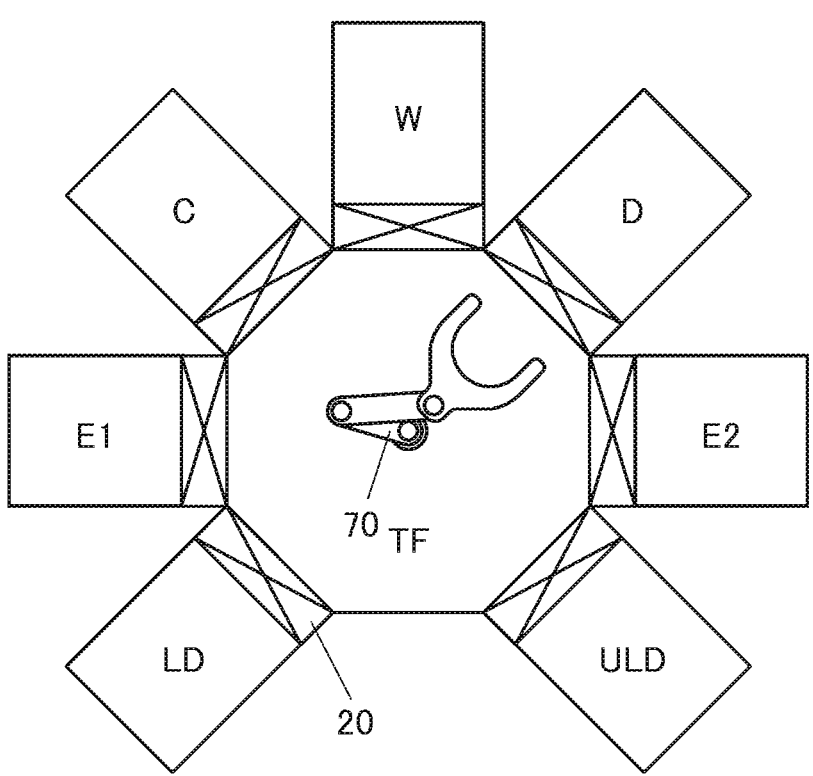
FIG. 1 is a diagram illustrating manufacturing equipment.

Embodiments will be described in detail with reference to the drawings. Note that the present invention is not limited to the following description, and it will be readily understood by those skilled in the art that modes and details of the present invention can be modified in various ways without departing from the spirit and scope of the present invention. Therefore, the present invention should not be construed as being limited to the description of embodiments below. Note that in structures of the invention described below, the same reference numerals are used in common, in different drawings, for the same portions or portions having similar functions, and a repeated description thereof is omitted in some cases. Note that the hatching of the same component that constitutes a drawing is sometimes omitted or changed as appropriate in different drawings.

Embodiment 1

In this embodiment, manufacturing equipment for a light-emitting device that is one embodiment of the present invention is described with reference to drawings.

One embodiment of the present invention is manufacturing equipment mainly used for formation of a display device including a light-emitting device (also referred to as a light-emitting element) such as an organic EL element. It is preferable to use a lithography process in order to downscale the organic EL element or increase the area occupied by the organic EL element in a pixel. However, the reliability is impaired when impurities such as water, oxygen, and hydrogen enter the organic EL element. Therefore, it is necessary to take measures such that sealing is made to prevent the surface and side surface of a patterned organic layer from being exposed to the air and that the atmosphere is controlled to be an inert gas atmosphere with a low dew point from the manufacturing stage, for example.

In the manufacturing equipment of one embodiment of the present invention, a deposition process, a lithography process, an etching process, and a sealing process that are for forming a light-emitting device can be successively performed without exposure to the air. Thus, a minute light-emitting device with high luminance and high reliability can be formed. Moreover, the manufacturing equipment of one embodiment of the present invention can have an in-line system where apparatuses are arranged in the order of processes for the light-emitting device, resulting in high throughput manufacturing.

As a supporting substrate for forming a light-emitting device, a silicon wafer can be used. A silicon wafer where a driver circuit, a pixel circuit, and the like are formed in advance is used as a support substrate, and a light-emitting device can be formed over these circuits. Thus, a display device with a narrow bezel, which is suitable for AR or VR, can be formed. The silicon wafer is preferably $8 inches or more (e.g., $12 inches). Note that the support substrate for forming the light-emitting device is not limited to the above. For example, glass, quartz, ceramics, sapphire, a resin, a metal, an alloy, or a semiconductor (e.g., GaAs) can be used for the support substrate for forming the light-emitting device.

Structure Example 1

FIG. 1 is a diagram illustrating the manufacturing equipment for a light-emitting device that is one embodiment of the present invention. In the manufacturing equipment, a process for processing an organic compound film into an island-shaped organic compound layer and a process for forming a layer protecting the organic compound layer in the manufacturing processes of the light-emitting device can be performed. Accordingly, the organic compound layer, which is a component of the light-emitting device, can be taken out from an unload chamber without being exposed to the air, and thus the formed light-emitting device can have high reliability.

The manufacturing equipment includes a load chamber LD, an unload chamber ULD, a standby chamber W, a transfer chamber TF, and a plurality of treatment chambers. The transfer chamber TF is provided with a carrying device 70.

The load chamber LD, the standby chamber W, the unload chamber ULD, and the plurality of treatment chambers are each connected to the transfer chamber TF through a gate valve 40.

The carrying device 70 can transfer an object to be processed from any one of the load chamber LD, the standby chamber W, the unload chamber ULD and each individual treatment chamber to any one of the other chambers. In this specification, a group of apparatuses which shares a carrying device or the like is called a cluster. Furthermore, an object to be processed is a processing target object in the manufacturing equipment and is not limited to an object before being processed but includes an object on which a plurality of processing steps has been performed.

Note that the load chamber LD and the unload chamber ULD are controlled under reduced pressure or normal pressure during the operation of the manufacturing equipment. The transfer chamber TF, the standby chamber W, and the plurality of treatment chambers are controlled under reduced pressure.

As the plurality of treatment chambers, for example, an etching apparatus E1, a plasma treatment apparatus C, a deposition apparatus D, and an etching apparatus E2 can be used. The objected to be processed, which is taken into the manufacturing equipment, can include a stacked body in which an organic compound film, an inorganic film, and a resist mask are stacked in this order, for example.

The etching apparatus E1 can be a dry etching apparatus. The etching apparatus E1 can be used in a process for processing an inorganic film and an organic compound film that are objects to be processed into an island-shaped organic compound layer. The etching apparatus E1 may have an ashing function. With the ashing function, a resist mask can be removed.

The plasma treatment apparatus C includes a pair of electrodes of a parallel-plate type, for example, and voltage is applied between the electrodes in an inert gas atmosphere under reduced pressure, whereby plasma can be generated. The object to be processed is irradiated with plasma generated from an inert gas, so that a reaction product, an absorbed gas, and the like remaining on the surface of the object to be processed can be removed. Examples of the inert gas to be used include a high-purity noble gas such as helium, argon, or neon, nitrogen, or a mixed gas thereof.

Either before or after the above plasma treatment, vacuum baking treatment is preferably performed in the same apparatus, thereby removing water absorbed on the surface. The vacuum baking is preferably performed within such a temperature range that the organic compound layer does not deteriorate, and for example, the temperature condition can be set to be higher than or equal to 70° C. and lower than or equal to 120° C., preferably higher than or equal to 80° C. and lower than or equal to 100° C. Note that the baking vacuum treatment may be performed in the deposition apparatus D before a deposition process that is the next process.

The standby chamber W can make a plurality of objects to be processed be in a standby state. For example, in the case where the deposition apparatus D has a batch processing system, the plurality of objects to be processed are made to be in a standby state in the standby chamber W while treatment in the etching apparatus E1 and treatment in the plasma treatment apparatus C are proceeded, whereby the throughput can be improved.

A plurality of the standby chambers W may be provided. For example, a standby chamber W where objects to be processed are made to be on standby after batch processing is finished in the deposition apparatus D may be provided. All the objects to be processed can be taken out from the deposition apparatus D, and thus next treatment can be performed in the deposition apparatus D, whereby the throughput can be improved.

As the deposition apparatus D, for example, a deposition apparatus such as an evaporation apparatus, a sputtering apparatus, a CVD (Chemical Vapor Deposition) apparatus, or an ALD (Atomic Layer Deposition) apparatus can be used. In particular, it is preferable to use an ALD apparatus, which provides good coverage. In the deposition apparatus D, a protective film such as an inorganic film covering the island-shaped organic compound layer can be formed. In the deposition apparatus D, not only a single layer but also two or more different kinds of layers can be formed. The deposition apparatus D may have a single-wafer processing system, not being limited to the batch processing system.

The etching apparatus E2 can be a dry etching apparatus capable of anisotropic etching treatment. The protective film covering the island-shaped organic compound is subjected to anisotropic etching, whereby part of the protective film can remain on the side surface of the island-shaped organic compound. The part of the protective film can function as a protective layer protecting the side surface of the island-shaped organic compound.

An inorganic film or the like is provided over the top surface of the island-shaped organic compound in advance and the protective layer is provided on the side surface of the island-shaped organic compound layer by successively performing treatment in the etching apparatus E1, the plasma treatment apparatus C, the deposition apparatus D, and the etching apparatus E2, whereby the island-shaped organic compound layer is in a sealed state.

Thus, the island-shaped organic compound layer is not exposed to the air when the object to be processed is taken out from the unload chamber to the air after processing;

therefore, the formed light-emitting device can have high reliability. Note that details of the manufacturing processes of the light-emitting device using the manufacturing equipment will be described later.

Figure 2A:
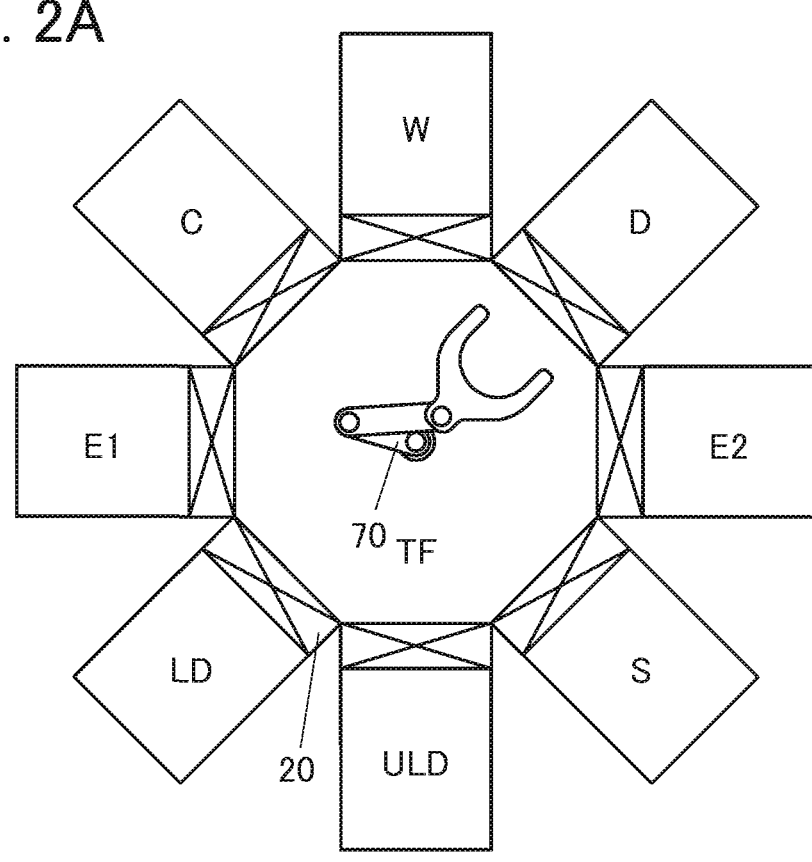
FIG. 2A and FIG. 2B are diagrams each illustrating manufacturing equipment.

The manufacturing equipment may have a structure illustrated in FIG. 2A. The manufacturing equipment illustrated in FIG. 2A is different from the manufacturing equipment illustrated in FIG. 1 in including a surface treatment apparatus S.

The surface treatment apparatus S can have the same structure as the plasma treatment apparatus C and can perform a surface treatment process. The surface condition (e.g., wettability) of the object to be processed is sometimes changed depending on the treatment in the etching apparatus E2. In the case where the next process performed on the object to be processed carried out from the unload chamber ULD is deposition of an organic compound film, a defect such as peeling occurs in some cases unless the surface of the object to be processed is in an appropriate condition. Therefore, it is preferable to improve the surface condition of the object to be processed by plasma treatment with a halogen-containing gas in the surface treatment apparatus S.

For example, when a deposition surface is an oxide, the oxide surface is made to have an affinity for water in some cases owing to the treatment in the etching apparatus E1 or E2. In this case, a hydrophilic group in the deposition surface is substituted by fluorine or a fluoroalkyl group by plasma treatment using a fluorine-based gas, whereby the surface can have a hydrophobic property, and a peeling defect can be prevented. As the fluorine-based gas, for example, fluorocarbon such as $CF_4$, $C_2F_6$, $C_4F_6$, $C_4Fs$, or $CHF_3$, $SF_6$, $NF_3$, or the like can be used. In addition, helium, argon, hydrogen, or the like may be added to the above gas.

Alternatively, a coating apparatus may be used as the surface treatment apparatus S. For example, a method such as spin coating, dip coating, or spray coating, a method in which the object to be processed is exposed to an atmosphere of a coating agent, or the like can be used. As the coating agent, a silane coupling agent such as hexamethyl-disilazane (HMDS) can be used for example, whereby a surface of the object to be processed can be made to have a hydrophobic property.

Note that in the case where the surface treatment apparatus S is not needed, another apparatus may be provided in the position of the surface treatment apparatus S. For example, the number of apparatuses requiring a long treatment time among the etching apparatus E1, the plasma treatment apparatus C, the deposition apparatus D, and the etching apparatus E2 is set to be two or more, and treatment is performed in these apparatuses in parallel, whereby the throughput can be increased.

For example, a plurality of deposition apparatuses D may be provided. In the deposition apparatus D included in the manufacturing equipment in FIG. 1, two or more different kinds of films are provided in some cases. Even when the number of deposition apparatuses D is one, different films can be deposited by switching a source gas in the case where the deposition apparatus D is an ALD apparatus or a CVD apparatus or by switching a target in the case where the deposition apparatus D is a sputtering apparatus.

However, it is difficult to provide different types of deposition apparatuses such as an ALD apparatus and a sputtering apparatus in one chamber. Therefore, a plurality of deposition apparatuses D may be provided.

Alternatively, another process may be performed in another apparatus provided in the position of the surface treatment apparatus S. Note that the surface treatment apparatus S may be provided in the structure of FIG. 1. Alternatively, the surface treatment apparatus S may be provided in another cluster responsible for a deposition process.

Figure 2B:
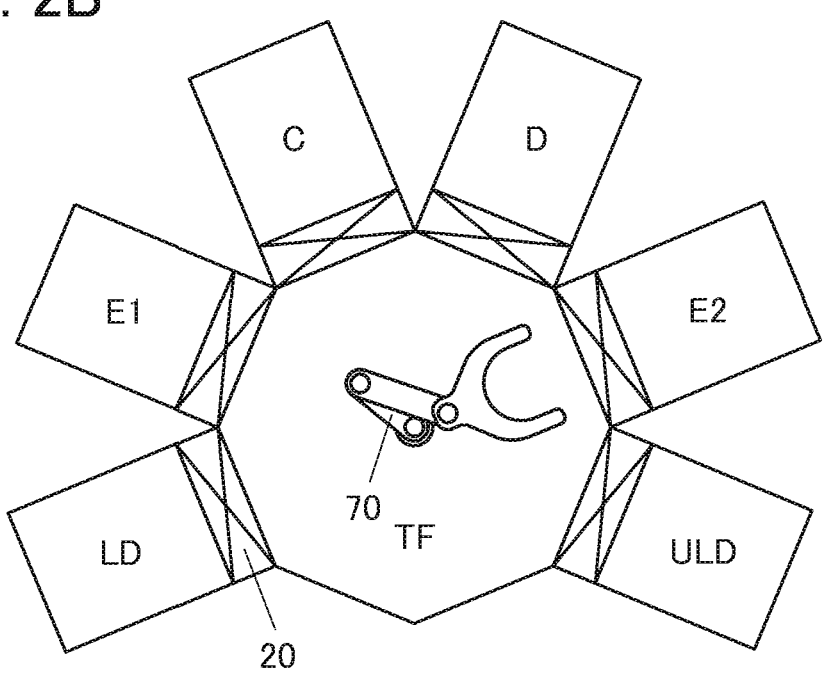

The manufacturing equipment may have a structure illustrated in FIG. 2B. The manufacturing equipment illustrated in FIG. 2B is different from the manufacturing equipment illustrated in FIG. 1 in not including the standby chamber W.

In the case where the process time of the deposition apparatus D cannot be a bottleneck for the throughput of the whole equipment, the standby chamber W can be omitted. For example, when the deposition apparatus D is of a single-wafer type and capable of high-speed deposition, the deposition apparatus D can have the structure illustrated in FIG. 2B.

Structure Example 2

Figure 3:
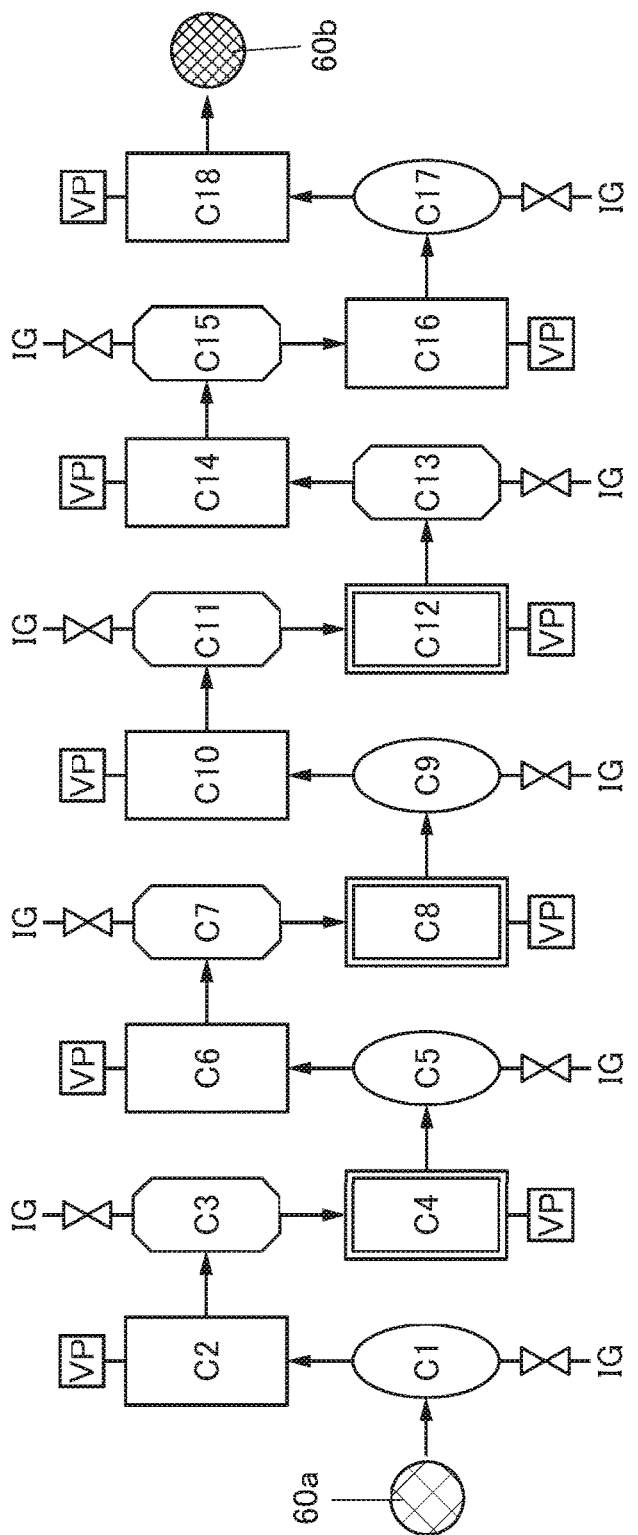
FIG. 3 is a block diagram illustrating manufacturing equipment.

FIG. 3 is a block diagram illustrating the manufacturing equipment for a light-emitting device that is one embodiment of the present invention. The manufacturing equipment includes a plurality of clusters arranged in the order of processes, in which the above-described manufacturing equipment of Structure Example 1 is included as a cluster. A substrate where light-emitting devices are formed is moved between the plurality of clusters in sequence, so that the processes are conducted.

A manufacturing equipment illustrated in FIG. 3 is an example including a cluster C1 to a cluster C18. The cluster C1 to the cluster C18 are connected in sequence. A substrate 60*a* brought into the cluster C1 can be taken out from the cluster C18 as a substrate 60*b* where light-emitting devices are formed.

The clusters C1, C3, C5, C7, C9, C11, C13, C15, and C17 each include a group of apparatuses for performing a process under atmosphere control. The clusters C2, C4, C6, C10, C12, C14, C16, and C18 each include a group of apparatuses for performing a vacuum process (process under reduced pressure). The cluster described in Structure Example 1 can be used as each of the clusters C4, C8, and C12.

The clusters C1, C5, and C9 include apparatuses mainly for cleaning and baking the substrate, and the like. The clusters C2, C6, and C10 include apparatuses mainly for forming an organic compound included in the light-emitting device and the like. The clusters C3, C7, C11, and C15 include apparatuses mainly for performing a lithography process and the like. The clusters C4, C8, C12, and C14 include apparatuses mainly for performing an etching process, an ashing process, and a protective layer formation process, and the like. The cluster C13 includes an apparatus for performing a filling process with a resin, and the like. The clusters C16 and C17 include apparatuses mainly for performing an etching process, and the like. The cluster C18 includes apparatuses mainly for forming an organic compound included in the light-emitting device and forming a protective film to seal the light-emitting device, and the like.

Next, the cluster C1 to the cluster C18 are described in detail with reference to FIG. 4 to FIG. 8.

<Cluster C1 to Cluster C4>

Figure 4:
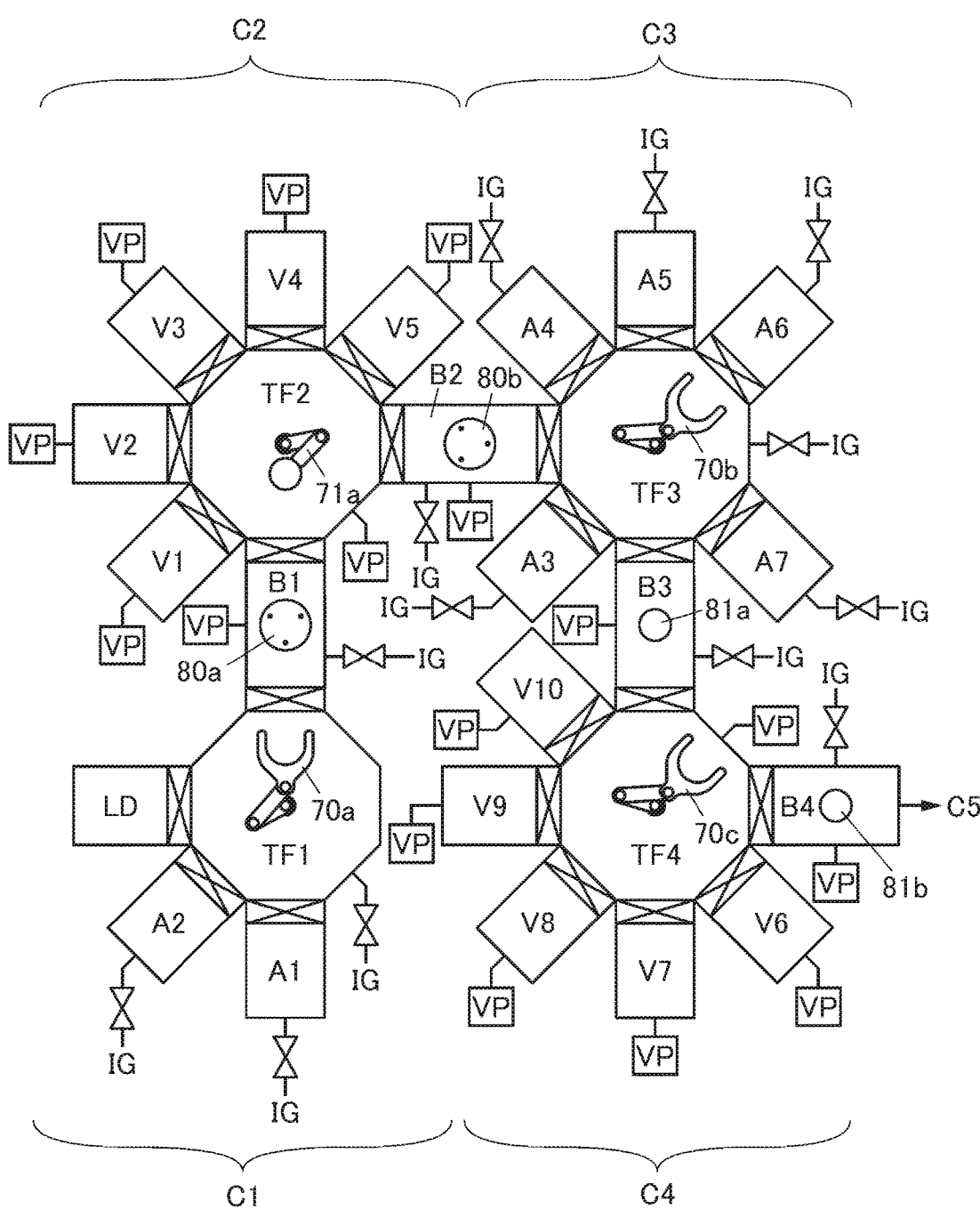
FIG. 4 is a diagram illustrating manufacturing equipment.

FIG. 4 is a top view illustrating the cluster C1 to the cluster C4. The cluster C1 is connected to the cluster C2 through a loadlock chamber B1. The cluster C2 is connected to the cluster C3 through a loadlock chamber B2. The cluster C3 is connected to the cluster C4 through a loadlock chamber B3. The cluster C4 is connected to the cluster C5 (see FIG. 3) through a loadlock chamber B4.

<Normal-Pressure Process Apparatuses A>

The cluster C1 and the cluster C3 each include normal-pressure process apparatuses A. The cluster C1 includes a transfer chamber TF1 and the normal-pressure process apparatuses A (normal-pressure process apparatuses A1 and A2) where a process is performed mainly under normal pressure. The cluster C3 includes a transfer chamber TF3 and the normal-pressure process apparatuses A (normal-pressure process apparatuses A3 to A7). Furthermore, a load chamber LD is provided in the cluster C1.

Note that the number of the normal-pressure process apparatuses A included in each of the clusters may be one or more depending on the purpose. Note that the normal-pressure process apparatus A is not limited to processes under normal pressure, and the pressure of the normal-pressure process apparatus A may be controlled to negative pressure or positive pressure that shifts slightly from the normal pressure. In the case where a plurality of normal-pressure process apparatuses A are provided, the pressures therein may be different from each other.

Valves for introducing an inert gas (IG) are connected to the transfer chambers TF1 and TF3 and the normal-pressure process apparatuses A, whereby the atmosphere therein can be controlled to an inert gas atmosphere. Examples of the inert gas that can be used include nitrogen and a noble gas such as argon or helium. In addition, the inert gas preferably has a low dew point (e.g., −50° C. or lower). When a process is performed under an atmosphere of an inert gas with a low dew point, entry of impurities can be prevented and a highly reliable light-emitting device can be formed.

As the normal-pressure process apparatuses A included in the cluster C1, a cleaning apparatus, a baking apparatus, and the like can be used. For example, a spin cleaning apparatus, a hot plate-type baking apparatus, and the like can be used. The baking apparatus may be a vacuum baking apparatus.

As the normal-pressure process apparatuses A included in the cluster C3, apparatuses for performing a lithography process can be used. For example, in the case where a photolithography process is performed, a resin (photoresist) application apparatus, a light-exposure apparatus, a development apparatus, a baking apparatus, and the like can be used; in the case where a nanoimprint lithography process is performed, a resin (e.g., a UV curable resin) application apparatus, a nanoimprint apparatus, and the like can be used. In addition, depending on the usage, a cleaning apparatus, a wet etching apparatus, an application apparatus, a resist peeling apparatus, and the like may be used as the normal-pressure process apparatuses A.

In the example of the cluster C1, the normal-pressure process apparatuses A1 and A2 are each connected to the transfer chamber TF1 through a gate valve. In the example of the cluster C3, the normal-pressure process apparatuses A3 to A7 are each connected to the transfer chamber TF3 through a gate valve. Providing the gate valve makes it possible to control atmospheric pressure, control the kind of an inert gas, and prevent cross contamination, for example.

The transfer chamber TF1 is connected to the load chamber LD through a gate valve. The transfer chamber TF1 is also connected to the loadlock chamber B1 through another gate valve. The transfer chamber TF1 is provided with a carrying device 70*a*. The carrying device 70*a* can carry the substrate from the load chamber LD to the normal-pressure process apparatus A. In addition, the carrying device 70*a* can carry out the substrate taken from the normal-pressure process apparatus A into the loadlock chamber B1.

The transfer chamber TF3 is connected to the loadlock chamber B2 through a gate valve. The transfer chamber TF3 is also connected to the loadlock chamber B3 through another gate valve. The transfer chamber TF3 is provided with a carrying device 70b. The carrying device 70b can carry the substrate from the loadlock chamber B2 to the normal-pressure process apparatus A. In addition, the carrying device 70b can carry out the substrate taken from the normal-pressure process apparatus A into the loadlock chamber B3.

<Vacuum Process Apparatuses V>

The cluster C2 and the cluster C4 include vacuum process apparatuses V. The cluster C2 includes a transfer chamber TF2 and the vacuum process apparatuses V (vacuum process apparatuses V1 to V5). The cluster C4 includes a transfer chamber TF4 and the vacuum process apparatuses V (vacuum process apparatuses V6 to V10).

Note that the number of vacuum process apparatuses V included in each of the clusters is one or more depending on the purpose. A vacuum pump VP is connected to each vacuum process apparatus V, and a gate valve is provided between each vacuum process apparatus V and the transfer chamber TF (transfer chambers TF2 and TF4). Thus, different processes can be performed in parallel in the vacuum process apparatuses V.

Note that the vacuum process means treatment in an environment where the pressure is controlled to reduced pressure. Thus, the vacuum process includes treatment for performing pressure control under reduced pressure with introduction of a process gas, besides treatment under high vacuum.

The transfer chambers TF2 and TF4 are also provided with an independent vacuum pump VP, so that cross contamination during processes performed in the vacuum process apparatuses V can be prevented.

As the vacuum process apparatuses V included in the cluster C2, for example, a surface treatment apparatus and deposition apparatuses such as an evaporation apparatus, a sputtering apparatus, a CVD apparatus, and an ALD apparatus can be used. Note that the surface treatment apparatus can have the function of the surface treatment apparatus S described with reference to FIG. 2B and is preferably a plasma treatment apparatus here.

As the CVD apparatus, a thermal CVD apparatus using heat, a PECVD apparatus (Plasma Enhanced CVD apparatus) using plasma, or the like can be used. As the ALD apparatus, a thermal ALD apparatus using heat, a PEALD apparatus (Plasma Enhanced ALD apparatus) using a plasma-excited reactant, or the like can be used.

As the vacuum process apparatuses V included in the cluster C4, the apparatuses described in Structure Example 1, e.g., a dry etching apparatus (having an ashing function), a plasma treatment apparatus (cleaning), an ALD apparatus, and a dry etching apparatus can be used. In addition, the standby chamber W illustrated in FIG. 1 may be used.

The transfer chamber TF2 is connected to the loadlock chamber B1 through a gate valve. The transfer chamber TF2 is also connected to the loadlock chamber B2 through another gate valve. The transfer chamber TF2 is provided with a carrying device 71a. The carrying device 71a can reverse the substrate placed in the loadlock chamber B1 upside down and carry out the substrate to the vacuum process apparatus V. In addition, the carrying device 71a can take out the substrate from the vacuum process apparatus V, reverse the substrate upside down, and carry out the substrate to the loadlock chamber B2.

The transfer chamber TF4 is connected to the loadlock chamber B3 through a gate valve. The transfer chamber TF4 is also connected to the loadlock chamber B4 through another gate valve. The transfer chamber TF4 is provided with a carrying device 70c. With the carrying device 70c, the substrate can be carried from the loadlock chamber B3 into the vacuum process apparatus V and carried out to the loadlock chamber B4.

The loadlock chambers B1, B2, B3, and B4 are each provided with the vacuum pump VP and a valve for introducing an inert gas. Thus, the loadlock chambers B1, B2, B3, and B4 can be controlled so as to be under reduced pressure or an inert gas atmosphere. For example, in the case where the substrate is carried from the cluster C2 to the cluster C3, operation can be performed in a such a manner that the substrate is carried from the cluster C2 into the loadlock chamber B2 with reduced pressure, and the substrate is carried out to the cluster C3 after the atmosphere in the loadlock chamber B2 is changed to an inert gas atmosphere.

Note that the carrying devices 70a, 70b, and 70c each have a mechanism for carrying the substrate placed on a hand portion. The hand portion may be provided with a vacuum adsorption mechanism or the like because the carrying devices 70b and 70c work under normal pressure. The carrying device 71a has a mechanism for carrying the substrate fixed to the hand portion. For fixing the substrate, an electrostatic adsorption mechanism or the like can be used, because the carrying device 71a works under reduced pressure.

As described above, since the structures of the carrying devices 70a, 70b, and 70c are different from that of the carrying device 71a, stages 80a and 80b where the substrate can be placed on pins are provided in the loadlock chambers B1 are B2, respectively. In addition, stages 81a and 81b where the substrate can be placed on a plane are provided in the loadlock chambers B3 and B4, respectively. Note that these stages are just examples and a stage with another structure may be employed. Transfer of the substrate in the loadlock chamber B1 will be described in detail later.

<Cluster C5 to Cluster C8>

Figure 5:
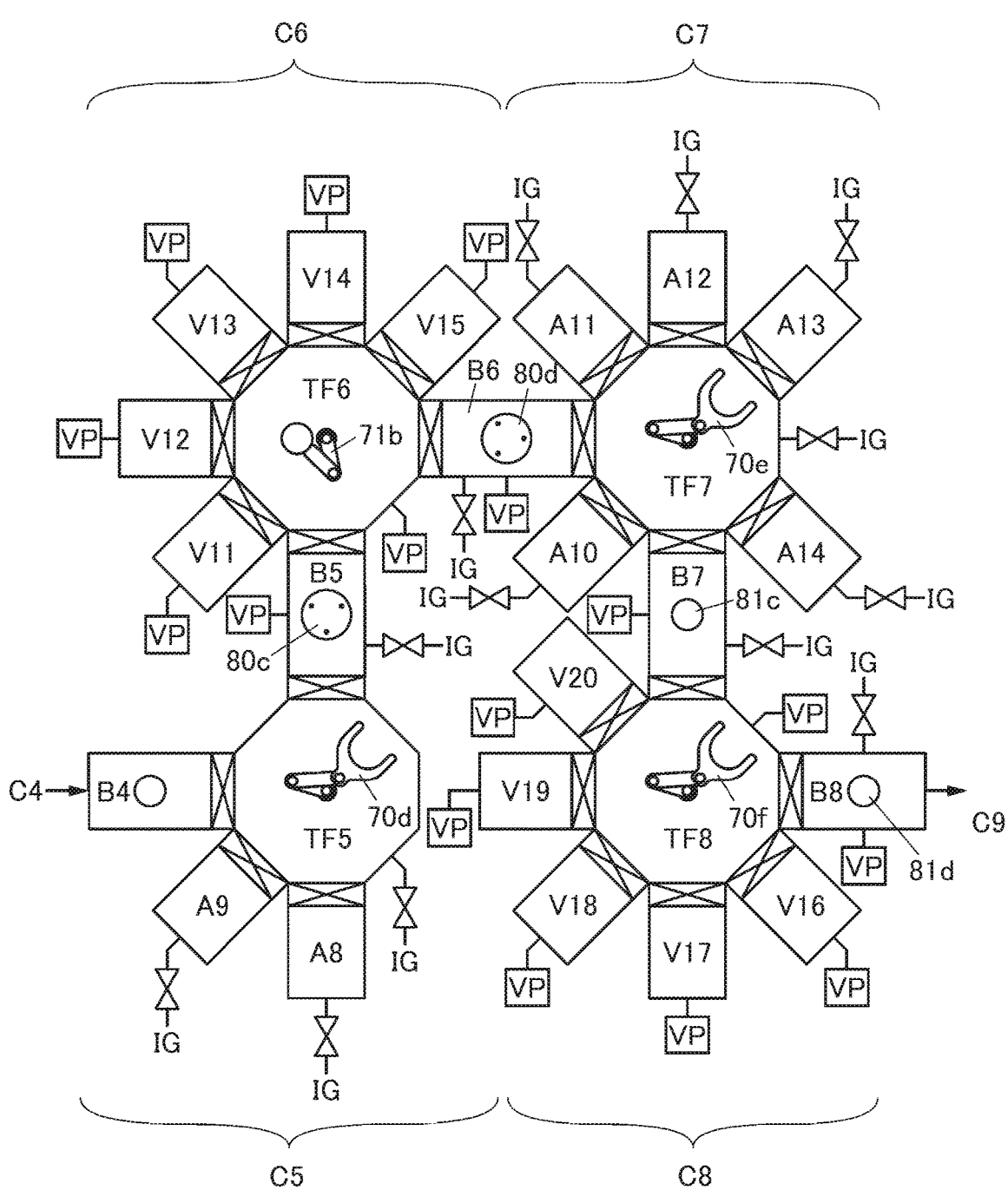
FIG. 5 is a diagram illustrating manufacturing equipment.

FIG. 5 is a top view illustrating the cluster C5 to the cluster C8. The cluster C5 is connected to the cluster C6 through a loadlock chamber B5. The cluster C6 is connected to the cluster C7 through a loadlock chamber B6. The cluster C7 is connected to the cluster C8 through a loadlock chamber B7. The cluster C8 is connected to the cluster C9 (see FIG. 6) through a loadlock chamber B8.

The basic structures of the cluster C5 to the cluster C8 are similar to those of the cluster C1 to the cluster C4: the cluster C5 corresponds to the cluster C1, the cluster C6 corresponds to the cluster C2, the cluster C7 corresponds to the cluster C3, and the cluster C8 corresponds to the cluster C4. Note that the load chamber LD in the cluster C1 is replaced with the loadlock chamber B4 in the cluster C5.

In addition, the loadlock chamber B5 corresponds to the loadlock chamber B1, the loadlock chamber B6 corresponds to the loadlock chamber B2, the loadlock chamber B7 corresponds to the loadlock chamber B3, and the loadlock chamber B8 corresponds to the loadlock chamber B4.

For details of the clusters and the loadlock chambers whose structures only are described below, description of the cluster C1 to the cluster C4 and the loadlock chambers B1 to B4 can be referred to.

The cluster C5 and the cluster C7 include normal-pressure process apparatuses A. The cluster C5 includes a transfer chamber TF5 and the normal-pressure process apparatuses A (normal-pressure process apparatuses A8 and A9) where a process is performed mainly under normal pressure. The cluster C7 includes a transfer chamber TF7 and the normal-pressure process apparatuses A (normal-pressure process apparatuses A10 to A14).

The cluster C6 and the cluster C8 include the vacuum process apparatuses V. The cluster C6 includes a transfer chamber TF6 and the vacuum process apparatuses V (vacuum process apparatuses V11 to V15). The cluster C8 includes a transfer chamber TF8 and the vacuum process apparatuses V (vacuum process apparatuses V16 to V20).

The transfer chamber TF5 is connected to the loadlock chamber B4 through a gate valve. The transfer chamber TF5 is also connected to the loadlock chamber B5 through another gate valve. The transfer chamber TF5 is provided with a carrying device 70d. The carrying device 70d can carry the substrate into the normal-pressure process apparatus A from the loadlock chamber B4. In addition, the carrying device 70d can carry out the substrate taken from the normal-pressure process apparatus A into the loadlock chamber B5.

The transfer chamber TF6 is connected to the loadlock chamber B5 through a gate valve. The transfer chamber TF6 is also connected to the loadlock chamber B6 through another gate valve. The transfer chamber TF6 is provided with a carrying device 71b. The carrying device 71b can reverse the substrate placed in the loadlock chamber B5 upside down and carry out the substrate to the vacuum process apparatus V. The carrying device 71b can take out the substrate from the vacuum process apparatus V, reverse the substrate upside down, and carry out the substrate to the loadlock chamber B6.

The transfer chamber TF7 is connected to the loadlock chamber B6 through a gate valve. The transfer chamber TF7 is also connected to the loadlock chamber B7 through another gate valve. The transfer chamber TF7 is provided with a carrying device 70e. The carrying device 70e can carry the substrate from the loadlock chamber B6 into the normal-pressure process apparatus A. The carrying device 70e can carry out the substrate taken from the normal-pressure process apparatus A into the loadlock chamber B7.

The transfer chamber TF8 is connected to the loadlock chamber B7 through a gate valve. The transfer chamber TF8 is also connected to the loadlock chamber B8 through another gate valve. The transfer chamber TF8 is provided with a carrying device 70f. The carrying device 70f can carry the substrate from the loadlock chamber B7 to the vacuum process apparatus V. The carrying device 70f can carry out the substrate taken from the vacuum process apparatus V into the loadlock chamber B8.

Stages 80c and 80d where the substrate can be placed on pins are provided in the loadlock chambers B5 and B6, respectively. Stages 81c and 81d where the substrate can be placed on a plane are provided in the loadlock chambers B7 and B8, respectively.

<Cluster C9 to Cluster C12>

Figure 6:
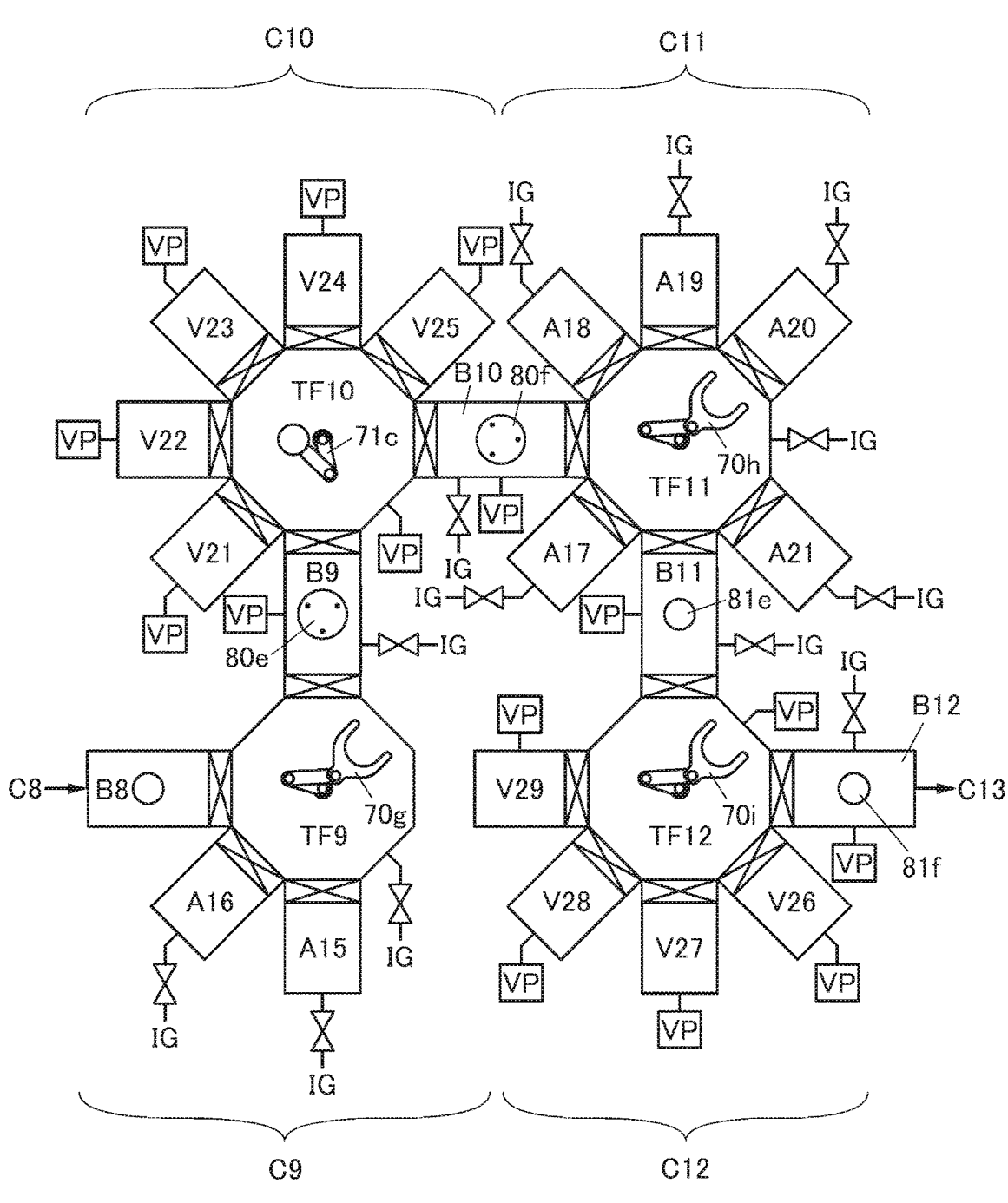
FIG. 6 is a diagram illustrating manufacturing equipment.

FIG. 6 is a top view illustrating the cluster C9 to the cluster C12. The cluster C9 is connected to the cluster C10 through a loadlock chamber B9. The cluster C10 is connected to the cluster C11 through a loadlock chamber B10. The cluster C11 is connected to the cluster C12 through a loadlock chamber B11. The cluster C12 is connected to the cluster C13 (see FIG. 7) through a loadlock chamber B12.

The basic structures of the cluster C9 to the cluster C12 are similar to those of the cluster C1 to the cluster C4: the cluster C9 corresponds to the cluster C1, the cluster C10 corresponds to the cluster C2, the cluster C11 corresponds to the cluster C3, and the cluster C12 corresponds to the cluster C4. Note that the load chamber LD in the cluster C1 is replaced with the loadlock chamber B8 in the cluster C5. The vacuum process apparatus V10 in the cluster C4 is not provided in the cluster C12.

In addition, the loadlock chamber B9 corresponds to the loadlock chamber B1, the loadlock chamber B10 corresponds to the loadlock chamber B2, the loadlock chamber B11 corresponds to the loadlock chamber B3, and the loadlock chamber B12 corresponds to the loadlock chamber B4.

Structures only will be described below. For details of the clusters and the loadlock chambers, description of the cluster C1 to the cluster C4 and the loadlock chambers B1 to B4 can be referred to.

The cluster C9 and the cluster C11 include normal-pressure process apparatuses A. The cluster C9 includes a transfer chamber TF9 and the normal-pressure process apparatuses A (normal-pressure process apparatuses A15 and A16) where a process is performed mainly under normal pressure. The cluster C11 includes a transfer chamber TF11 and the normal-pressure process apparatuses A (normal-pressure process apparatuses A17 to A21).

The transfer chamber TF9 is connected to the loadlock chamber B8 through a gate valve. The transfer chamber TF9 is also connected to the loadlock chamber B9 through another gate valve. The transfer chamber TF9 is provided with a carrying device 70g. The carrying device 70g can carry the substrate from the loadlock chamber B8 to the normal-pressure process apparatus A. The carrying device 70g can carry out the substrate taken from the normal-pressure process apparatus A into the loadlock chamber B9.

The transfer chamber TF11 is connected to the loadlock chamber B10 through a gate valve. The transfer chamber TF11 is also connected to the loadlock chamber B11 through another gate valve. The transfer chamber TF11 is provided with a carrying device 70h. The carrying device 70h can carry the substrate from the loadlock chamber B10 to the normal-pressure process apparatus A. The carrying device 70h can carry out the substrate taken from the normal-pressure process apparatus A into the loadlock chamber B11.

The cluster C10 and the cluster C12 include the vacuum process apparatuses V. The cluster C10 includes a transfer chamber TF10 and the vacuum process apparatuses V (vacuum process apparatuses V21 to V25). The cluster C12 includes a transfer chamber TF12 and the vacuum process apparatuses V (vacuum process apparatuses V26 to V29).

The transfer chamber TF10 is connected to the loadlock chamber B9 through a gate valve. The transfer chamber TF10 is also connected to the loadlock chamber B10 through another gate valve. The transfer chamber TF10 is provided with a carrying device 71c. The carrying device 71c can reverse the substrate placed in the loadlock chamber B9 upside down and carry out the substrate to the vacuum process apparatus V. In addition, the carrying device 71c can take out the substrate from the vacuum process apparatus V, reverse the substrate upside down, and carry out the substrate to the loadlock chamber B10.

The transfer chamber TF12 is connected to the loadlock chamber B11 through a gate valve. The transfer chamber TF12 is also connected to the loadlock chamber B12 through another gate valve. The transfer chamber TF12 is provided with a carrying device 70i. With the carrying device 70i, the substrate can be carried from the loadlock chamber B11 to the vacuum process apparatus V and carried out to the loadlock chamber B12.

Stages 80e and 80f where the substrate is placed on pins are provided in the loadlock chambers B9 and B10, respectively. Stages 81$e$ and 81$f$ where the substrate is placed on a plane are provided in the loadlock chambers B11 and B12, respectively.

<Clusters C13 to C16>

Figure 7:
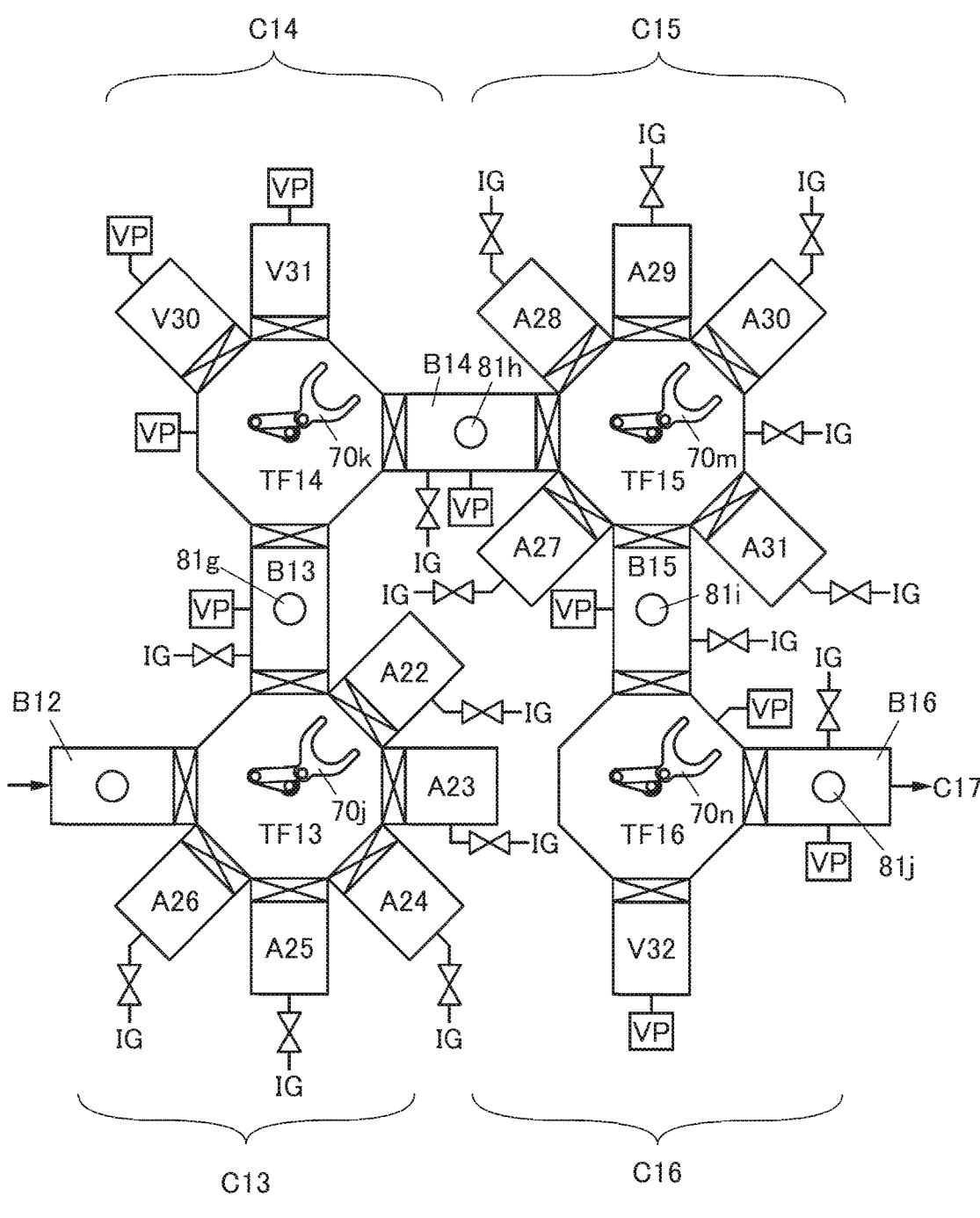
FIG. 7 is a diagram illustrating manufacturing equipment.

FIG. 7 is a top view illustrating the cluster C13 to the cluster C16. The cluster C13 is connected to the cluster C14 through a loadlock chamber B13. The cluster C14 is connected to the cluster C15 through a loadlock chamber B14. The cluster C15 is connected to the cluster C16 through a loadlock chamber B15. The cluster C16 is connected to the cluster C17 (see FIG. 8) through a loadlock chamber B16.

The cluster C13 and the cluster C15 include normal-pressure process apparatuses A. The cluster C13 includes a transfer chamber TF13 and the normal-pressure process apparatuses A (normal-pressure process apparatuses A22 to A26) where a process is performed mainly under a normal pressure. The cluster C15 includes a transfer chamber TF15 and the normal-pressure process apparatuses A (normal-pressure process apparatuses A27 to A31) where a process is performed mainly under normal pressure.

As the normal-pressure process apparatuses A included in the cluster C13, apparatuses for performing a lithography process, which are similar to those in the cluster C3, can be used. In the apparatuses for performing a lithography process, filling treatment with a resin can be performed.

The transfer chamber TF13 is connected to the loadlock chamber B12 through a gate valve. The transfer chamber TF13 is also connected to the loadlock chamber B13 through another gate valve. The transfer chamber TF13 is provided with a carrying device 70$j$. The carrying device 70$j$ can carry the substrate from the loadlock chamber B12 to the normal-pressure process apparatus A. In addition, the carrying device 70$j$ can carry out the substrate taken from the normal-pressure process apparatus A into the loadlock chamber B13.

The basic structure of the cluster C15 is similar to that of the cluster C2. The transfer chamber TF15 is connected to the loadlock chamber B14 through a gate valve. The transfer chamber TF15 is also connected to the loadlock chamber B15 through another gate valve. The transfer chamber TF15 is provided with a carrying device 70$m$. The carrying device 70$m$ can carry the substrate from the loadlock chamber B14 to the normal-pressure process apparatus A. The carrying device 70$m$ can carry out the substrate taken from the normal-pressure process apparatus A into the loadlock chamber B15.

The cluster C14 and the cluster C16 include vacuum process apparatuses V. The cluster C14 includes a transfer chamber TF14 and the vacuum process apparatuses V (vacuum process apparatuses V30 and V31). The cluster C16 includes a transfer chamber TF16 and the vacuum process apparatus V (vacuum process apparatus V32).

As the vacuum process apparatuses V included in the cluster C14, for example, an ashing apparatus, a dry etching apparatus (having an ashing function), an ALD apparatus, a CVD apparatus, a sputtering apparatus, and the like can be used.

The transfer chamber TF14 is connected to the loadlock chamber B13 through a gate valve. The transfer chamber TF14 is also connected to the loadlock chamber B14 through another gate valve. The transfer chamber TF14 is provided with a carrying device 70$k$. The carrying device 70$k$ can carry the substrate from the loadlock chamber B13 to the vacuum process apparatus V. The carrying device 70$k$ can carry out the substrate taken from the vacuum process apparatus V into the loadlock chamber B14.

As the vacuum process apparatus V included in the cluster C16, for example, a dry etching apparatus can be used.

The transfer chamber TF16 is connected to the loadlock chamber B15 through a gate valve. The transfer chamber TF16 is also connected to the loadlock chamber B16 through another gate valve. The transfer chamber TF16 is provided with a carrying device 70$n$. The carrying device 70$n$ can carry the substrate from the loadlock chamber B15 to the vacuum process apparatus V. The carrying device 70$n$ can carry out the substrate taken from the vacuum process apparatus V into the loadlock chamber B16.

Stages 81$g$, 81$h$, 81$i$, and 81$j$ where the substrate can be placed on a plane are provided in the loadlock chambers B13 to the B16, respectively. The loadlock chambers B13 to B16 are each provided with the vacuum pump VP and a valve for introducing an inert gas. Thus, the loadlock chamber B13 can be controlled so as to be under reduced pressure or an inert gas atmosphere.

<Clusters C17 and C18>

FIG. 7 is a top view illustrating the clusters C17 and C18. The cluster C17 is connected to the cluster C18 through a loadlock chamber B17.

The cluster C17 includes normal-pressure process apparatuses A. The cluster C17 includes a transfer chamber TF17 and the normal-pressure process apparatuses A (normal-pressure process apparatuses A32 and A33) where a process is performed mainly under a normal pressure.

As the normal-pressure process apparatuses A included in the cluster C17, an etching apparatus and a baking apparatus can be used. As the etching apparatus, a wet etching apparatus can be used. Although a dry etching apparatus can be employed, the cluster C17 can be omitted in that case because the treatment can be performed in the cluster C16. Note that when a dry etching apparatus is used, it is preferable to lower or eliminate a bias toward the substrate side to enable isotropic etching treatment.

The transfer chamber TF17 is connected to the loadlock chamber B16 through a gate valve. The transfer chamber TF17 is also connected to the loadlock chamber B17 through another gate valve. The transfer chamber TF17 is provided with a carrying device 70$p$. The carrying device 70$p$ can carry the substrate from the loadlock chamber B16 to the normal-pressure process apparatus A. The carrying device 70$p$ can carry out the substrate taken from the normal-pressure process apparatus A into the loadlock chamber B17.

The cluster C18 includes the vacuum process apparatuses V. The cluster C18 includes a transfer chamber TF18 and the vacuum process apparatuses V (vacuum process apparatuses V33 to V35) where a process is performed mainly under reduced pressure.

As the vacuum apparatuses V included in the cluster C18, for example, deposition apparatuses such as an evaporation apparatus, a sputtering apparatus, a CVD apparatus, and an ALD apparatus, an apparatus for attaching a counter substrate to a substrate can be employed.

The transfer chamber TF18 is connected to the loadlock chamber B17 through a gate valve. The transfer chamber TF18 is also connected to the unload chamber ULD through another gate valve. The transfer chamber TF18 is provided with a carrying device 71$d$. The carrying device 71$d$ can carry the substrate from the loadlock chamber B17 to the vacuum process apparatus V. The carrying device 71$d$ can carry out the substrate taken from the vacuum process apparatus V into the unload chamber ULD.

The loadlock chamber B17 is provided with a stage 80$g$ where a substrate can be placed on pins. In addition, the loadlock chamber B17 is provided with the vacuum pump VP and a valve for introducing an inert gas. Thus, the loadlock chamber B17 can be controlled so as to be under reduced pressure or an inert gas atmosphere.

With use of the manufacturing equipment having the above structure, highly reliable light-emitting device sealed with a protective film can be formed.

For example, the following processes can be performed successively in the equipment with a controlled atmosphere: forming a light-emitting device emitting light of a first color in the clusters C1 to C4; forming a light-emitting device emitting light of a second color in the clusters C5 to C8; forming a light-emitting device emitting light of a third color in the clusters C9 to C12; filling with an insulator in the cluster C13, removing an unnecessary element in the clusters C14 to C17; and forming a protective film and the like in the cluster C18. Details of these processes are described later.

Note that in the case where light-emitting devices emitting white light are formed and provided with coloring layers such as color filters to form light-emitting devices emitting light of the first to third colors, a structure where the clusters C1, C2, C3, C4, C13, C14, C15, C16, C17, and C18 are connected in sequence can be employed.

Structure Example 2

Figure 9:
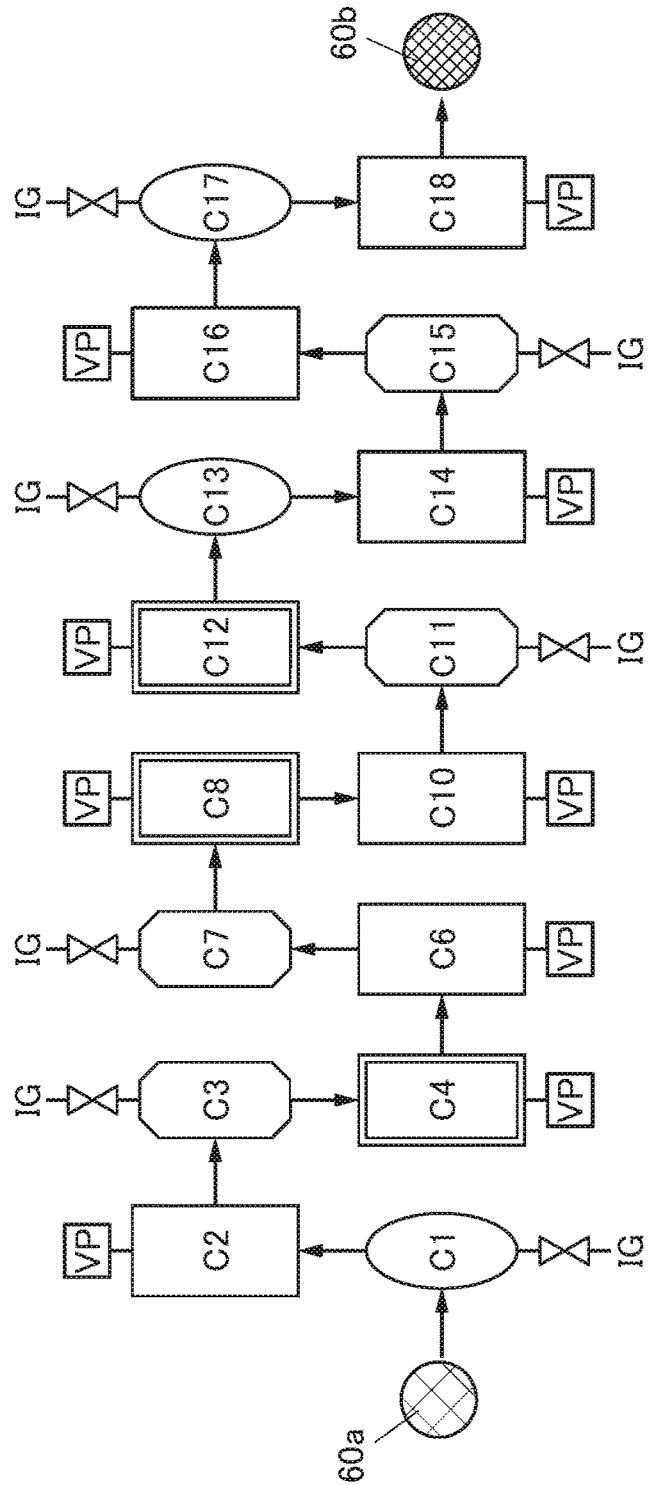
FIG. 9 is a block diagram illustrating manufacturing equipment.

FIG. 9 is a block diagram illustrating manufacturing equipment for a light-emitting device different from that in FIG. 3. The manufacturing equipment illustrated in FIG. 9 is an example in which the clusters C1, C2, C3, C4, C6, C7, C8, C10, C11, C12, C13, C14, C15, C16, C17, and C18 are included, which is a structure excluding the clusters C5 and C9 from the manufacturing equipment illustrated in FIG. 3. The clusters C1, C2, C3, C4, C6, C7, C8, C10, C11, C12, C13, C14, C15, C16, C17, and C18 are connected in sequence and the substrate 60a brought into the cluster C1 can be taken out from the cluster C14 as the substrate 60b where light-emitting devices are formed.

In the manufacturing equipment illustrated in FIG. 3, the clusters C5 and C9 include a cleaning apparatus and a baking apparatus. The process prior to the cleaning process is an etching (dry etching) process. When residual gas components, residues, deposited matters, and the like in the process do not adversely affect succeeding processes, the cleaning process can be omitted. In the case where the cleaning process is omitted, it is unnecessary to consider residual water or the like in a substrate, and thus the baking process can also be unnecessary. Accordingly, the structure of FIG. 9, which is obtained by excluding the clusters C5 and C9 from the manufacturing equipment illustrated in FIG. 3, can be employed depending on the situation. The total number of clusters and loadlock chambers can be reduced by excluding the clusters C5 and C9.

<Cluster C1 to Cluster C4>

The structures of the cluster C1 to cluster C4 can be similar to those illustrated in FIG. 4. Note that the loadlock chamber B4 is connected to the cluster C6.

<Clusters C6, C7, C8, and C10>

Figure 10:
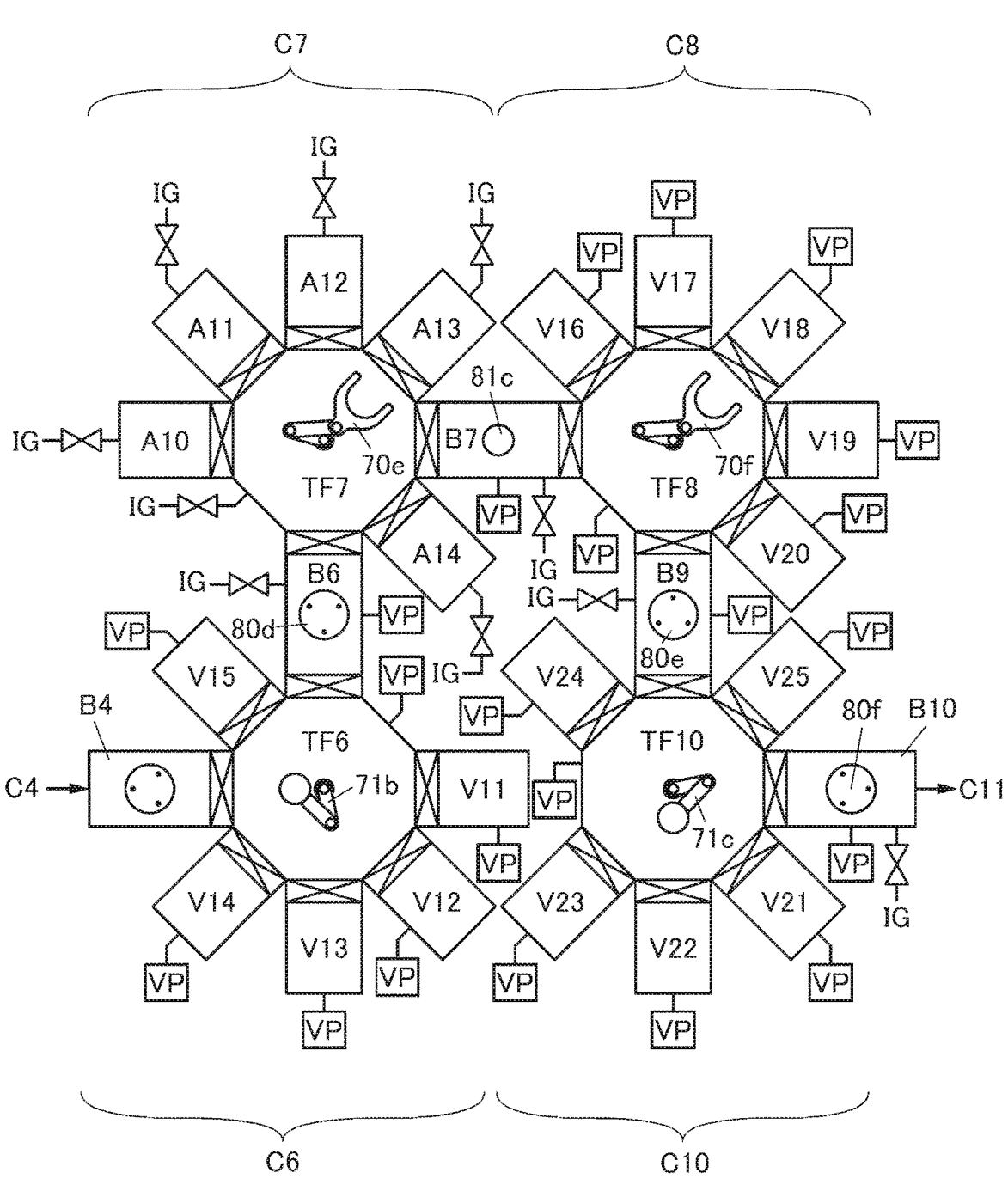
FIG. 10 is a diagram illustrating manufacturing equipment.

FIG. 10 is a top view illustrating the clusters C6, C7, C8, and C10. The cluster C6 is connected to the cluster C7 through the loadlock chamber B6. The cluster C7 is connected to the cluster C8 through the loadlock chamber B7. The cluster C8 is connected to the cluster C10 through the loadlock chamber B9. The cluster C10 is connected to the cluster C11 (see FIG. 11) through the loadlock chamber B10. The connections between the clusters are described below. For the details of the clusters and the loadlock chambers, the description of the clusters C6, C7, C8, and C10 and the loadlock chambers B4, B7, B9, and B10 can be referred to.

The transfer chamber TF6 included in the cluster C6 is connected to the loadlock chamber B4 through a gate valve. The transfer chamber TF6 is also connected to the loadlock chamber B6 through another gate valve. The transfer chamber TF6 is provided with the carrying device 71b. The carrying device 71b can reverse the substrate placed in the loadlock chamber B4 upside down and carry out the substrate to the vacuum process apparatus V. The carrying device 71b can take out the substrate from the vacuum process apparatus V, reverse the substrate upside down, and carry out the substrate to the loadlock chamber B6.

The transfer chamber TF7 included in the cluster C7 is connected to the loadlock chamber B6 through a gate valve. The transfer chamber TF7 is also connected to the loadlock chamber B7 through another gate valve. The transfer chamber TF7 is provided with the carrying device 70e. The carrying device 70e can carry the substrate from the loadlock chamber B6 to the normal-pressure process apparatus A. The carrying device 70e can carry out the substrate taken from the normal-pressure process apparatus A into the loadlock chamber B7.

The transfer chamber TF8 included in the cluster C8 is connected to the loadlock chamber B7 through a gate valve. The transfer chamber TF8 is also connected to the loadlock chamber B9 through another gate valve. The transfer chamber TF8 is provided with the carrying device 70f. The carrying device 70f can carry the substrate from the loadlock chamber B7 to the vacuum process apparatus V. The carrying device 70f can carry out the substrate taken from the vacuum process apparatus V into the loadlock chamber B9.

The transfer chamber TF10 included in the cluster C10 is connected to the loadlock chamber B9 through a gate valve. The transfer chamber TF10 is also connected to the loadlock chamber B10 through another gate valve. The transfer chamber TF10 is provided with the carrying device 71c. The carrying device 71c can reverse the substrate placed in the loadlock chamber B9 upside down and carry out the substrate to the vacuum process apparatus V. The carrying device 71c can take out the substrate from the vacuum process apparatus V, reverse the substrate upside down, and carry out the substrate to the loadlock chamber B10.

<Clusters C11, C12, C13, and C14>

Figure 11:
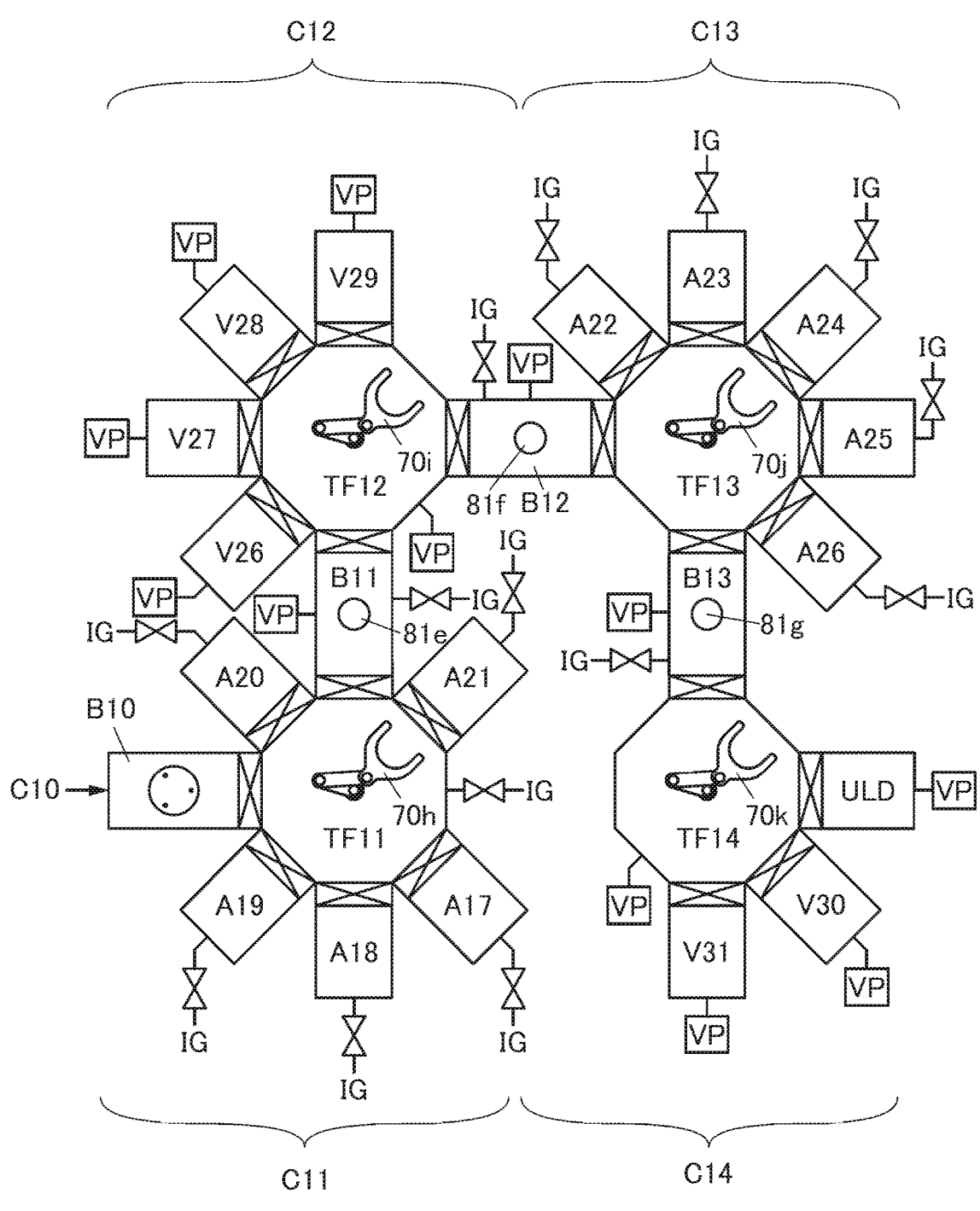
FIG. 11 is a diagram illustrating manufacturing equipment.

FIG. 11 is a top view illustrating the clusters C11, C12, C13, and C14. The cluster C11 is connected to the cluster C12 through the loadlock chamber B11. The cluster C12 is connected to the cluster C13 through the loadlock chamber B12. The cluster C13 is connected to the cluster C14 through the loadlock chamber B13.

The connections between the clusters are described below. For the details of the clusters and the loadlock chambers, the description of the clusters C11, C12, C13, and C14 and the loadlock chambers B11, B12, and B13 can be referred to.

The transfer chamber TF11 included in the cluster C11 is connected to the loadlock chamber B10 through a gate valve. The transfer chamber TF11 is also connected to the loadlock chamber B11 through another gate valve. The transfer chamber TF6 is provided with the carrying device 70h. The carrying device 70h can carry the substrate from the loadlock chamber B10 to the normal-pressure process apparatus A. The carrying device 70h can carry out the substrate taken from the normal-pressure process apparatus A into the loadlock chamber B11.

The transfer chamber TF12 included in the cluster C12 is connected to the loadlock chamber B11 through a gate valve. The transfer chamber TF12 is also connected to the loadlock chamber B12 through another gate valve. The transfer chamber TF12 is provided with the carrying device 70*i*. The carrying device 70*i* can carry the substrate from the loadlock chamber B11 to the vacuum process apparatus V. The carrying device 70*i* can carry out the substrate taken from the vacuum process apparatus V into the loadlock chamber B12.

The transfer chamber TF13 included in the cluster C13 is connected to the loadlock chamber B12 through a gate valve. The transfer chamber TF13 is also connected to the loadlock chamber B13 through another gate valve. The transfer chamber TF13 is provided with the carrying device 70*j*. The carrying device 70*j* can carry a substrate from the loadlock chamber B12 to the normal-pressure process apparatus A. The carrying device 70*j* can carry out the substrate taken from the normal-pressure process apparatus A into the loadlock chamber B13.

The transfer chamber TF14 included in the cluster C14 is connected to the loadlock chamber B13 through a gate valve. The transfer chamber TF14 is also connected to the unload chamber ULD through another gate valve. The transfer chamber TF13 is provided with the carrying device 70*k*. The carrying device 70*k* can carry the substrate from the loadlock chamber B13 to the vacuum process apparatus V. The carrying device 70*k* can carry out the substrate taken from the vacuum process apparatus V into the loadlock chamber B14.

<Cluster C15 to Cluster C18>

Figure 8:
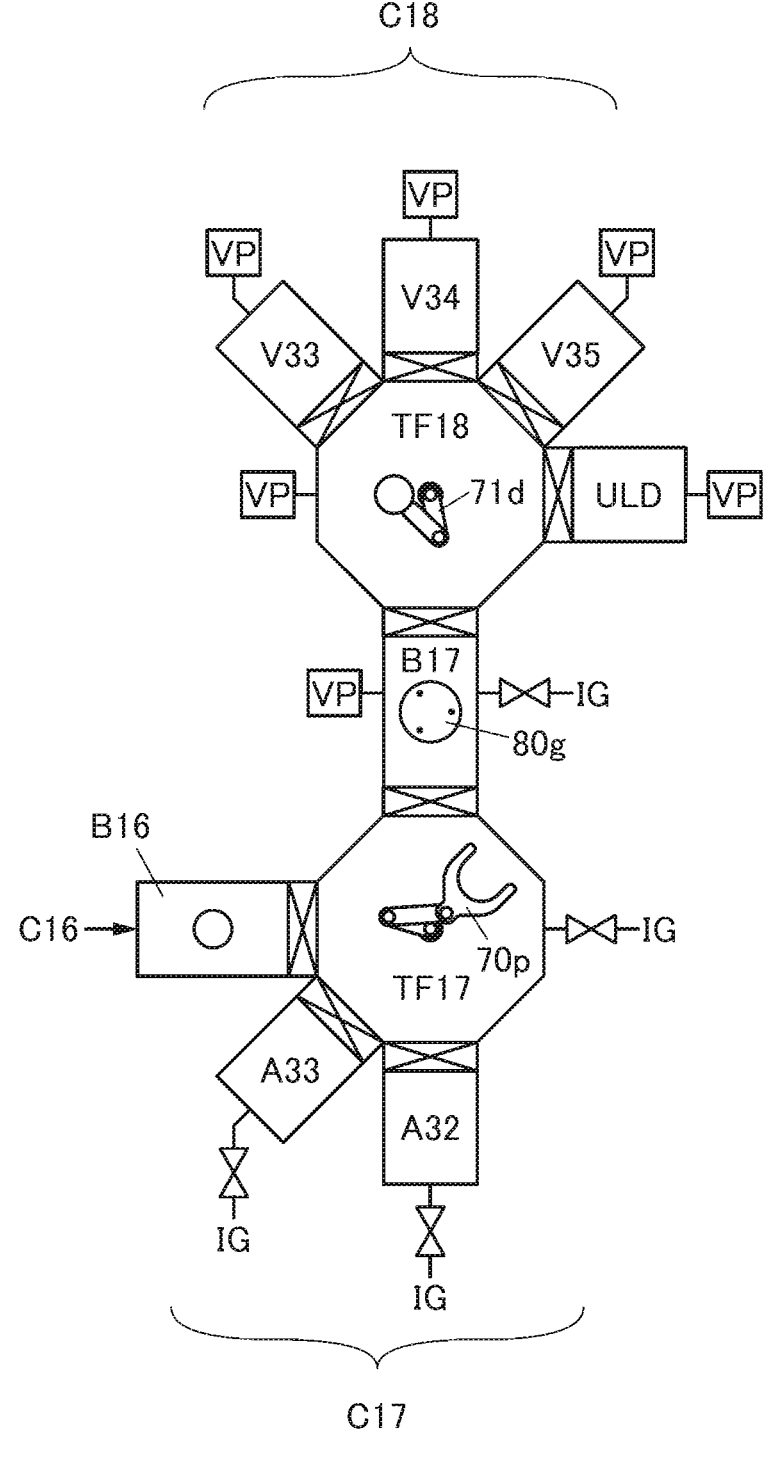
FIG. 8 is a diagram illustrating manufacturing equipment.

The structures of the cluster C15 to cluster C18 can be similar to those illustrated in FIG. 7 and FIG. 8.

<Substrate Carrying Operation>

Next, an operation for carrying a substrate from the cluster C1 to the cluster C2 is described with reference to drawings. Note that description below can be applied to substrate carrying operations between other clusters having a structure similar to that of the cluster C1 and other clusters having a structure similar to that of the cluster C2.

Figure 12A:
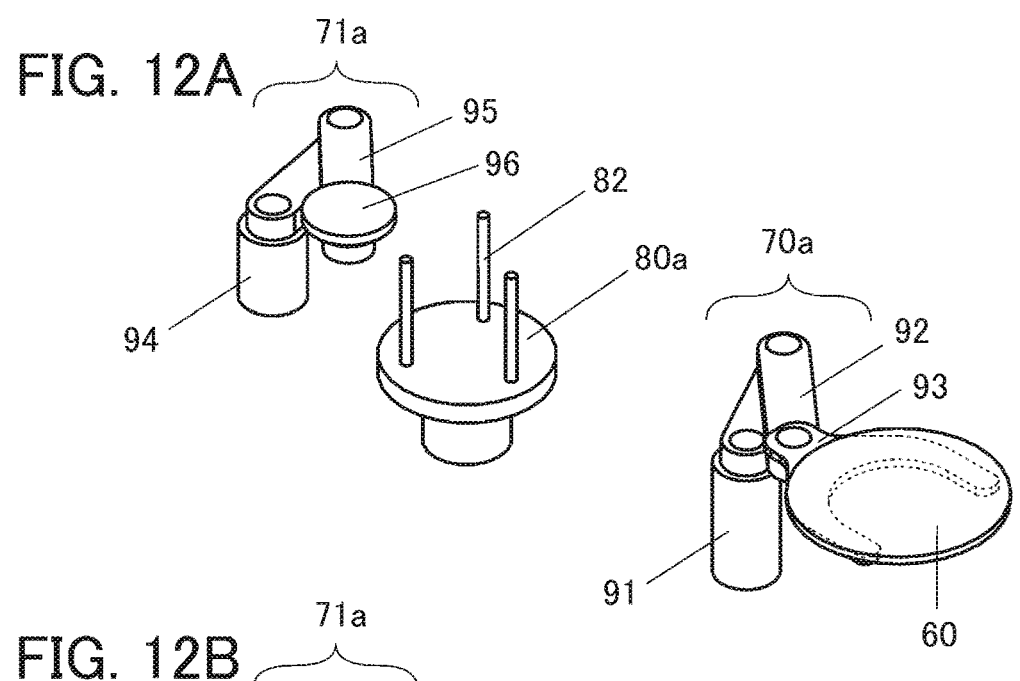
FIG. 12A to FIG. 12C are diagrams illustrating carrying of a substrate.

FIG. 12A illustrates the carrying device 70*a* included in the cluster C1, the stage 80*a* included in the loadlock chamber B1, and the carrying device 71*a* included in the cluster C2. In the illustration, chamber walls, gate valves, and the like are omitted for the sake of clarity.

The carrying device 70*a* includes a lifting mechanism 91, an arm 92, a hand portion 93. The hand portion 93 includes a plane with a cutout portion, and a substrate can be placed on the plane. Since the cluster C1 is a cluster including the normal-pressure process apparatuses A, a vacuum adsorption mechanism or the like may be provided in the hand portion 93. Alternatively, an electrostatic adsorption mechanism may be provided.

The carrying device 71*a* includes a lifting mechanism 94, an arm 95, a substrate fixing portion 96. The substrate fixing portion 96 includes a plane holding the substrate 60, and the size of the plane is smaller than the width of the cutout portion of the hand portion 93 of the carrying device 70*a*. Since the cluster C1 is a cluster including the vacuum process apparatuses V, the electrostatic adsorption mechanism is preferably provided in the substrate fixing portion 96. Furthermore, the carrying device 71*a* includes a substrate reversing mechanism described later.

The stage 80*a* includes pins 82 on which the substrate 60 is placed. A first length that connects the two pins 82 (excluding the diameters of the pins 82) is larger than the width of the substrate fixing portion 96. In addition, a second length that connects the two pins 82 (including the diameters of the pins 82) is smaller than the width of the cutout portion of the hand portion 93. As long as the substrate 60 can be fixed stably and the substrate fixing portion 96 is not interfered with the rear side of the substrate 60, a structure without pins may be employed. Note that the stage 80*a* may be provided with a lifting mechanism.

Figure 12B:
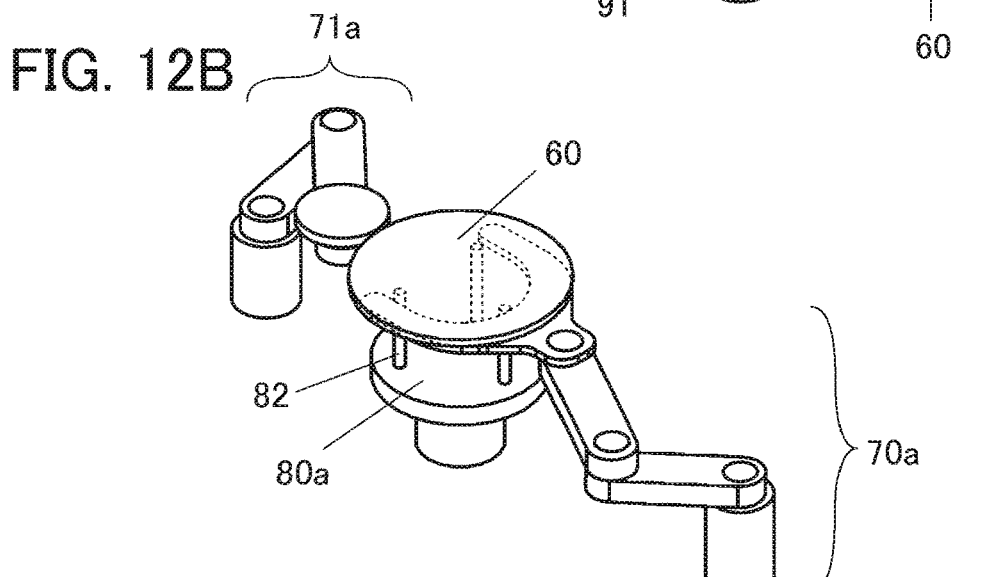
Figure 12C:
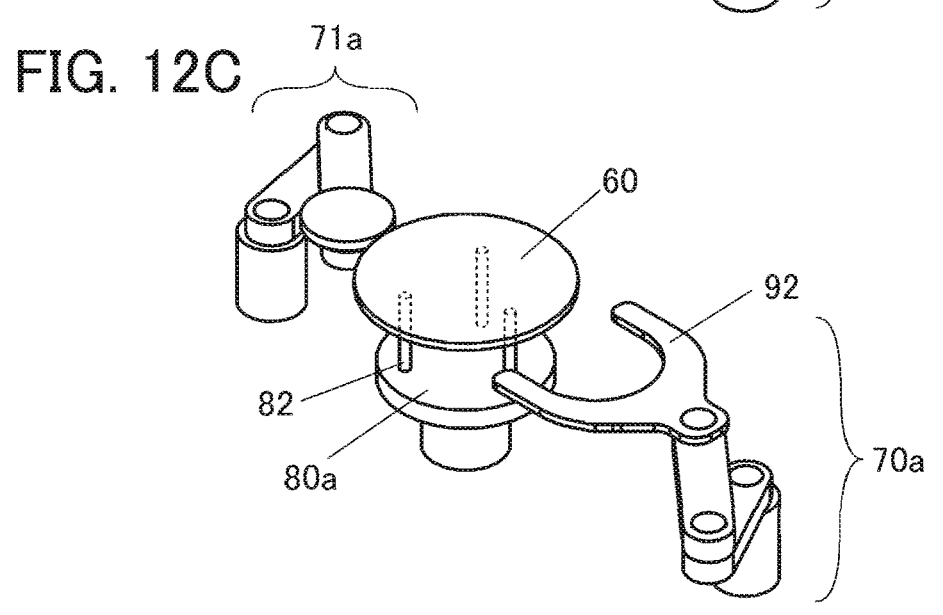

First, the substrate 60 held in the hand portion 93 of the carrying device 70*a* is carried to the stage 80*a* (see FIG. 12B), lifted down by the lifting mechanism 91, and placed on the pins 82 (see FIG. 12C).

Figure 13A:
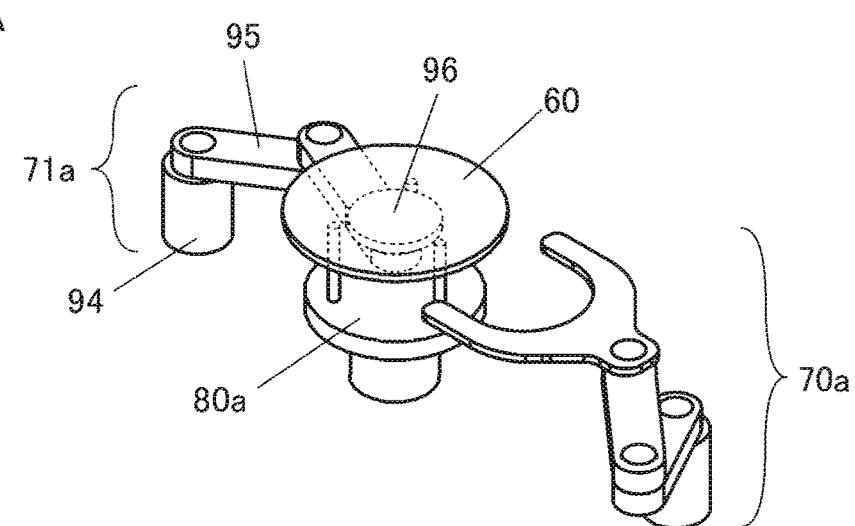
FIG. 13A to FIG. 13C are diagrams illustrating carrying of a substrate.

Next, the substrate fixing portion 96 facing upward of the carrying device 71*a* is inserted between the pins 82 of the stage 80*a*, and by raising the arm 95, the rear side of the substrate 60 is fixed on the substrate fixing portion 96 (see FIG. 13A).

Figure 13B:
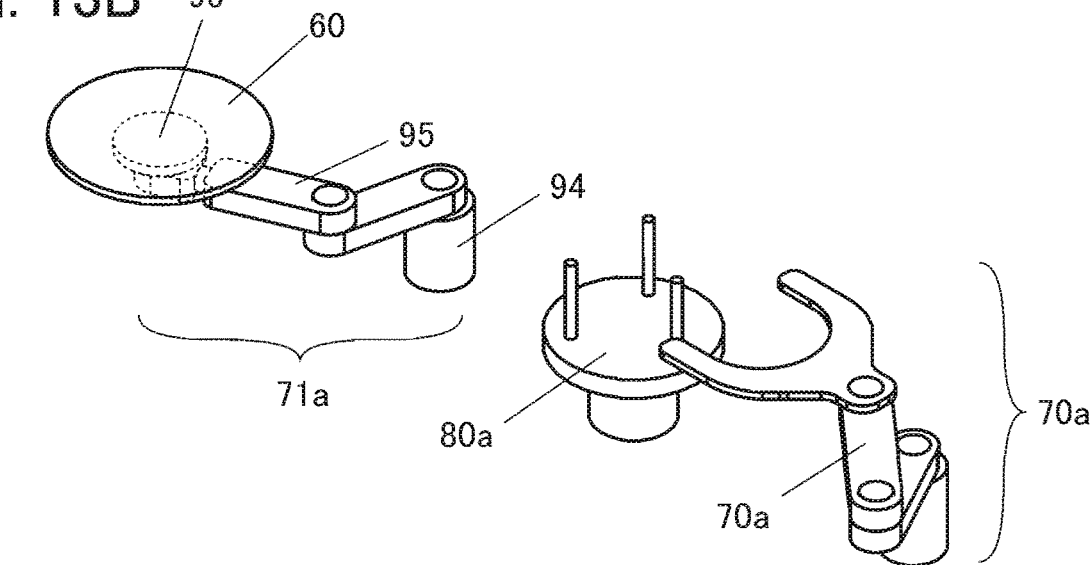

Next, the substrate 60 is carried into the cluster C1 by further raising the arm 95 and through an expansion-contraction operation and a turning operation of the arm 95 (see FIG. 13B).

Figure 13C:
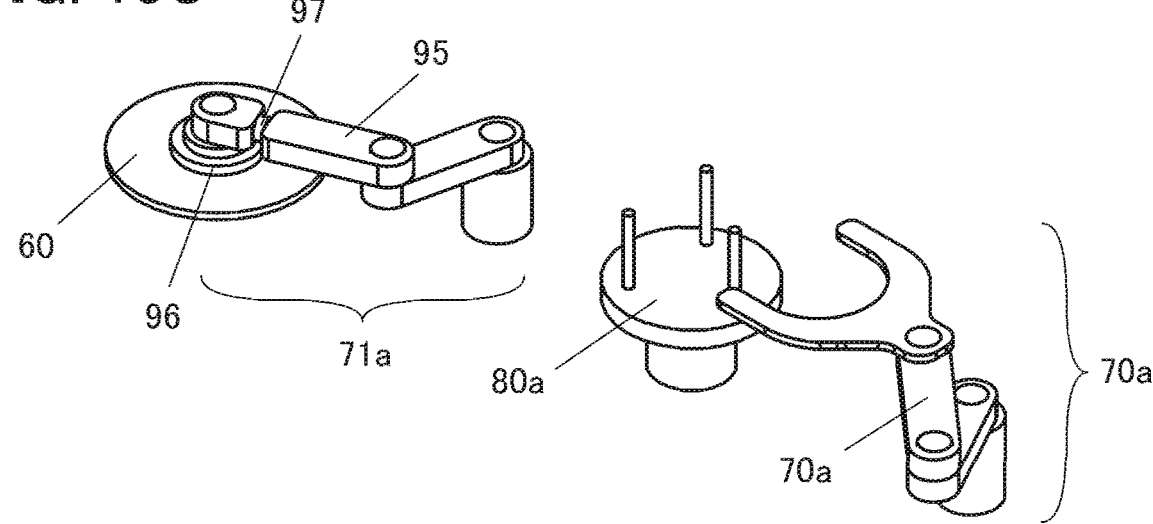

Then, the substrate 60 is reversed upside down while being fixed on the substrate fixing portion 96, by a rotation mechanism 97 provided between the substrate fixing portion 96 and the arm 95 (see FIG. 13C). The reversed substrate 60 can be carried into a deposition apparatus or the like where a substrate is placed in a face-down mode.

Structure Example 3

Although Structure Examples 1 and 2 each show the example of manufacturing equipment with an in-line system where the clusters are connected through the loadlock chambers, a structure in which each cluster independently includes a load chamber LD and an unload chamber ULD may be employed.

In such a structure, the object to be processed is preferably put and sealed in a container where an atmosphere is controlled so as not to be exposed to the air, and the container is moved between the clusters.

Figure 14:
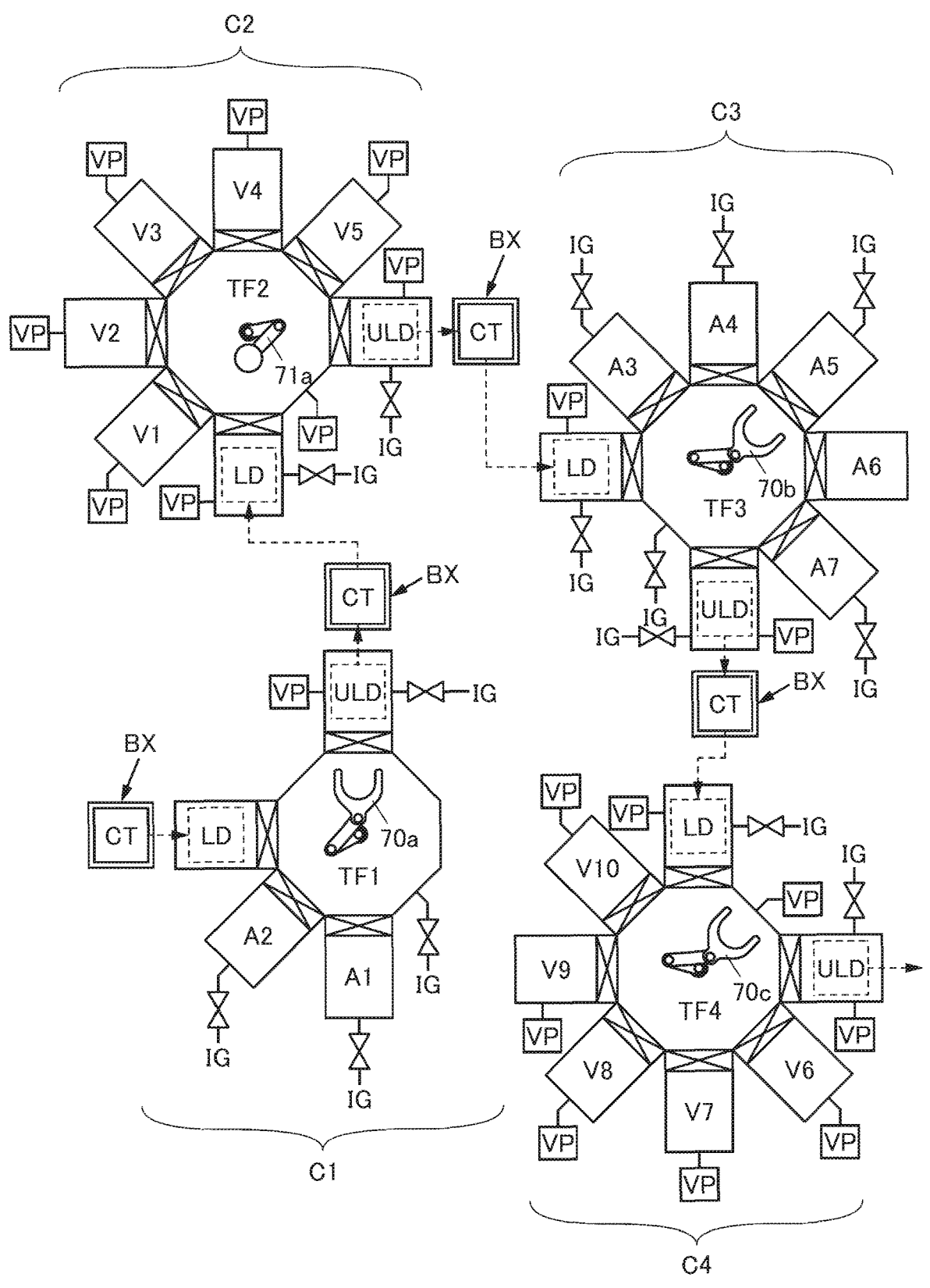
FIG. 14 is a diagram illustrating manufacturing equipment.

FIG. 14 is a diagram illustrating an example in which the clusters C1, C2, C3, and C4 are of independent type and each provided with a load chamber LD and an unload chamber ULD. The object to be processed is stored in a cassette CT, the cassette CT is put in a transport container BX with a controlled atmosphere and moved between the clusters.

Figure 15A:
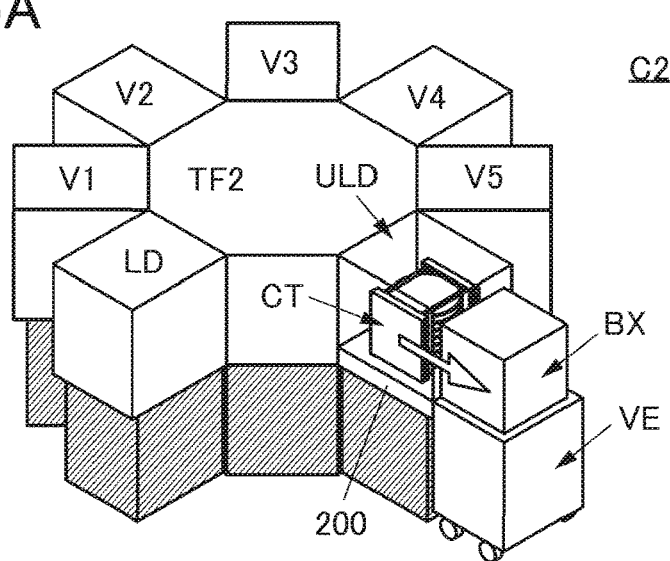
FIGS. 15A and 15B are diagrams illustrating carrying-in/out of a cassette.

FIG. 15A is a diagram illustrating the carrying out of the cassette CT from the cluster C2. Note that for simplification, this diagram illustrates no gate valves and a transparent wall of the unload chamber ULD.

First, the atmosphere of the unload chamber ULD is replaced with an inert gas atmosphere while all objects to be processed are contained in the cassette CT placed in the unload chamber ULD. In addition, the atmosphere inside the transport container BX provided on a transport vehicle VE is replaced with an inert gas atmosphere. At this time, it is preferable that the unload chamber ULD and the transport container BX be set in a positive pressure state so that the atmospheric air does not flow therein. The structure preferable for the transport container BX is such that the atmospheric air does not flow therein, and the transport container BX may be evacuated to vacuum to be in a negative pressure.

Next, the carry-out port of the unload chamber ULD and the carry-in/out port of the transport container BX are connected, and the cassette CT is transferred with a transfer device 200 from the unload chamber ULD to the transport container BX. Then, the carry-in/out port of the transport container BX is closed so that the inside of the transport container BX is kept having the inert gas atmosphere, and in this state, the transport container BX is moved to the cluster C2 with the transport vehicle VE.

Figure 15B:
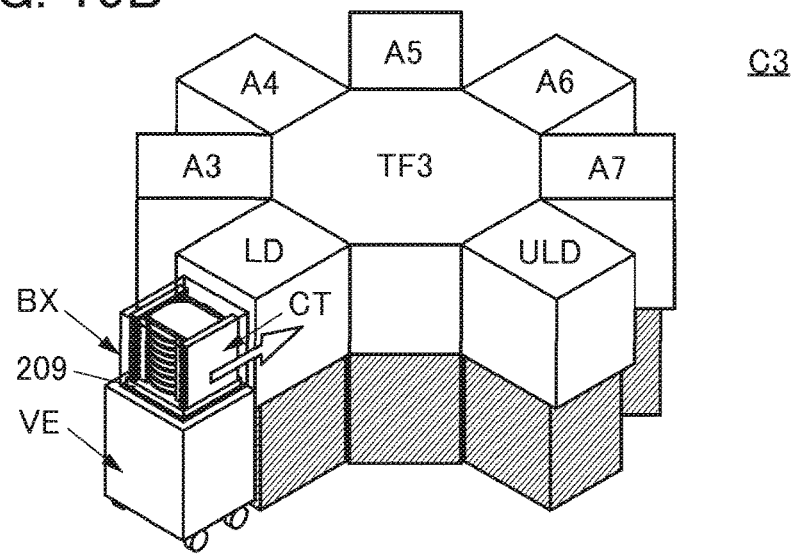

FIG. 15B is a diagram illustrating the carrying of the cassette CT into the cluster C3. Note that for simplification, this diagram illustrates a transparent wall of the transport container BX.

First, the atmosphere in the load chamber LD is replaced with an inert gas atmosphere. Next, the carry-in/out port of the transport container BX and the carry-in port of the load chamber LD are connected, and the cassette CT is transferred with a transfer device 209 from the transport container BX to the load chamber LD. Then, the carry-in port of the load chamber UL is closed, and treatment in the cluster C2 starts.

Figure 15C:
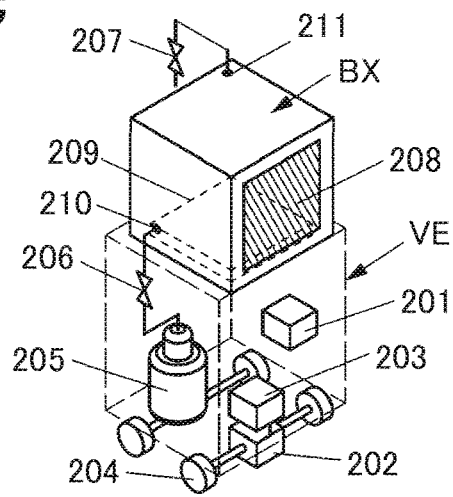
FIG. 15C is a diagram illustrating a transport vehicle and a transport container.

FIG. 15C is a diagram illustrating the transport container BX and the transport vehicle VE. The transport vehicle VE includes a controller 201, a power source 202, a battery 203, a gas cylinder 205 filled with an inert gas, and the like. The power source 202 connects the battery 203 and wheels 204. The transport vehicle VE can be moved manually or automatically with use of the controller 201.

The transport container BX includes an inlet 210 and an outlet 211 for a gas, and the inlet 210 is connected to the gas cylinder 205 through a valve 206. The outlet 211 is connected to a valve 207. One or both of the valve 206 and the valve 207 are conductance valves, which enable the inside of the transport container BX to be controlled to have a positive pressure with an inert gas. Nitrogen, argon, or the like is preferably used as the inert gas.

Furthermore, the transport container BX includes a carry-in/out port 208 and the transfer device 209. There is no limitation on the form of the carry-in/out port 208; for example, a door, a shutter, or the like can be employed.

The transfer device 209 can transfer the cassette CT. Note that in the description of FIG. 15A and FIG. 15B, the transfer device 200 of the unload chamber ULD is used to carry out the cassette to the transport container BX, and the transfer device 209 of the transport container BX is used to carry the cassette into the load chamber LD; however, either the transfer device 200 or the transfer device 209 can be used for these operations. A structure where either the transfer device 200 or the transfer device 209 is omitted may be employed.

Although the clusters C1 to C4 are described above as the examples, the independent cluster structure is applicable to the clusters C5 to C18. Furthermore, Structure Example 3 can be combined with part of Structure Example 1 or Structure Example 2.

Figure 16A:
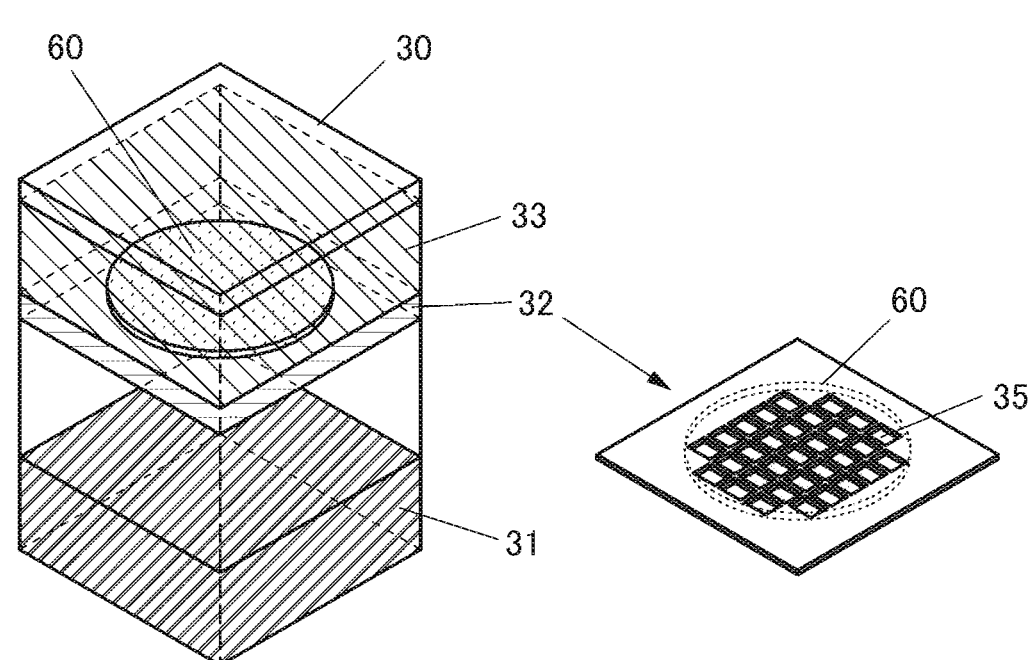
FIG. 16A is a diagram illustrating a vacuum process apparatus.

FIG. 16A is a diagram illustrating the vacuum process apparatus V in which a substrate is placed in a face-down mode; here, a deposition apparatus 30 is illustrated as an example. Note that for the sake of clarity, a chamber wall is illustrated as a transparent view and a gate valve is not illustrated in the diagram.

The deposition apparatus 30 includes a deposition material supply unit 31, a mask jig 32, and a substrate alignment unit 33. The deposition material supply unit 31 is provided with an evaporation source when the deposition apparatus 30 is an evaporation apparatus. Alternatively, the deposition material supply unit 31 is provided with a target (cathode) when the deposition apparatus 30 is a sputtering apparatus.

Figure 16B:
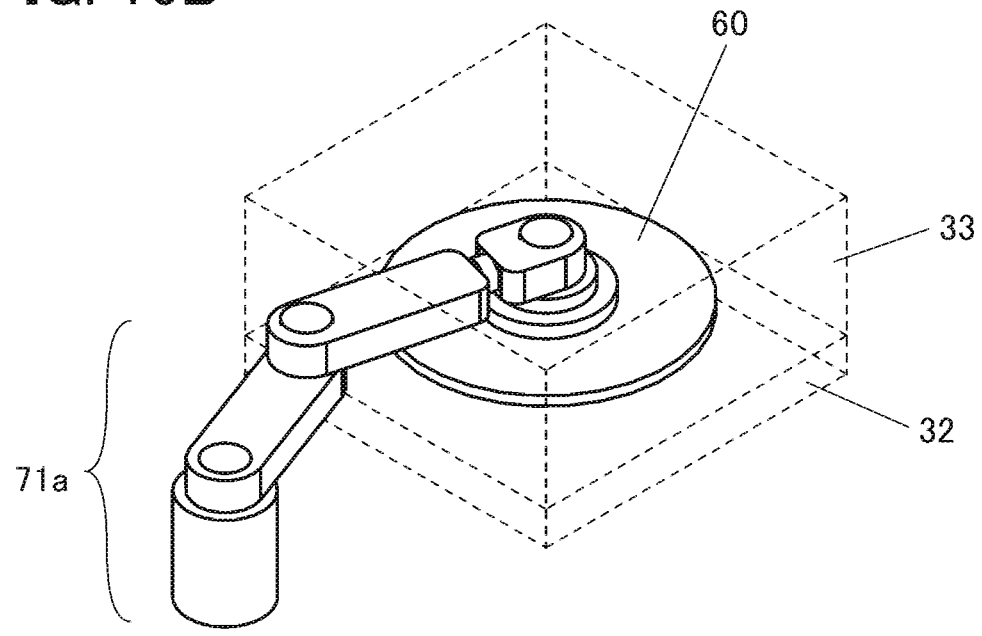
FIG. 16B is a diagram illustrating carrying of a substrate into the vacuum process apparatus.

As illustrated in FIG. 16B, the substrate 60 reversed upside down can be carried into the substrate alignment unit 33. The mask jig 32 is located below the substrate alignment unit 33. A circuit and the like are provided on the surface of the substrate 60 in advance, and the substrate 60 is attached closely to the mask jig 32 so as to avoid deposition in an unnecessary area. At this time, the substrate alignment unit 33 performs the position alignment between a portion of the substrate 60 where deposition is needed and an opening portion 35 of the mask jig 32.

Structures such as light-emitting devices are formed in the opening portion 35; thus, the opening portion 35 may be adjusted depending on the purpose. For example, the size of the opening portion 35 can be determined depending on the size of a light exposure region described below.

Figure 17A:
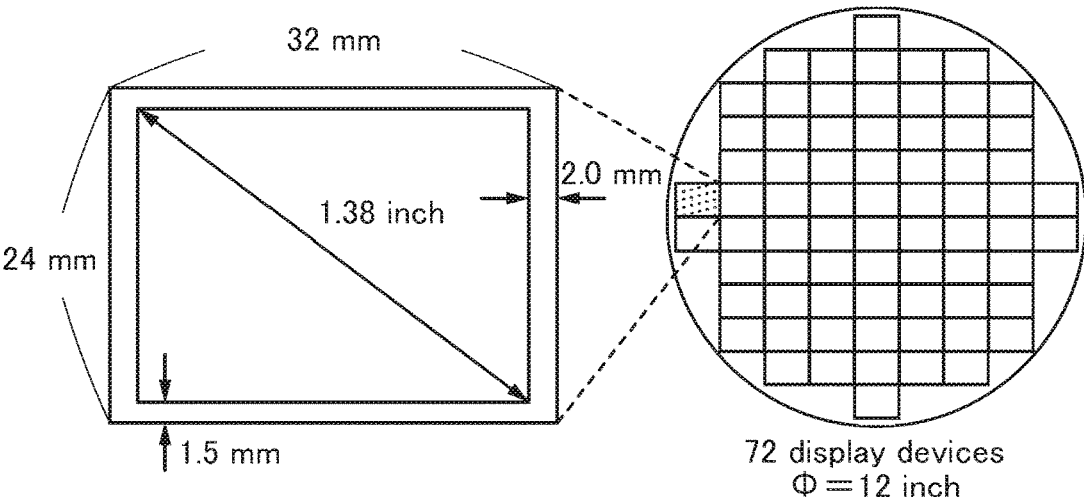
FIG. 17A to FIG. 17C are diagrams illustrating examples of the number of display devices taken out of one substrate.
Figure 17B:
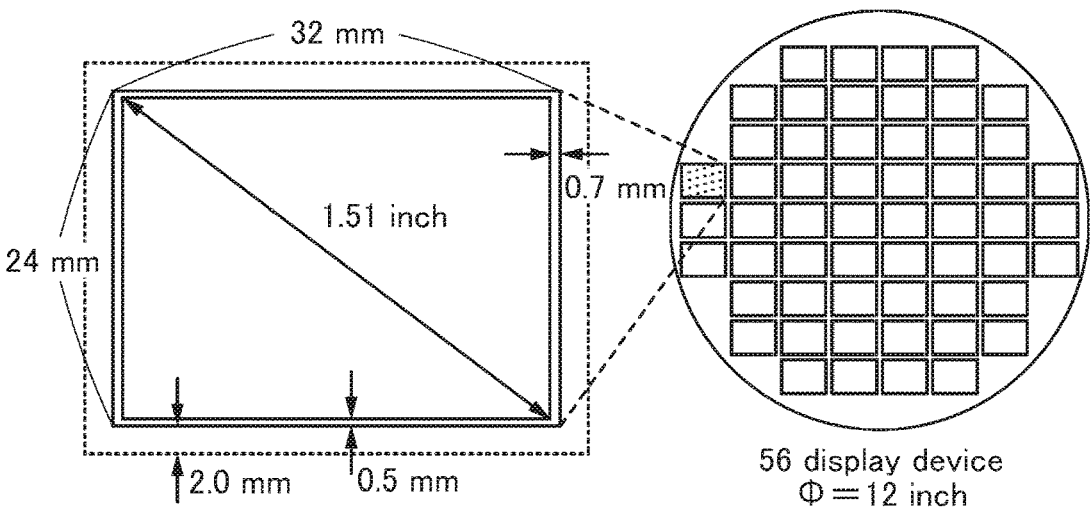
Figure 17C:
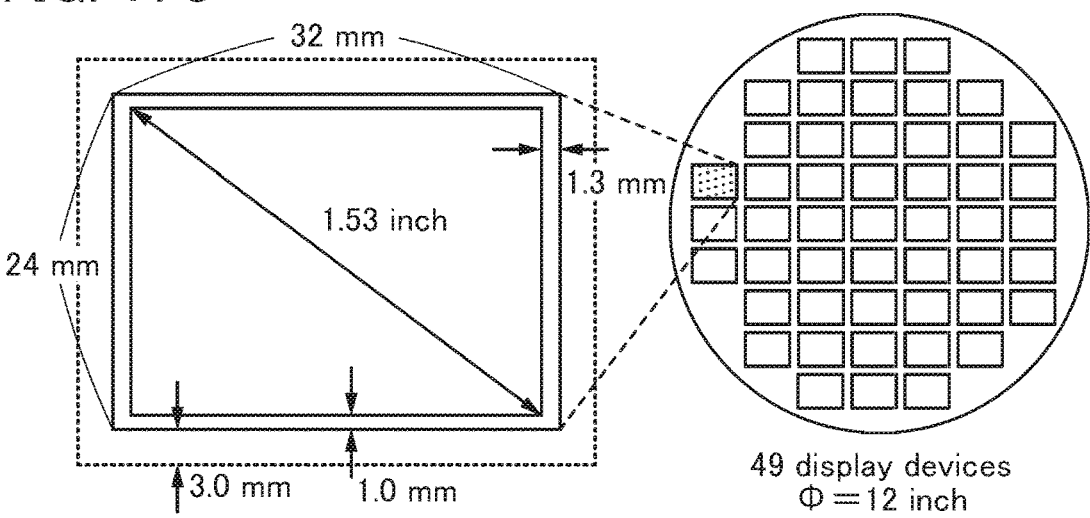

FIG. 17A to FIG. 17C illustrate examples of the number of display devices taken out from one substrate (e.g., silicon wafer) with a diameter $\Phi$ being 12 inches. Estimations illustrated in FIG. 17A to FIG. 17C are performed assuming that an external connection terminal is extracted from the rear surface with use of a through electrode. Thus, a display region can be set large. Note that a pad may be provided in the light exposure region. In this case, the display region is reduced but has an effect of reducing the manufacturing cost for the structure of extracting the external connection terminal.

FIG. 17A to FIG. 17C illustrate examples of a case where the aspect ratio of each display region is 4:3.

FIG. 17A is an example where a sealing region is provided inside a light exposure region (32 mm×24 mm) of a light-exposure apparatus. In the example of FIG. 17A, the width of the sealing region in the vertical direction is 1.5 mm and that in the horizontal direction is 2.0 mm. In this case, the display region has a size of 28 mm×21 mm (the aspect ratio is 4:3) and a diagonal size of approximately 1.38 inches. The number of display devices taken from one substrate is 72. When the width of the sealing region in the vertical direction is 2.0 mm and that in the horizontal direction is 2.65 mm, the display region has a size of 26.7 mm×20 mm (the aspect ratio is 4:3) and a diagonal size of approximately 1.32 inches. Alternatively, when the width of the sealing region in the vertical direction is 3.0 mm and that in the horizontal direction is 4.0 mm, the display region has a size of 24 mm×18 mm (the aspect ratio is 4:3) and a diagonal size of approximately 1.18 inches. In each case, the number of display devices taken from one substrate is 72.

FIG. 17B and FIG. 17C illustrate examples where a sealing region is provided outside a light exposure region (32 mm×24 mm) of a light-exposure apparatus. In this case, the region except a space for the sealing region is exposed to light. A marker region is provided inside the light exposure region. FIG. 17B illustrates an example of a case where the width of the marker region in the vertical direction is 0.5 mm and that in the horizontal direction is 0.7 mm, and the width of the sealing region is 2.0 mm. In this case, the display region of the display device has a diagonal size of approximately 1.51 inches. The number of display devices taken from one substrate is 56. Note that when the width of the marker region in the vertical direction is 1.0 mm and that in the horizontal direction is 1.3 mm, the display region has a diagonal size of approximately 1.45 inches. FIG. 17C illustrates an example of a case where the width of the marker region in the vertical direction is 0.5 mm and that in the horizontal direction is 0.7 mm, and the width of the sealing region is 3.0 mm. In this case, the display region of the display device has a diagonal size of approximately 1.51 inches and has the same structure as that in FIG. 17B. The number of display devices taken from one substrate is 49, which is smaller than that in the structure in FIG. 17B by approximately 13%.

FIG. 18A to 18F illustrate structure examples of a deposition apparatus applicable to the vacuum process apparatus V. FIG. 18A illustrates a vacuum evaporation apparatus, which includes a substrate holder 51 where the substrate 60 is set, an evaporation source 52 such as a crucible, and a shutter 53. An outlet 54 is connected to a vacuum pump. The evaporation source is heated under reduced pressure to evaporate or sublimate a deposition material, and the shutter is opened in this state, whereby deposition can be performed.

FIG. 18B illustrates a sputtering apparatus, which includes an upper electrode 58 where the substrate 60 is set, a lower electrode 56 where a target 57 is set, and the shutter 53. A gas inlet 55 is connected to a sputtering-gas supply source, and the outlet 54 is connected to a vacuum pump. For example, DC power, RF power, or the like is applied between the upper electrode 58 and the lower electrode 56 under reduced pressure containing a noble gas or the like to cause a sputtering phenomenon, and the shutter is opened, whereby the material of the target 57 can be deposited on the surface of the substrate 60.

FIG. 18C illustrates a plasma CVD apparatus, which includes the upper electrode 58 provided with the gas inlet 55 and a shower plate 59, and the lower electrode 56 where the substrate 60 is set. The gas inlet 55 is connected to a source-gas supply source, and the outlet 54 is connected to a vacuum pump. A source gas is introduced under reduced pressure and a high-frequency power or the like is applied between the upper electrode 58 and the lower electrode 56, whereby the source gas is decomposed and a target material can be deposited on the surface of the substrate 60.

FIG. 18D illustrates a dry etching apparatus, which includes the upper electrode 58 and the lower electrode where the substrate 60 is set. The gas inlet 55 is connected to an etching-gas supply source, and the outlet 54 is connected to a vacuum pump. The etching gas is introduced under reduced pressure, and a high-frequency power or the like is applied between the upper electrode 58 and the lower electrode 56, whereby the etching gas is activated, and an inorganic film or an organic film formed over the substrate 60 can be etched. Furthermore, an ashing apparatus and a plasma treatment apparatus can have a structure similar to the above.

FIG. 18E illustrates a standby chamber, which includes a substrate holder 62 storing a plurality of substrates 60. The outlet 54 is connected to a vacuum pump, and the substrates 60 are made to be in a standby state under reduced pressure. The number of substrates 60 that can be stored in the substrate holder 62 may be determined as appropriate in consideration of the time for previous and later processes.

FIG. 18F illustrates an ALD apparatus, which has a batch-type structure here. The ALD apparatus includes a heater 61, the gas inlet 55 is connected to a supply source of a precursor or the like, and the outlet 54 is connected to a vacuum pump. A substrate holder 63 stores a plurality of substrates 60 and is located over the heater 61. A precursor, an oxidizer, and the like are alternately introduced from the gas inlet 55 under reduced pressure, whereby deposition at an atomic layer level is repeated over the substrate 60. Note that in the case of a single-wafer structure, the substrate holder 62 is not provided. A thermal CVD apparatus can have a similar structure.

FIG. 18G illustrates a batch-type ALD apparatus different from that in FIG. 18F. The structure is basically similar, but there is a difference in that the substrates 60 are arranged over the heater 61 and the substrate holder 62 is not used. Note that a structure may be employed in which the gas inlet 55 is provided directly over the substrates 60, the heater 61 has a rotation mechanism or the like, and the substrates 60 pass directly below the gas inlet 55. With the rotation mechanism of the heater 61, the substrates 60 are shifted, which enables processing of a plurality of substrates.

This embodiment can be implemented in an appropriate combination with the structures described in the other embodiments.

Embodiment 2

In this embodiment, specific examples of an organic EL element that can be manufactured with the use of the manufacturing equipment for a light-emitting device of one embodiment of the present invention will be described.

In this specification and the like, a device formed using a metal mask or an FMM (fine metal mask, high-resolution metal mask) is sometimes referred to as a device having an MM (metal mask) structure. In this specification and the like, a device formed without using a metal mask or an FMM may be referred to as a device having a metal maskless (MML) structure.

In this specification and the like, a structure in which light-emitting layers in light-emitting devices of different colors (here, blue (B), green (G), and red (R)) are separately formed or separately patterned may be referred to as an SBS (Side By Side) structure. In this specification and the like, a light-emitting device capable of emitting white light may be referred to as a white-light-emitting device. Note that a combination of white-light-emitting devices with coloring layers (e.g., color filters) enables a full-color display device.

Light-emitting devices can be classified roughly into a single structure and a tandem structure. A device having a single structure includes one light-emitting unit between a pair of electrodes, and the light-emitting unit preferably includes one or more light-emitting layers. To obtain white light emission, two or more light-emitting layers are selected such that emission colors of the light-emitting layers are complementary colors. For example, when an emission color of a first light-emitting layer and an emission color of a second light-emitting layer are complementary colors, the light-emitting device can be configured to emit white light as a whole. The same applies to a light-emitting device including three or more light-emitting layers.

A device having a tandem structure includes two or more light-emitting units between a pair of electrodes, and each light-emitting unit preferably includes one or more light-emitting layers. To obtain white light emission, the structure is made so that light from light-emitting layers of the light-emitting units can be combined to be white light. Note that a structure for obtaining white light emission is similar to that in the case of a single structure. In the device having a tandem structure, it is suitable that an intermediate layer such as a charge-generation layer is provided between a plurality of light-emitting units.

When the above white-light-emitting device (having a single structure or a tandem structure) and the above light-emitting device having an SBS structure are compared to each other, the light-emitting device having an SBS structure can have lower power consumption than the white-light-emitting device. To reduce power consumption, a light-emitting device having an SBS structure is suitably used. Meanwhile, the white-light-emitting device is preferable in terms of lower manufacturing cost or higher manufacturing yield because the manufacturing process of the white-light-emitting device is simpler than that of a light-emitting device having an SBS structure.

The device with a tandem structure may include light-emitting layers emitting light of the same color (e.g., BB, GG, or RR). The tandem structure emitting light from a plurality of layers requires high voltage for light emission but achieves the same emission intensity as a single structure with a smaller current value. Thus, with the tandem structure, current stress on each light-emitting unit can be reduced and the element lifetime can be extended.

Structure Example

Figure 19:
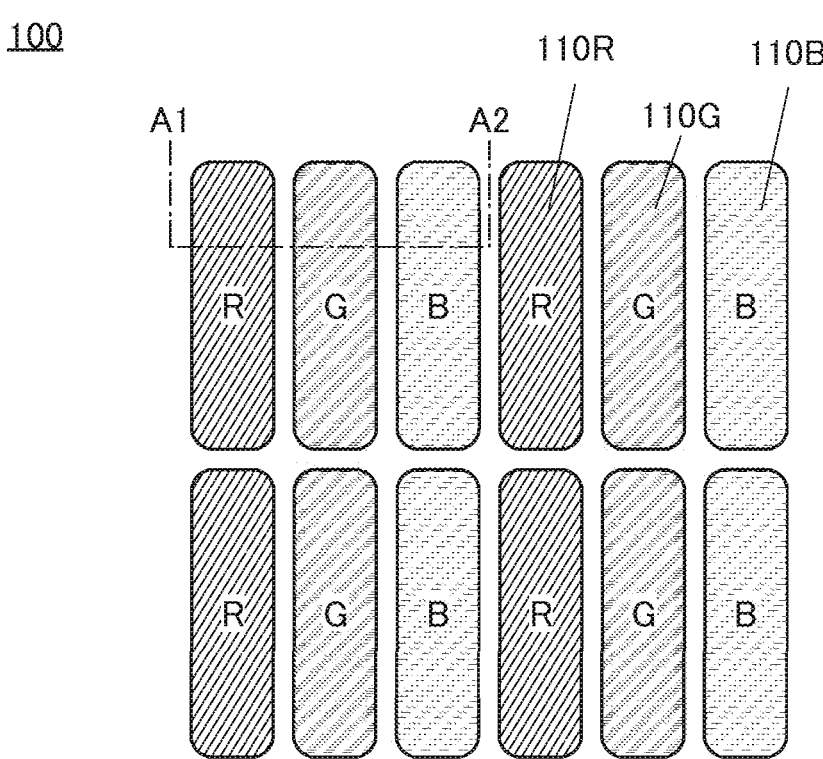
FIG. 19 is a diagram illustrating a display device.

FIG. 19 is a schematic top view of a display device 100 manufactured using the manufacturing equipment for a light-emitting device of one embodiment of the present invention. The display device 100 includes a plurality of light-emitting devices 110R exhibiting red, a plurality of light-emitting devices 110G exhibiting green, and a plurality of light-emitting devices 110B exhibiting blue. In FIG. 19, light-emitting regions of the light-emitting devices are denoted by R, G, and B to easily differentiate the light-emitting devices.

The light-emitting devices 110R, the light-emitting devices 110G, and the light-emitting devices 110B are arranged in a matrix. FIG. 19 illustrates what is called stripe arrangement, in which the light-emitting devices of the same color are arranged in one direction. Note that the arrangement method of the light-emitting devices is not limited thereto; another arrangement method such as delta arrangement, zigzag arrangement, or PenTile arrangement may also be used.

As the light-emitting devices 110R, the light-emitting devices 110G, and the light-emitting devices 110B, EL elements such as OLEDs (Organic Light Emitting Diodes) or QLEDs (Quantum-dot Light Emitting Diodes) are preferably used. As examples of a light-emitting substance contained in the EL element, a substance that emits fluorescent light (a fluorescent material), a substance that emits phosphorescent light (a phosphorescent material), an inorganic compound (e.g., a quantum dot material), a substance exhibiting thermally activated delayed fluorescence (a thermally activated delayed fluorescence (TADF) material), and the like can be given.

Figure 20A:
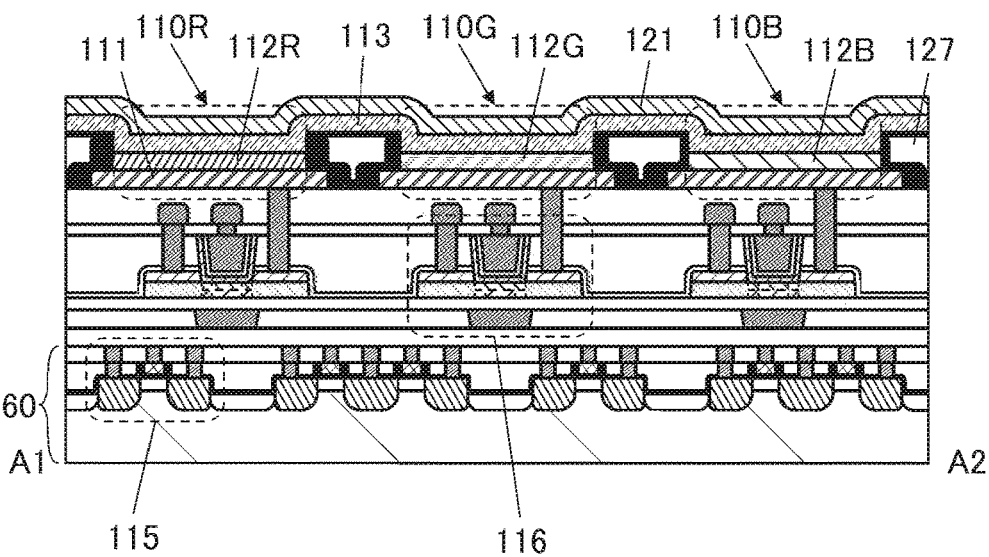
FIG. 20A to FIG. 20C are diagrams each illustrating a display device.

FIG. 20A is a schematic cross-sectional view taken along dashed-dotted line A1-A2 in FIG. 19.

FIG. 20A illustrates cross sections of the light-emitting device 110R, the light-emitting device 110G, and the light-emitting device 110B. The light-emitting device 110R, the light-emitting device 110G, and the light-emitting device 110B are each provided over a pixel circuit and each include a pixel electrode 111 and a common electrode 113.

The light-emitting device 110R includes an EL layer 112R between the pixel electrode 111 and the common electrode 113. The EL layer 112R contains at least a light-emitting organic compound that emits light having a peak in the red wavelength range. An EL layer 112G included in the light-emitting device 110G contains at least a light-emitting organic compound that emits light having a peak in the green wavelength range. An EL layer 112B included in the light-emitting device 110B contains at least a light-emitting organic compound that emits light having a peak in the blue wavelength range. Note that a structure in which the EL layer 112R, the EL layer 112G, and the EL layer 112B emit light of different colors may be referred to as an SBS (Side By Side) structure.

The EL layer 112R, the EL layer 112G, and the EL layer 112B may each include one or more of an electron-injection layer, an electron-transport layer, a hole-injection layer, and a hole-transport layer in addition to the layer containing a light-emitting organic compound (light-emitting layer).

The pixel electrode 111 is provided in each of the light-emitting devices. The common electrode 113 is provided as a continuous layer shared by the light-emitting devices. A conductive film with a property of transmitting visible light is used for either one of the pixel electrode 111 and the common electrode 113, and a conductive film with a property of reflecting visible light is used for the other. When the pixel electrodes 111 are light-transmitting electrodes and the common electrode 113 is a reflective electrode, a bottom-emission display device can be obtained; in contrast, when the pixel electrodes 111 are reflective electrodes and the common electrode 113 is a light-transmitting electrode, a top-emission display device can be obtained. Note that when both the pixel electrode 111 and the common electrode 113 have a light-transmitting property, the display device can have a dual emission structure. In this embodiment, an example of manufacturing a top-emission display device is described.

The EL layer 112R, the EL layer 112G, and the EL layer 112B each include a region in contact with the top surface of the pixel electrode 111.

As illustrated in FIG. 20A, there is a gap between the two EL layers of the light-emitting devices of different colors. In this manner, the EL layer 112R, the EL layer 112G, and the EL layer 112B are preferably provided so as not to be in contact with each other. This can suitably prevent unintentional light emission due to a current flowing through the two adjacent EL layers. As a result, the contrast can be increased to achieve a display device with high display quality.

A protective layer 121 is provided over the common electrode 113 to cover the light-emitting device 110R, the light-emitting device 110G, and the light-emitting device 110B. The protective layer 121 has a function of preventing diffusion of impurities into the light-emitting devices from above. Alternatively, the protective layer 121 has a function of capturing (also called gettering) impurities (such as water and hydrogen typically) that may enter the light-emitting devices.

The protective layer 121 can have, for example, a single-layer structure or a stacked-layer structure at least including an inorganic insulating film. Examples of the inorganic insulating film include an oxide film and a nitride film such as a silicon oxide film, a silicon oxynitride film, a silicon nitride oxide film, a silicon nitride film, an aluminum oxide film, an aluminum oxynitride film, and a hafnium oxide film. Alternatively, a semiconductor material such as an indium gallium oxide or an indium gallium zinc oxide may be used for the protective layer 121.

The pixel electrode 111 is electrically connected to one of a source and a drain of a transistor 116. A transistor including a metal oxide in a channel formation region (hereinafter, an OS transistor) can be used as the transistor 116, for example. The OS transistor has higher mobility than amorphous silicon and has excellent electrical characteristics. In addition, crystallization needed in the manufacturing process using polycrystalline silicon is not necessary for the OS transistor, and the OS transistor can be fabricated in the back end of line or the like. Therefore, the OS transistor can be formed over a transistor 115 using silicon in a channel formation region formed with the substrate 60 (hereinafter, such a transistor is referred to as Si transistor) without a bonding step or the like.

Here, the transistor 116 is included in a pixel circuit. The transistor 115 is included in a driver circuit for the pixel circuit or the like. In other words, the pixel circuit can be formed over the driver circuit, which enables formation of a display device with a narrow bezel.

As a semiconductor material used for an OS transistor, a metal oxide whose energy gap is greater than or equal to 2 eV, preferably greater than or equal to 2.5 eV, further preferably greater than or equal to 3 eV can be used.

In an OS transistor, a semiconductor layer has a large energy gap, and thus the OS transistor has an extremely low off-state current of several yoctoamperes per micrometer (current per micrometer of a channel width). The off-state current value per micrometer of channel width of the OS transistor at room temperature can be lower than or equal to 1 aA ($1 \times 10^{-18}$ A), lower than or equal to 1 zA ($1 \times 10^{-21}$ A), or lower than or equal to 1 yA ($1 \times 10^{-24}$ A). Note that the off-state current value per micrometer of channel width of a Si transistor at room temperature is higher than or equal to 1 fA ($1 \times 10^{-15}$ A) and lower than or equal to 1 pA ($1 \times 10^{-12}$ A). In other words, the off-state current of an OS transistor is lower than that of a Si transistor by approximately ten orders of magnitude.

An OS transistor has features such that impact ionization, an avalanche breakdown, a short-channel effect, or the like does not occur, which are different from those of a Si transistor. Thus, the use of an OS transistor enables formation of a circuit having high withstand voltage and high reliability. Moreover, variation in electrical characteristics due to crystallinity unevenness, which is caused in Si transistors, is less likely to occur in OS transistors.

A semiconductor layer in an OS transistor can be, for example, a film represented by an In-M-Zn-based oxide that contains indium, zinc, and M (one or more of metals such as aluminum, titanium, gallium, germanium, yttrium, zirconium, lanthanum, cerium, tin, neodymium, and hafnium). The In-M-Zn-based oxide can be typically formed by a sputtering method. Alternatively, the In-M-Zn-based oxide can be formed by an ALD (Atomic layer deposition) method.

For example, an oxide (IGZO), which contains indium (In), gallium (Ga), and zinc (Zn), can be used as the In-M-Zn-based oxide. Alternatively, an oxide (IAZO), which contains indium (In), aluminum (Al), and zinc (Zn), may be used. Further alternatively, an oxide (IAGZO), which contains indium (In), aluminum (Al), gallium (Ga), and zinc (Zn), may be used.

It is preferable that the atomic ratio of metal elements in a sputtering target used to form an In-M-Zn oxide by a sputtering method satisfy In≥M and Zn≥M. The atomic ratio of metal elements in such a sputtering target is preferably, for example, In:M:Zn=1:1:1, In:M:Zn=1:1:1.2, In:M:Zn=1:3:2, In:M:Zn=3:1:2, In:M:Zn=4:2:3, In:M:Zn=4:2:4.1, In:M:Zn=5:1:6, In:M:Zn=5:1:7, In:M:Zn=5:1:8, or the like, or a composition in the neighborhood thereof. Note that the atomic ratio in the deposited semiconductor layer varies from the atomic ratio of metal elements of the sputtering target in a range of ±40%.

An oxide semiconductor with low carrier density is used for the semiconductor layer. For example, for the semiconductor layer, an oxide semiconductor whose carrier density is lower than or equal to $1 \times 10^{17}$/cm$^3$, preferably lower than or equal to $1 \times 10^{15}$/cm$^3$, further preferably lower than or equal to $1 \times 10^{13}$/cm$^3$, still further preferably lower than or equal to $1 \times 10^{11}$/cm$^3$, even further preferably lower than $1 \times 10^{10}$/cm$^3$, and higher than or equal to $1 \times 10^{-9}$/cm$^3$ can be used. Such an oxide semiconductor is referred to as a highly purified intrinsic or substantially highly purified intrinsic oxide semiconductor. The oxide semiconductor has a low density of defect states and can thus be referred to as an oxide semiconductor having stable characteristics.

Note that the composition is not limited to those, and a material having appropriate composition may be used depending on required semiconductor characteristics and electrical characteristics of the transistor (field-effect mobility, threshold voltage, or the like). To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

Note that the display device illustrated in FIG. 20A includes an OS transistor and a light-emitting device having an MML (metal maskless) structure. With this structure, the leakage current that might flow through the transistor and the leakage current that might flow between adjacent light-emitting elements (also referred to as a lateral leakage current, a side leakage current, or the like) can become extremely low. With the structure, a viewer can notice any one or more of the image crispness, the image sharpness, and a high contrast ratio in an image displayed on the display device. With the structure where the leakage current that might flow through the transistor and the lateral leakage current that might flow between light-emitting elements are extremely low, display with little leakage of light at the time of black display (also referred to as deep black display) can be achieved.

Figure 20B:
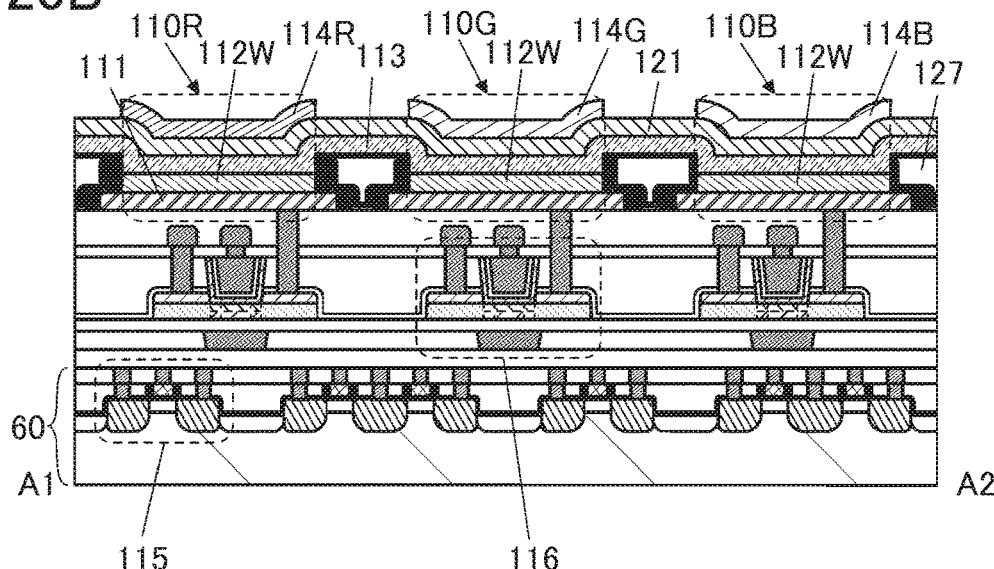

Although FIG. 20A illustrates a structure example in which the light-emitting layers of the R, G, and B light-emitting elements are different from each other, one embodiment of the present invention is not limited thereto. For example, as illustrated in FIG. 20B, a coloring method may be employed in which the light-emitting devices 110R, 110G, and 110B are formed by providing EL layers 112W that emit white light and providing coloring layers 114R (red), 114G (green), and 114B (blue) that overlap with the EL layers 112W.

The EL layer 112W can have a tandem structure in which EL layers emitting R, G, and B light are connected in series, for example. Alternatively, a structure in which light-emitting layers emitting R, G, and B light are connected in series may be used. As the coloring layers 114R, 114G, and 114B, for example, red, green, and blue color filters can be used.

Figure 20C:
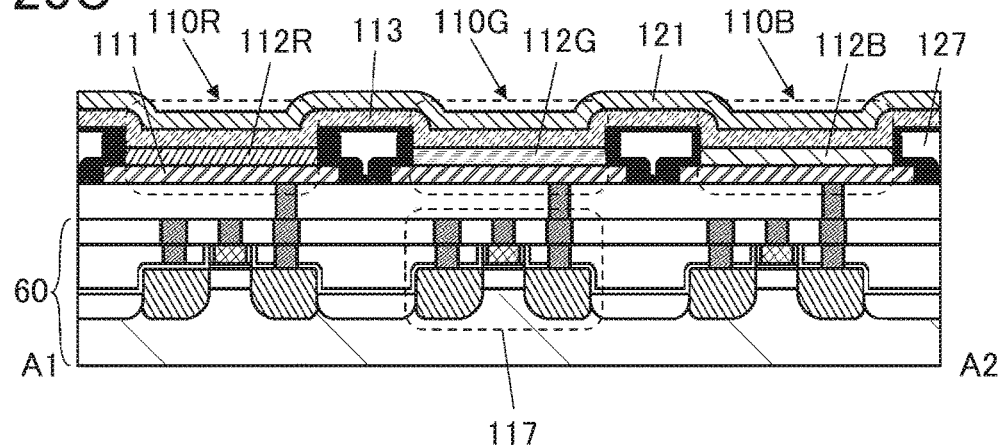

As illustrated in FIG. 20C, a pixel circuit may be formed with a transistor 117 included in the substrate 60, and one of a source and a drain of the transistor 117 may be electrically connected to the pixel electrode 111.

Manufacturing Method Example

Described below is an example of a manufacturing method of a light-emitting device that can be manufactured with the manufacturing equipment of one embodiment of the present invention. Here, description is made using an example of the light-emitting device included in the display device 100 described in the above structure example.

FIG. 21A to FIG. 25B are schematic cross-sectional views in processes of the manufacturing method of the light-emitting device described below. Note that the transistor 116 that is a component of the pixel circuit and the transistor 115 that is a component of the driver circuit, which are illustrated in FIG. 20A, are omitted in FIG. 21A to FIG. 25B.

Thin films constituting the display device (insulating films, semiconductor films, conductive films, and the like) can be formed by a sputtering method, a chemical vapor deposition (CVD) method, a vacuum evaporation method, an atomic layer deposition (ALD) method, or the like. Examples of the CVD method include a plasma-enhanced chemical vapor deposition (PECVD) method and a thermal CVD method. As an example of the thermal CVD method, a metal organic chemical vapor deposition (MOCVD: Metal Organic CVD) method can be given. The manufacturing equipment of one embodiment of the present invention can include an apparatus for forming thin films by the above method.

A method such as spin coating, dipping, spray coating, ink-jetting, dispensing, screen printing, offset printing, a doctor knife method, slit coating, roll coating, curtain coating, or knife coating can be employed for formation of the thin films constituting the display device (insulating films, semiconductor films, conductive films, and the like) and application of a resin or the like used for a lithography step. The manufacturing equipment of one embodiment of the present invention can include an apparatus for forming thin films by the above method. In addition, the manufacturing equipment of one embodiment of the present invention can include an apparatus for applying a resin by the above method.

Thin films that constitute the display apparatus can be processed by a photolithography method or the like. Alternatively, the thin films may be processed by a nanoimprinting method. A method in which island-shaped thin films are directly formed by a deposition method using a blocking mask may also be used.

There are two typical methods for processing a thin film using a photolithography method. In one of the methods, a resist mask is formed over a thin film that is to be processed, the thin film is processed by etching or the like, and then the resist mask is removed. In the other method, a photosensitive thin film is formed and then processed into a desired shape by light exposure and development.

As the light used for light exposure in the photolithography method, for example, an i-line (with a wavelength of 365 nm), a g-line (with a wavelength of 436 nm), an h-line (with a wavelength of 405 nm), or combined light of any of them can be used. Alternatively, ultraviolet light, KrF laser light, ArF laser light, or the like can be used. Light exposure may be performed by liquid immersion exposure technique. As the light used for light exposure, extreme ultraviolet (EUV) light or X-rays may also be used. Furthermore, instead of the light used for the light exposure, an electron beam can also be used. It is preferable to use extreme ultraviolet light, X-rays, or an electron beam because they can perform extremely fine processing. Note that a photomask is not needed when light exposure is performed by scanning with a beam such as an electron beam.

For etching of thin films, a dry etching method, a wet etching method, or the like can be used. The manufacturing equipment of one embodiment of the present invention can include an apparatus for processing thin films by the above method.

<Preparation of Substrate 60>

As the substrate 60, a substrate having at least heat resistance high enough to withstand later heat treatment can be used. In the case where an insulating substrate is used as the substrate 60, a glass substrate, a quartz substrate, a sapphire substrate, a ceramics substrate, an organic resin substrate, or the like can be used. Alternatively, a single crystal semiconductor substrate or a polycrystalline semiconductor substrate using silicon or silicon carbide as a material, a compound semiconductor substrate of silicon germanium or the like, a semiconductor substrate such as an SOI substrate, or the like can be used. Note that the shape of the substrate is not limited to a circular wafer, and a square substrate can also be used.

As the substrate 60, it is particularly preferable to use the semiconductor substrate or the insulating substrate over which a semiconductor circuit including a semiconductor element such as a Si transistor is formed. The semiconductor circuit preferably forms a pixel circuit, a gate line driver circuit (a gate driver), a source line driver circuit (a source driver), or the like. In addition to the above, an arithmetic circuit, a memory circuit, or the like may be formed.

<Formation of Pixel Circuits and Pixel Electrode 111>

Figure 21A:
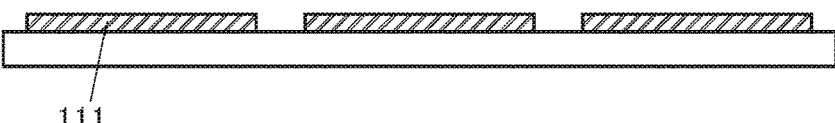
FIG. 21A to FIG. 21F are diagrams illustrating a manufacturing method of a display device.

Next, a plurality of pixel circuits are formed over the substrate 60, and the pixel electrode 111 is formed for each of the pixel circuits (see FIG. 21A). First, a conductive film to be the pixel electrodes 111 is formed, a resist mask is formed by a photolithography method, and an unnecessary portion of the conductive film is removed by etching. After that, the resist mask is removed, whereby the pixel electrodes 111 can be formed.

It is preferable to use, for the pixel electrodes 111, a material (e.g., silver or aluminum) having reflectance as high as possible in the whole wavelength range of visible light. The pixel electrodes 111 formed using the material can be referred to as electrodes having a light-reflecting property. This can increase color reproducibility as well as light extraction efficiency of the light-emitting devices.

The light-emitting devices preferably employ a microcavity structure. Therefore, one of the pair of electrodes of the light-emitting devices is preferably an electrode having properties of transmitting and reflecting visible light (a semi-transmissive and semi-reflective electrode), and the other is preferably an electrode having a property of reflecting visible light (a reflective electrode). When the light-emitting device has a microcavity structure, light obtained from the light-emitting layer can be resonated between the electrodes, whereby light emitted from the light-emitting device can be intensified. For that reason, the pixel electrode 111 may have a stacked-layer structure of the material with high reflectivity and a light-transmitting conductive film (indium tin oxide or the like).

Next, a baking process for removing moisture remaining on the surface of the pixel electrode 111 is performed. A vacuum baking apparatus or a deposition apparatus can be used for the baking process. The vacuum baking is preferably performed in a condition at 100° C. or higher.

Next, the pixel electrode 111 is subjected to surface treatment. For example, the surface of the pixel electrode 111 is irradiated with plasma generated using a fluorine-based gas such as $CF_4$ with the use of a plasma treatment apparatus. By the plasma treatment, the adhesion between the pixel electrode 111 and an EL film which is formed in the next step can be increased, which can inhibit the occurrence of peeling defects.

<Formation of EL Film 112Rf>

Next, an EL film 112Rf to be the EL layer 112R later is formed over the pixel electrode 111.

The EL film 112Rf includes at least a film containing a red-light-emitting organic compound. A structure may be employed in which an electron-injection layer, an electron-transport layer, a charge-generation layer, a hole-transport layer, and a hole-injection layer are stacked in addition to the above. The EL film 112Rf can be formed by an evaporation method or a sputtering method, for example. Note that without limitation to this, the above deposition method can be used as appropriate.

<Formation of Protective Film 125Rf>

Figure 21B:
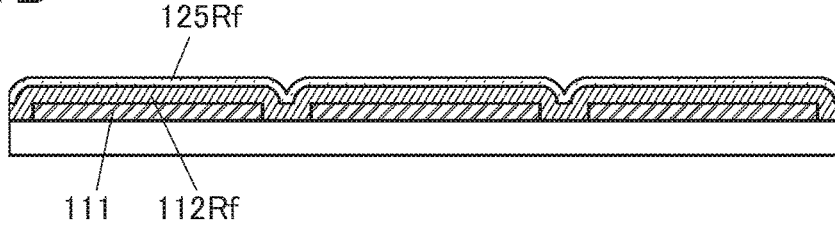

Next, a protective film 125Rf to be a protective layer 125R later is formed over the EL film 112Rf (see FIG. 21B).

The protective layer 125R is a tentative protective layer, which is also called a sacrifice layer, used for preventing the EL layer 112R from being degraded and vanishing in a manufacturing process of the light-emitting devices. The protective film 125Rf is preferably formed by a deposition method that has high barrier property against moisture or the like and is less likely to give damage to an organic compound during deposition. Furthermore, the protective film 125Rf is preferably formed using a material for which an etchant less likely to give damage to the organic compound in an etching step is acceptable. For the protective film 125Rf, an inorganic film such as a metal film, an alloy film, a metal oxide film, a semiconductor film, or an inorganic insulating film can be used.

For example, a metal such as tungsten, an inorganic insulating film such as an aluminum oxide film, or a stacked films thereof is preferably used. Alternatively, a stacked-layer structure of an aluminum oxide film formed by an ALD method and a silicon nitride film formed by a sputtering method may be used. In the case of employing this structure, the deposition temperature at the time of deposition by an ALD method and a sputtering method is preferably higher than or equal to room temperature and lower than or equal to 120° C., further preferably higher than or equal to room temperature and lower than or equal to 100° C., in which case adverse effects on the EL layer can be reduced. In the case where the protective layer 125R has a stacked-layer film, it is preferable to reduce the stress of the stacked-layer film. Specifically, a stress applied to each layer in the stacked-layer film is preferably higher than or equal to −500 MPa and less than or equal to +500 MPa, further preferably higher than or equal to −200 MPa and lower than or equal to +200 MPa, in which case troubles in the process, such as film separation and peeling, can be reduced.

<Formation of Resist Mask 143a>

Figure 21C:
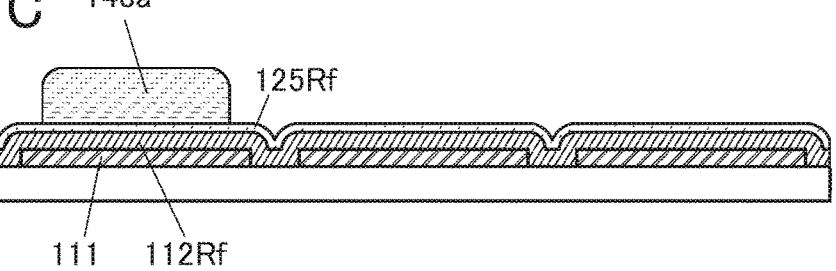
Figure 21D:
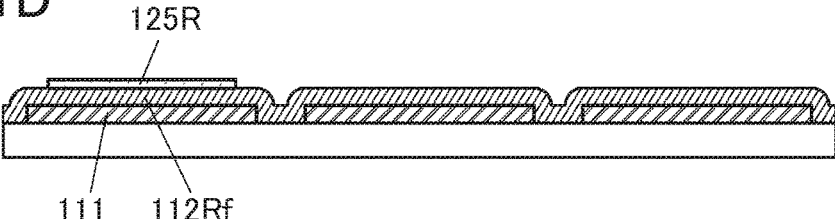

Next, a resist mask 143a is formed over the pixel electrode 111 corresponding to the light-emitting device 110R (see FIG. 21C). The resist mask 143a can be formed by a lithography process.

<Formation of Protective Layer 125R>

Next, the protective film 125Rf is etched using the resist mask 143a as a mask, whereby the protective layer 125R is formed to have an island shape. A dry etching method or a wet etching method can be used for the etching process. After that, the resist mask 143a is removed by ashing or using a resist stripper (see FIG. 21D).

<Formation of EL Layer 112R>

Figure 21E:
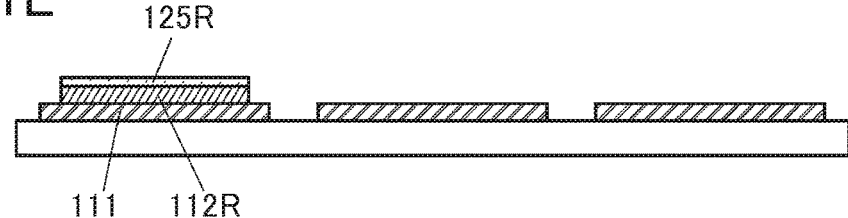

Then, the EL film 112Rf is etched using the protective layer 125R as a mask, whereby the EL layer 112R is formed to have an island shape (see FIG. 21E). A dry etching method is preferably used in the etching process. Then, cleaning is performed on the side surface of the EL layer 112R and the like with the use of a plasma treatment apparatus or the like.

<Formation of Protective Films 126Rf and 128Rf>

Figure 21F:
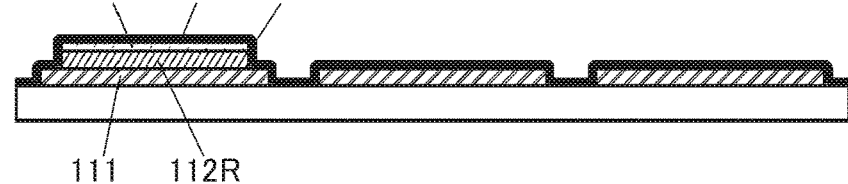

Next, a protective film 126Rf and a protective film 128Rf that cover the EL layer 112R and the protective layer 125R are deposited (see FIG. 21F). Inorganic films similar to the protective film 125Rf or the like can be used as the protective film 126Rf and the protective film 128Rf The protective film 126Rf and the protective film 128Rf are preferably formed by an ALD method with excellent coverage. Alternatively, the protective film 126Rf may be formed by an ALD method, and the protective film 128Rf may be formed by a CVD or sputtering method. For example, the protective film 126Rf can be aluminum oxide and the protective film 128Rf can be silicon nitride. Stacking different kinds of films can form strong protective films.

<Formation of Protective Layers 126R and 128R>

Next, the protective film 126Rf and the protective film 128Rf are subjected to anisotropic etching by a dry etching method to leave parts of the protective film 126Rf and the protective film 128Rf, whereby a protective layer 126R and a protective layer 128R are formed (see FIG. 22A). Note that the protective layer 126R and the protective layer 128R are formed on the side surface of the EL layer 112R, the side surface of the protective layer 125R, and the side surface of the pixel electrode 111, but they only need to cover at least the side surface of the EL layer 112R.

<Formation of EL Film 112Gf>

Next, a baking process for removing moisture remaining on the surface of the pixel electrode 111 is performed. A vacuum baking apparatus or a deposition apparatus can be used for the baking process. As the condition which does not give damage to the EL layer 112R, the vacuum baking is performed at a temperature lower than or equal to 100° C., preferably, lower than or equal to 90° C., further preferably lower than or equal to 80° C. In the case of vacuum baking at 80° C., the sufficient amount of moisture ($H_2O$) has been released in 30 minutes or more according to the measurement by thermal desorption spectroscopy (TDS).

Next, the exposed pixel electrode 111 is subjected to surface treatment. For example, the surface of the pixel electrode 111 is irradiated with plasma generated using a fluorine-based gas such as $CF_4$ with a plasma treatment apparatus. Then, an EL film 112Gf to be the EL layer 112G is formed over the pixel electrode 111.

The EL film 112Gf includes at least a film containing a green-light-emitting organic compound. A structure may be employed in which an electron-injection layer, an electron-transport layer, a charge-generation layer, a hole-transport layer, and a hole-injection layer are stacked in addition to the above.

<Formation of Protective Film 125Gf>

Then, a protective film 125Gf to be a protective layer 125G later is formed over the EL film 112Gf (see FIG. 22B). The protective film 125Gf can be formed using a material similar to that of the protective film 125Rf.

<Formation of Resist Mask 143b>

Next, a resist mask 143b is formed over the pixel electrode 111 corresponding to the light-emitting device 110G (see FIG. 22C). The resist mask 143b can be formed by a lithography process.

<Formation of Protective Layer 125G>

Subsequently, the protective film 125Gf is etched using the resist mask 143b as a mask, whereby the protective layer 125G is formed to have an island shape. A dry etching method or a wet etching method can be used in the etching process. After that, the resist mask 143b is removed by ashing or using a resist stripper (see FIG. 22D).

<Formation of EL Layer 112G>

Then, the EL film 112Gf is etched using the protective layer 125G as a mask, whereby the EL layer 112G is formed to have an island shape (see FIG. 22E). A dry etching method is preferably used in the etching process. Then, cleaning is performed on the side surface of the EL layer 112G and the like with the use of a plasma treatment apparatus or the like.

<Formation of Protective Films 126Gf and 128Gf>

Next, a protective film 126Gf and a protective film 128Gf that cover the EL layer 112G and the protective layer 125G are deposited (see FIG. 22F). An inorganic film similar to the protective film 126Rf can be used as the protective film 126Gf. An inorganic film similar to the protective film 128Rf can be used as the protective film 128Gf.

<Formation of Protective Layer 126G>

Figure 23A:
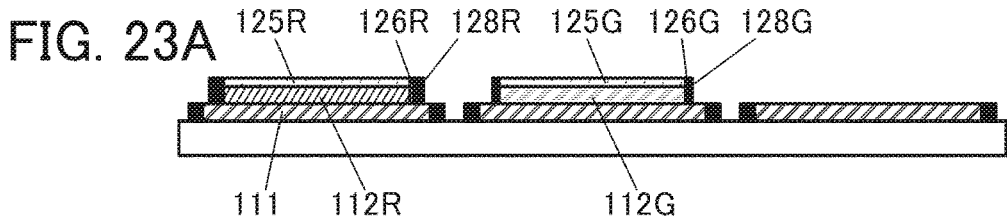
FIG. 23A to FIG. 23F are diagrams illustrating a manufacturing method of a display device.

Next, the protective film 126Gf and the protective film 128Gf are subjected to anisotropic etching by a dry etching method to leave parts of the protective film 126Gf and protective film 128Gf, whereby a protective layer 126G and a protective layer 128G are formed (see FIG. 23A). Note that the protective layer 126G and the protective layer 128G are formed on the side surface of the EL layer 112G, the side surface of the protective layer 125G, and the side surface of the pixel electrode 111, but they only need to cover at least the side surface of the EL layer 112G. Furthermore, the protective layer 126G and the protective layer 128G may be formed to overlap with the protective layer 126R and the protective layer 128R.

<Formation of EL Film 112Bf>

Next, a baking process for removing moisture remaining on the surface of the pixel electrode 111 is performed. A vacuum baking apparatus or a deposition apparatus can be used for the baking process. As the condition which does not give damage to the EL layers 112R and 112G, the vacuum baking is performed at a temperature lower than or equal to 100° C., preferably, lower than or equal to 90° C., further preferably lower than or equal to 80° C.

Next, the exposed pixel electrode 111 is subjected to surface treatment. For example, the surface of the pixel electrode 111 is irradiated with plasma generated using a fluorine-based gas such as $CF_4$ with a plasma treatment apparatus. Then, an EL film 112Bf to be the EL layer 112B is formed over the pixel electrode 111.

The EL film 112Bf includes at least a film containing a blue-light-emitting organic compound. A structure may be employed in which an electron-injection layer, an electron-transport layer, a charge-generation layer, a hole-transport layer, and a hole-injection layer are stacked in addition to the above.

<Formation of Protective Film 125Bf>

Figure 23B:
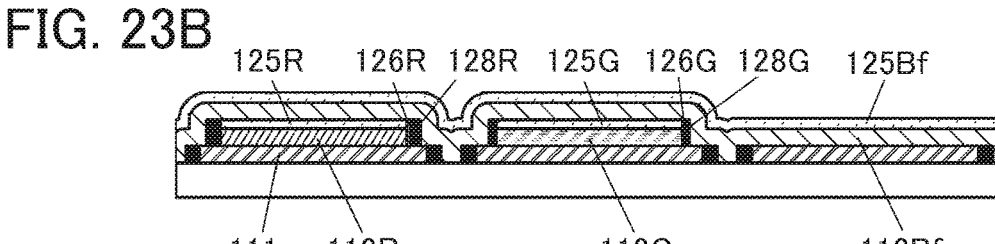

Next, a protective film 125Bf to be a protective layer 125B later is formed over the EL film 112Bf (see FIG. 23B). The protective film 125Bf can be formed using a material similar to that of the protective film 125Rf.

<Formation of Resist Mask 143c>

Figure 23C:
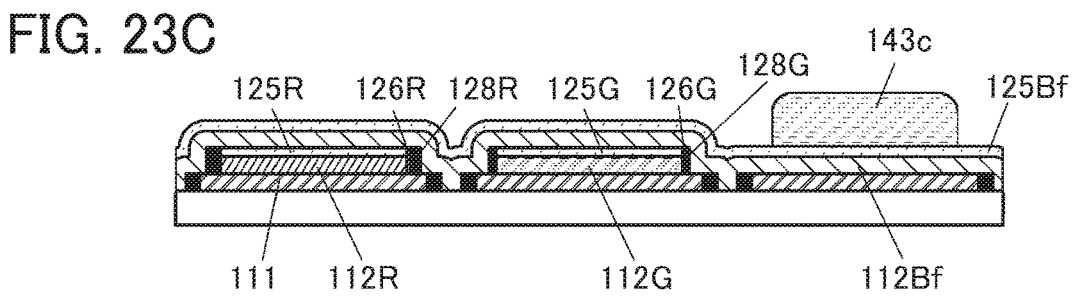
Figure 23D:
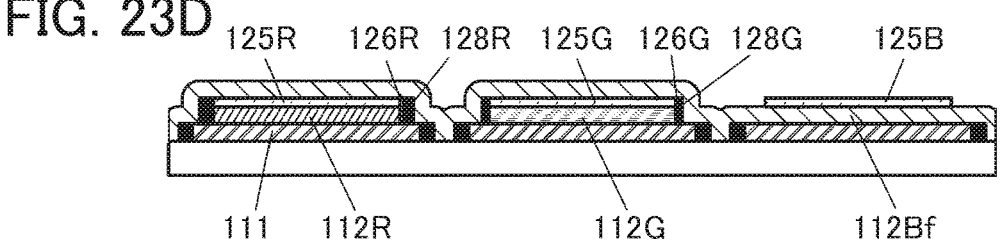

Next, a resist mask 143c is formed over the pixel electrode 111 corresponding to the light-emitting device 110B (see FIG. 23C). The resist mask 143c can be formed by a lithography process.

<Formation of protective layer 125B>

Subsequently, the protective film 125Bf is etched using the resist mask 143c as a mask, whereby the protective layer 125B is formed to have an island shape. A dry etching method or a wet etching method can be used in the etching process. After that, the resist mask 143c is removed by ashing or using a resist stripper (see FIG. 23D).

<Formation of EL Layer 112B>

Figure 23E:
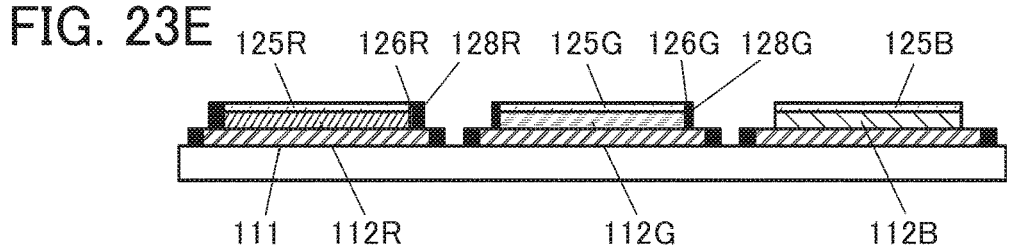

Then, the EL film 112Bf is etched using the protective layer 125B as a mask, whereby the EL layer 112B is formed to have an island shape (see FIG. 23E). A dry etching method is preferably used in the etching process. Then, cleaning is performed on the side surface of the EL layer 112B and the like with the use of a plasma treatment apparatus or the like.

<Formation of Protective Films 126Bf and 128Bf>

Figure 23F:
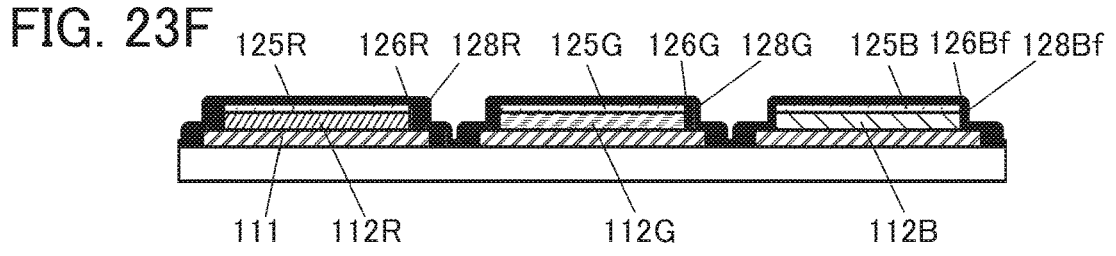

Next, a protective film 126Bf and a protective film 128Bf that cover the EL layer 112B and the protective layer 125B are deposited (see FIG. 23F). An inorganic film similar to the protective film 126Rf can be used as the protective film 126Bf. An inorganic film similar to the protective film 128Rf can be used as the protective film 128Bf.

<Formation of Insulating Layer 127>

Next, an insulating layer 127 is formed to fill spaces between the pixel electrodes and between the EL layers (see FIG. 24A). The formation of the insulating layer 127 can eliminate steps, which can prevent disconnection of a conductive film (cathode) formed over the EL layers in a later step. Furthermore, the insulating layer 127 covers the vicinity of the side surfaces of the EL layers, which can prevent entry of impurities to the EL layers, peeling of the EL layers, and the like. Note that the insulating layer 127 can be referred to as an interlayer insulating layer provided between the conductive film and the pixel electrodes 111.

An insulating layer containing an organic material is preferably used as the insulating layer 127. For the insulating layer 127, an acrylic resin, a polyimide resin, an epoxy resin, an imide resin, a polyamide resin, a polyimide-amide resin, a silicone resin, a siloxane resin, a benzocyclobutene-based resin, a phenol resin, a precursor of any of these resins, or the like can be used, for example. Furthermore, for the insulating layer 127, an organic material such as polyvinyl alcohol (PVA), polyvinylbutyral, polyvinylpyrrolidone, polyethylene glycol, polyglycerin, pullulan, water-soluble cellulose, or an alcohol-soluble polyamide resin may be used. Moreover, for the insulating layer 127, a photosensitive resin such as a UV curable resin can be used. The photosensitive resin may be either a positive photosensitive material or a negative photosensitive material and may be formed, for example, by a process similar to a lithography process with the use of a photoresist or the like.

Note that after the formation of the insulating layer 127, it is preferable to perform baking treatment for reducing moisture and oxygen contained in the insulating layer 127. FIG. 27 shows examination results by TDS on the amount of released moisture ($H_2O$) and oxygen ($O_2$) in a chemically amplified negative resist that can be used for the insulating layer 127, up to around 500° C. Three samples with varied baking treatment conditions are compared in FIG. 27. It is found that the amount of released moisture and oxygen is smaller in the samples subjected to baking than in the sample that is not subjected to baking treatment after PEB (post exposure baking). In addition, it is found from FIG. 27 that the amount of released moisture and oxygen is smaller in the condition with baking at a higher temperature (110° C. for one hour) than in the condition with baking at 100° C. for one hour. Therefore, after PEB, baking is preferably performed at a temperature range which does not cause damage to the EL layers. Note that in the baking process, vacuum baking is preferable as compared with air baking because vacuum baking makes it possible to cause degassing of released moisture or the like at a lower temperature. There is no particular limitation on the ultimate vacuum pressure of the vacuum baking and the ultimate vacuum pressure of the vacuum baking is lower than normal pressure.

Next, ashing treatment is performed to perform planarization treatment on the insulating layer 127 (see FIG. 24B). The aperture ratio is reduced if the insulating layer 127 includes a region overlapping with the EL layers; therefore, it is preferable that the insulating layer 127 do not exist over the EL layers. Note that this process is unnecessary in the case where the insulating layer 127 does not exist over the EL layers when the insulating layer 127 is formed. In addition, as long as the insulating layer 127 over the EL layers can be removed, the top surface of the insulating layer 127 can be slightly recessed or projected as shown by a dashed line in the drawing.

<Formation of Barrier Film 130*f*>

Next, a barrier film 130*f* is formed over the protective film 128Bf and the insulating layer 127 (see FIG. 24C). Providing the barrier film 130*f* can inhibit degassing and the like from the insulating layer 127, thereby further improving the reliability of the light-emitting devices. As the barrier film 130*f*, an inorganic film same as the protective film 125Rf can be formed by a CVD method, an ALD method, a sputtering method, or the like.

<Formation of Resist Mask 143*d*>

Next, a resist mask 143*d* is formed over the insulating layer 127 (see FIG. 24D). The resist mask 143*d* can be formed by a lithography process. The resist mask 143*d* is preferably formed so as not to overlap with the EL layers.

<Formation of Barrier Layer 130 and Formation of Protective Layer 128B>

Next, the barrier film 130*f* and the protective film 128Bf are etched by a dry etching method to form a barrier layer 130 and a protective layer 128B (see FIG. 24E).

<Formation of Protective Layer 126B and Removal of Protective Layers 125R, 125G, and 125B>

Then, the protective film 126Bf is etched using the barrier layer 130 as a mask to form a protective layer 126B. Furthermore, the protective layers 125R, 125G, and 125B are removed (see FIG. 24F). Note that the protective layer 126B and the protective layer 128B are formed on the side surface of the EL layer 112B, the side surface of the protective layer 125B, and the side surface of the pixel electrode 111, but they only need to cover at least the side surface of the EL layer 112B. Furthermore, the protective layer 126B and the protective layer 128B may be formed to overlap with the protective layer 126G and the protective layer 128G.

For the etching of part of the protective film 126Bf and the removal of the protective layers 125R, 125G, and 125B, it is preferable to use a wet etching method or the like using an etchant suitable for the constituent materials. Note that baking treatment is preferably performed after the process. A vacuum baking apparatus or a deposition apparatus for the next process can be used for the baking process. As the condition which does not give damage to the EL layers 112R, 112G, and 112B, the vacuum baking is performed at a temperature lower than or equal to 100° C., preferably, lower than or equal to 90° C., further preferably lower than or equal to 80° C. In the case of vacuum baking at 80° C., the sufficient amount of moisture (H$_2$O) has been released in 90 minutes or more according to the measurement by TDS.

<Formation of Common Electrode>

Then, a conductive layer to be the common electrode 113 of the light-emitting devices is formed over the EL layer 112R, the EL layer 112G, and the EL layer 112B that are exposed in the previous process and the barrier layer 130 (see FIG. 25A). For the common electrode 113, either one of a thin metal film that semi-transmits light emitted from the light-emitting layers (e.g., an alloy of silver and magnesium) and a light-transmitting conductive film (e.g., indium tin oxide or an oxide containing one or more of indium, gallium, zinc, and the like) or a stack of these films can be used. The common electrode 113 formed using such a film can be referred to as an electrode having a light-transmitting property. For the process of forming the conductive layer to be the common electrode 113, an evaporation apparatus and/or a sputtering apparatus can be used, for example.

Note that before the formation of the common electrode 113, a layer having a function of any of an electron-injection layer, an electron-transport layer, a charge-generation layer, a hole-transport layer, and a hole-injection layer may be provided as a common layer over the EL layer 112R, the EL layer 112G, and the EL layer 112B, so that the reliability is improved.

When the electrodes having a light-reflecting property are included as the pixel electrodes 111 and the electrode having a light-transmitting property is included as the common electrode 113, light emitted from the light-emitting layers can be emitted to the outside through the common electrode 113. In other words, top emission light-emitting devices are formed.

<Formation of Protective Layer>

Next, the protective layer 121 is formed over the common electrode 113 (see FIG. 25B). A sputtering apparatus, a CVD apparatus, an ALD apparatus, or the like can be used for the process of forming the protective layer 121.

The above is the example of the manufacturing method of a light-emitting device that can be manufactured with the manufacturing equipment of one embodiment of the present invention. Note that FIG. 25C is an enlarged view of a region a shown in FIG. 25B. FIG. 25D is an enlarged view of a region b shown in FIG. 25B.

In the light-emitting device that can be manufactured with manufacturing equipment of one embodiment of the present invention, the pixel electrode and the EL layer may have areas equal to each other as illustrated in FIG. 25E. Alternatively, as illustrated in FIG. 25F, the area of the EL layer may be larger than the area of the pixel electrode. With such a structure, the aperture ratio can be further increased.

Manufacturing Equipment Example

Figure 26:
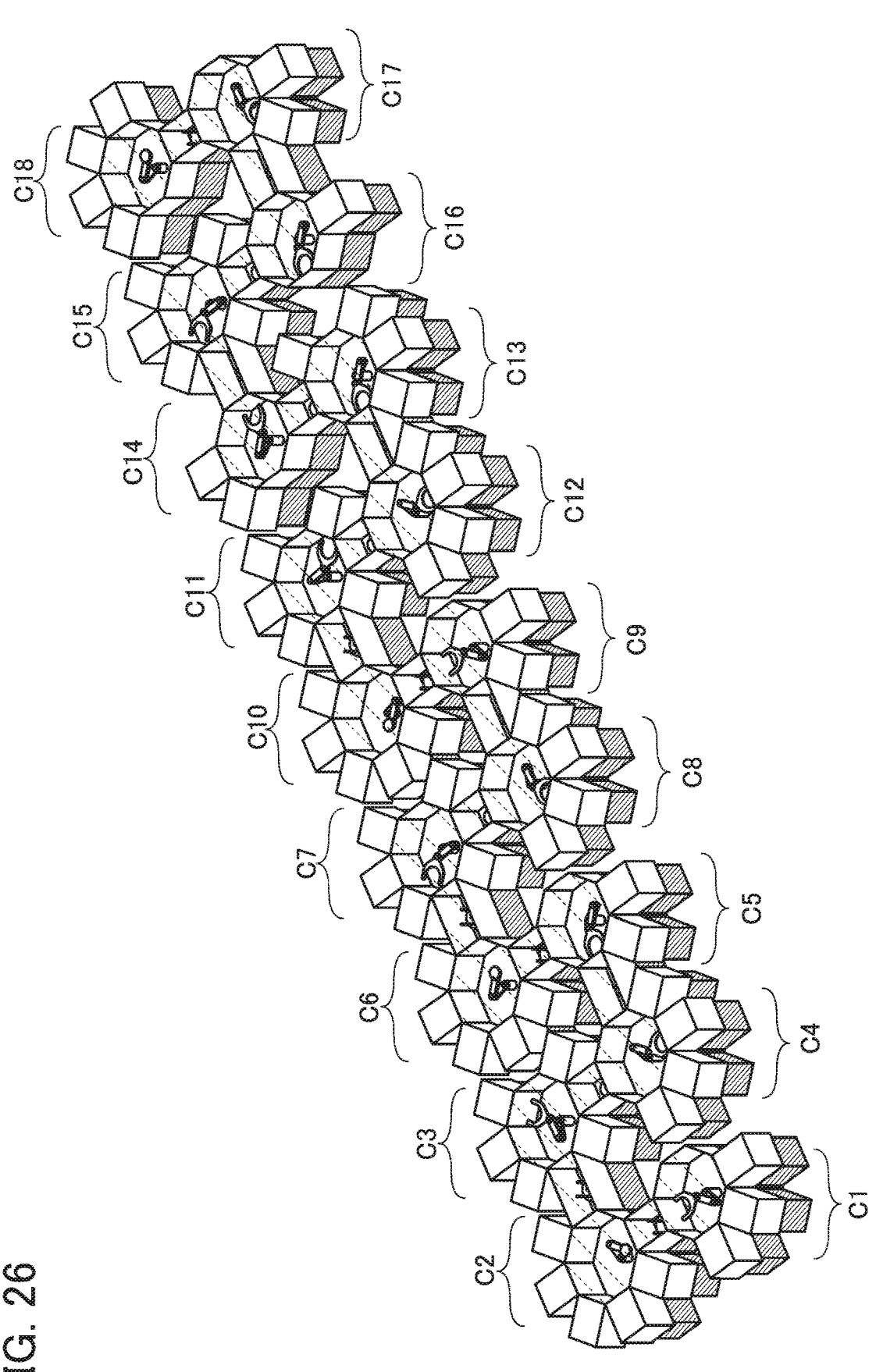
FIG. 26 is a diagram illustrating manufacturing equipment.

FIG. 26 illustrates an example of manufacturing equipment that can be used for the above-described manufacturing processes from the formation of the EL film 112Rf to the formation of the protective layer 121. The basic structure of the manufacturing equipment illustrated in FIG. 26 is similar to that of the manufacturing equipment illustrated in FIG. 3 to FIG. 8.

The cluster C1 to the cluster C18 are specifically described below. FIG. 26 is a schematic perspective view of the whole of the manufacturing equipment, where utilities, gate valves, and the like are not illustrated. In the drawing, the insides of the transfer chambers TF1 to TF18 and the loadlock chambers B1 to B17 are made visible for the sake of clarity.

<Cluster C1>

The cluster C1 includes the load chamber LD and the normal-pressure process apparatuses A1 and A2. The normal-pressure process apparatus A1 can be a cleaning apparatus, and the normal-pressure process apparatus A2 can be a baking apparatus. In the cluster C1, a cleaning process prior to deposition of the EL film 112Rf is performed.

<Cluster C2>

The cluster C2 includes the vacuum process apparatuses V1 to V5. The vacuum process apparatuses V1 to V5 include a surface treatment apparatus for performing surface treatment on a base (pixel electrode) where the EL film 112Rf is formed, an evaporation apparatus for forming the EL film 112Rf, and a deposition apparatus (e.g., a sputtering apparatus or an ALD apparatus) for forming the protective film 125Rf. For example, the vacuum process apparatus V1 can be a plasma treatment apparatus, and the vacuum process apparatus V2 can be an apparatus for forming an organic compound layer to be a light-emitting layer (R). The vacuum process apparatuses V3 and V4 can be assigned to apparatuses for forming organic compound layers such as an electron-injection layer, an electron-transport layer, a charge-generation layer, a hole-transport layer, and a hole-injection layer. Furthermore, the vacuum process apparatus V5 can be assigned to an apparatus for forming the protective film 125Rf.

<Cluster C3>

The cluster C3 includes the normal-pressure process apparatuses A3 to A7. The normal-pressure process apparatuses A3 to A7 can be apparatuses used for a lithography process. For example, the normal-pressure process apparatus A3 can be a resin (photoresist) application apparatus, the normal-pressure process apparatus A4 can be a pre-baking apparatus, the normal-pressure process apparatus A5 can be a light-exposure apparatus, the normal-pressure process apparatus A6 can be a developing apparatus, and the normal-pressure process apparatus A7 can be a post-baking apparatus. Alternatively, the normal-pressure process apparatus A5 may be a nanoimprint apparatus.

<Cluster C4>

The cluster C4 includes the vacuum process apparatuses V6 to V10. For example, the vacuum process apparatus V6 can be a dry etching apparatus for forming the EL layer 112R. The vacuum process apparatus V7 can be a plasma treatment apparatus for performing cleaning on the side surface of the EL layer 112R and the like. The vacuum process apparatus V8 can be a standby chamber. The vacuum process apparatus V9 can be an ALD apparatus for performing deposition of the protective film 126Rf and the protective film 128Rf. The vacuum process apparatus V10 can be a dry etching apparatus for forming the protective layer 126R and the protective layer 128R.

<Cluster C5>

The cluster C5 includes the normal-pressure process apparatuses A8 and A9. The normal-pressure process apparatus A8 can be a cleaning apparatus, and the normal-pressure process apparatus A9 can be a baking apparatus. In the cluster C5, a cleaning process prior to deposition of the EL film 112Gf is performed.

<Cluster C6>

The cluster C6 includes the vacuum process apparatuses V11 to V15. The vacuum process apparatuses V11 to V15 include a surface treatment apparatus for performing surface treatment on a base (pixel electrode) where the EL film 112Gf is formed, an evaporation apparatus for forming the EL film 112Gf, and a deposition apparatus (e.g., a sputtering apparatus or an ALD apparatus) for forming the protective film 112Gf. For example, the vacuum process apparatus V11 can be a plasma treatment apparatus, and the vacuum process apparatus V12 can be an apparatus for forming an organic compound layer to be a light-emitting layer (G). The vacuum process apparatuses V13 and V14 can be assigned to apparatuses for forming organic compound layers such as an electron-injection layer, an electron-transport layer, a charge-generation layer, a hole-transport layer, and a hole-injection layer. Furthermore, the vacuum process apparatus V15 can be assigned to an apparatus for forming the protective film 125Gf.

<Cluster C7>

The cluster C7 includes the normal-pressure process apparatuses A10 to A14. The normal-pressure process apparatuses A10 to A14 can be apparatuses used for a lithography process.

The apparatuses can be assigned in a manner similar to those of the cluster C3.

<Cluster C8>

The cluster C8 includes vacuum process apparatuses V16 to V20. For example, the vacuum process apparatus V16 can be a dry etching apparatus for forming the EL layer 112G. The vacuum process apparatus V17 can be a plasma treatment apparatus for performing cleaning on the side surface of the EL layer 112G and the like. The vacuum process apparatus V18 can be a standby chamber. The vacuum process apparatus V19 can be an ALD apparatus for performing deposition of the protective film 126Gf and the protective film 128Gf. The vacuum process apparatus V20 can be a dry etching apparatus for forming the protective layer 126G and the protective layer 128G.

<Cluster C9>

The cluster C9 includes the normal-pressure process apparatuses A15 and A16. The normal-pressure process apparatus A15 can be a cleaning apparatus, and the normal-pressure process apparatus A16 can be a baking apparatus. In the cluster C9, a cleaning process prior to deposition of the EL film 112Bf is performed.

<Cluster C10>

The cluster C10 includes the vacuum process apparatuses V21 to V25. The vacuum process apparatuses V21 to V25 include a surface treatment apparatus for performing surface treatment on a base (pixel electrode) where the EL film 112Bf is formed, an evaporation apparatus for forming the EL film 112Bf, and a deposition apparatus (e.g., a sputtering apparatus or an ALD apparatus) for forming the protective film 112Bf. For example, the vacuum process apparatus V21 can be a plasma treatment apparatus, and the vacuum process apparatus V22 can be an apparatus for forming an organic compound layer to be a light-emitting layer (B). The vacuum process apparatuses V23 and V24 can be assigned to apparatuses for forming organic compound layers such as an electron-injection layer, an electron-transport layer, a charge-generation layer, a hole-transport layer, and a hole-injection layer. Furthermore, the vacuum process apparatus V25 can be assigned to an apparatus for forming the protective film 125Gf.

<Cluster C11>

The cluster C11 includes the normal-pressure process apparatuses A17 to A21. The normal-pressure process apparatuses A17 to A21 can be apparatuses used for a lithography process. The apparatuses can be assigned in a manner similar to those of the cluster C3.

<Cluster C12>

The cluster C12 includes the vacuum process apparatuses V26 to V29. For example, the vacuum process apparatus V26 can be a dry etching apparatus for forming the EL layer 112B. The vacuum process apparatus V27 can be a plasma treatment apparatus for performing cleaning on the side surface of the EL layer 112G and the like. The vacuum process apparatus V28 can be a standby chamber. The vacuum process apparatus V29 can be an ALD apparatus for performing deposition of the protective film 126Bf and the protective film 128Bf.

<Cluster C13>

The cluster C13 includes the normal-pressure process apparatuses A22 to A26. The normal-pressure process apparatuses A22 to A26 can be apparatuses used for a lithography process.

The apparatuses can be assigned in a manner similar to those of the cluster C3.

<Cluster C14>

The cluster C14 includes the vacuum process apparatuses V30 and V31. The vacuum process apparatus V30 can be an ashing apparatus for planarizing the insulating layer 127 or a dry etching apparatus having an ashing function. The vacuum process apparatus V31 can be a deposition apparatus (e.g., a sputtering apparatus, an ALD apparatus, or a CVD apparatus) for forming the barrier film 130f.

<Cluster C15>

The cluster C15 includes the normal-pressure process apparatuses A27 to A31. The normal-pressure process apparatuses A27 to A31 can be apparatuses used for a lithography process.

The apparatuses can be assigned in a manner similar to those of the cluster C3.

<Cluster C16>

The cluster C16 includes the vacuum process apparatus V32. The vacuum process apparatus V29 can be a dry etching apparatus for etching the barrier film 130f and the protective film 128Bf.

<Cluster C17>

The cluster C15 includes the normal-pressure process apparatuses A32 and A33. The normal-pressure process apparatus A32 can be a wet etching apparatus. In the normal-pressure process apparatus A32, an etching process of the protective film 126Bf and the protective layers 125R, 125G, and 125B is performed.

<Cluster C18>

The cluster C18 includes the vacuum process apparatuses V33 to V35 and the unload chamber ULD. The vacuum process apparatus V33 can be assigned to an apparatus (e.g., an evaporation apparatus) for forming an organic compound layer that is any of an electron-injection layer, an electron-transport layer, a charge-generation layer, a hole-transport layer, and a hole-injection layer. The vacuum process apparatus V34 can be a deposition apparatus (e.g., a sputtering apparatus) for forming the common electrode 113. The vacuum process apparatus V35 can be a deposition apparatus (e.g., a sputtering apparatus) for forming the protective layer 121. Alternatively, another vacuum process apparatus V may be provided and a plurality of different deposition apparatuses (such as an evaporation apparatus and an ALD apparatus) are provided to form the common electrode 113 and the protective layer 121 so as to have stacked films.

Processes using the manufacturing equipment illustrated in FIG. 26, treatment apparatuses, and components corresponding to the manufacturing method illustrated in FIG. 21A to FIG. 25B are summarized in Table 1 and Table 2. Note that carrying of the substrate into and out of the loadlock chamber and the apparatuses are not described.

TABLE 1

| Process No. | Process | Treatment apparatus | | Corresponding component(s) |
|---|---|---|---|---|
| 1 | Cleaning | C1 | A1 | |
| 2 | Baking | | A2 | |
| 3 | Pixel electrode surface treatment | C2 | V1 | 111 |
| 4 | Organic compound layer deposition | | V3 | 112Rf |
| 5 | Organic compound layer (light-emitting layer) deposition | | V2 | |
| 6 | Organic compound layer deposition | | V4 | |
| 7 | Protective film deposition | | V5 | 125Rf |
| 8 | Photoresist application | C3 | A3 | 143a |
| 9 | Pre-baking | | A4 | |
| 10 | Light exposure | | A5 | |
| 11 | Development | | A6 | |
| 12 | Post-baking | | A7 | |
| 13 | Protective film etching | C4 | V6 | 125R |
| 14 | Organic compound layer etching | | V6 | 112R |
| 15 | Surface cleaning | | V7 | 112R |

TABLE 1-continued

| Process No. | Process | Treatment apparatus | | Corresponding component(s) |
|---|---|---|---|---|
| 16 | Standby | | V8 | |
| 17 | Protective film deposition | | V9 | 126Rf, 128Rf |
| 18 | Protective layer formation | | V10 | 126R, 128R |
| 19 | Cleaning | C5 | A8 | |
| 20 | Baking | | A9 | |
| 21 | Pixel electrode surface treatment | C6 | V11 | 111 |
| 22 | Organic compound layer deposition | | V12 | 112Gf |
| 23 | Organic compound layer (light-emitting layer) deposition | | V13 | |
| 24 | Organic compound layer deposition | | V14 | |
| 25 | Protective film deposition | | V15 | 125Gf |
| 26 | Photoresist application | C7 | A10 | 143b |
| 27 | Pre-baking | | A11 | |
| 28 | Light exposure | | A12 | |
| 29 | Development | | A13 | |
| 30 | Post-baking | | A14 | |
| 31 | Protective film etching | C8 | V16 | 125G |
| 32 | Organic compound layer etching | | V16 | 112G |
| 33 | Surface cleaning | | V17 | 112G |
| 34 | Standby | | V18 | |
| 35 | Protective film deposition | | V19 | 126Gf, 128Gf |
| 36 | Protective layer formation | | V20 | 126G, 128G |
| 37 | Cleaning | C9 | A15 | |
| 38 | Baking | | A16 | |

TABLE 2

| Process No. | Process | Treatment apparatus | | Corresponding component(s) |
|---|---|---|---|---|
| 39 | Pixel electrode surface treatment | C10 | V21 | 111 |
| 40 | Organic compound layer deposition | | V22 | 112Bf |
| 41 | Organic compound layer (light-emitting layer) deposition | | V23 | |
| 42 | Organic compound layer deposition | | V24 | |
| 43 | Protective film deposition | | V25 | 125Bf |
| 44 | Photoresist application | C11 | A17 | 143c |
| 45 | Pre-baking | | A18 | |
| 46 | Light exposure | | A19 | |
| 47 | Development | | A20 | |
| 48 | Post-baking | | A21 | |
| 49 | Protective film etching | C12 | V26 | 125B |
| 50 | Organic compound layer etching | | V26 | 112B |
| 51 | Surface cleaning | | V27 | 112B |
| 52 | Standby | | V28 | |
| 53 | Protective film deposition | | V29 | 126Bf, 128Bf |
| 54 | Photosensitive resin application | C13 | A22 | 127 |
| 55 | Pre-baking | | A23 | |
| 56 | Light exposure | | A24 | |
| 57 | Development | | A25 | |
| 58 | Post-baking | | A26 | |
| 59 | Insulating layer planarization (ashing) | C14 | V30 | 127 |
| 60 | Barrier film deposition | | V31 | 130f |
| 61 | Photoresist application | C15 | A27 | 143d |
| 62 | Pre-baking | | A28 | |
| 63 | Light exposure | | A29 | |
| 64 | Development | | A30 | |
| 65 | Post-baking | | A31 | |
| 66 | Barrier film etching | C16 | V32 | 130 |
| 67 | Protective film etching | | V32 | 128B |
| 68 | Protective film etching (removal) | C17 | A32 | 126B |
| 69 | Baking | | A33 | |
| 70 | Organic compound layer deposition | C18 | V33 | 113 |
| 71 | Common electrode deposition | | V34 | |
| 72 | Protective layer deposition | | V35 | 121 |

The manufacturing equipment of one embodiment of the present invention has a function of performing Process No. 1 to Process No. 72 in Table 1 and Table 2 automatically.

This embodiment can be implemented in an appropriate combination with the structures described in the other embodiments.

REFERENCE NUMERALS

A: normal-pressure process apparatus, A1: normal-pressure process apparatus, A2: normal-pressure process apparatus, A3: normal-pressure process apparatus, A4: normal-pressure process apparatus, A5: normal-pressure process apparatus, A6: normal-pressure process apparatus, A7: normal-pressure process apparatus, A8: normal-pressure process apparatus, A9: normal-pressure process apparatus, A10: normal-pressure process apparatus, A11: normal-pressure process apparatus, A12: normal-pressure process apparatus, A13: normal-pressure process apparatus, A14: normal-pressure process apparatus, A15: normal-pressure process apparatus, A16: normal-pressure process apparatus, A17: normal-pressure process apparatus, A18: normal-pressure process apparatus, A19: normal-pressure process apparatus, A20: normal-pressure process apparatus, A21: normal-pressure process apparatus, A22: normal-pressure process apparatus, A23: normal-pressure process apparatus, A24: normal-pressure process apparatus, A25: normal-pressure process apparatus, A26: normal-pressure process apparatus, A27: normal-pressure process apparatus, A28: normal-pressure process apparatus, A29: normal-pressure process apparatus, A30: normal-pressure process apparatus, A31: normal-pressure process apparatus, A32: normal-pressure process apparatus, A33: normal-pressure process apparatus, B1: loadlock chamber, B2: loadlock chamber, B3: loadlock chamber, B4: loadlock chamber, B5: loadlock chamber, B6: loadlock chamber, B7: loadlock chamber, B8: loadlock chamber, B9: loadlock chamber, B10: loadlock chamber, B11: loadlock chamber, B12: loadlock chamber, B13: loadlock chamber, B14: loadlock chamber, B15: loadlock chamber, B16: loadlock chamber, B17: loadlock chamber, C: plasma treatment apparatus, D: deposition apparatus, C1: cluster, C2: cluster, C3: cluster, C4: cluster, C5: cluster, C6: cluster, C7: cluster, C8: cluster, C9: cluster, C10: cluster, C11: cluster, C12: cluster, C13: cluster, C14: cluster, C15: cluster, C16: cluster, C17: cluster, C18: cluster, E1: etching apparatus, E2: etching apparatus, S: surface treatment apparatus, TF: transfer chamber, TF1: transfer chamber, TF2: transfer chamber, TF3: transfer chamber, TF4: transfer chamber, TF5: transfer chamber, TF6: transfer chamber, TF7: transfer chamber, TF8: transfer chamber, TF9: transfer chamber, TF10: transfer chamber, TF11: transfer chamber, TF12: transfer chamber, TF13: transfer chamber, TF14: transfer chamber, TF15: transfer chamber, TF16: transfer chamber, TF17: transfer chamber, TF18: transfer chamber, V: vacuum process apparatus, V1: vacuum process apparatus, V2: vacuum process apparatus, V3: vacuum process apparatus, V4: vacuum process apparatus, V5: vacuum process apparatus, V6: vacuum process apparatus, V7: vacuum process apparatus, V8: vacuum process apparatus, V9: vacuum process apparatus, V10: vacuum process apparatus, V11: vacuum process apparatus, V12: vacuum process apparatus, V13: vacuum process apparatus, V14: vacuum process apparatus, V15: vacuum process apparatus, V16: vacuum process apparatus, V17: vacuum process apparatus, V18: vacuum process apparatus, V19: vacuum process apparatus, V20: vacuum process apparatus, V21: vacuum process apparatus, V22: vacuum process apparatus, V23: vacuum process apparatus, V24: vacuum process apparatus, V25: vacuum process apparatus, V26: vacuum process apparatus, V27: vacuum process apparatus, V28: vacuum process apparatus, V29: vacuum process apparatus, V30: vacuum process apparatus, V31: vacuum process apparatus, V32: vacuum process apparatus, V33: vacuum process apparatus, V34: vacuum process apparatus, V35: vacuum process apparatus, W: standby chamber, 30: deposition apparatus, 31: deposition material supply unit, 32: mask jig, 33: substrate alignment unit, 35: opening portion, 40: gate valve, 51: substrate holder, 52: evaporation source, 53: shutter, 54: outlet, 55: inlet, 56: lower electrode, 57: target, 58: upper electrode, 59: shower plate, 60: substrate, 60$a$: substrate, 60$b$: substrate, 61: heater, 62: substrate holder, 63: substrate holder, 70: carrying device, 70$a$: carrying device, 70$b$: carrying device, 70$c$: carrying device, 70$d$: carrying device, 70$e$: carrying device, 70$f$: carrying device, 70$g$: carrying device, 70$h$: carrying device, 70$i$: carrying device, 70$j$: carrying device, 70$k$: carrying device, 70$m$: carrying device, 70$n$: carrying device, 70$p$: carrying device, 71$a$: carrying device, 71$b$: carrying device, 71$c$: carrying device, 71$d$: carrying device, 80$a$: stage, 80$b$: stage, 80$c$: stage, 80$d$: stage, 80$e$: stage, 80$f$: stage, 80$g$: stage, 81$a$: stage, 81$b$: stage, 81$c$: stage, 81$d$: stage, 81$e$: stage, 81$f$: stage, 81$g$: stage, 81$h$: stage, 81$i$: stage, 81$j$: stage, 82: pin, 91: lifting mechanism, 92: arm, 93: hand portion, 94: lifting mechanism, 95: arm, 96: substrate fixing portion, 97: rotation mechanism, 100: display device, 110B: light-emitting device, 110G: light-emitting device, 110R: light-emitting device, 111: pixel electrode, 112B: EL layer, 112Bf: EL film, 112G: EL layer, 112Gf: EL film, 112R: EL layer, 112Rf: EL film, 112W: EL layer, 113: common electrode, 114B: coloring layer, 114G: coloring layer, 114R: coloring layer, 115: transistor, 116: transistor, 117: transistor, 121: protective layer, 125B: protective layer, 125Bf: protective film, 125G: protective layer, 125Gf: protective film, 125R: protective layer, 125Rf: protective film, 126B: protective layer, 126Bf: protective film, 126G: protective layer, 126Gf: protective film, 126R: protective layer, 126Rf: protective film, 127: insulating layer, 128B: protective layer, 128Bf: protective film, 128G: protective layer, 128Gf: protective film, 128R: protective layer, 128Rf: protective film, 130: barrier layer, 130$f$: barrier film, 143$a$: resist mask, 143$b$: resist mask, 143$c$: resist mask, 143$d$: resist mask, 200: transfer device, 201: controller, 202: power source, 203: battery, 204: wheel, 205: gas cylinder, 206: valve, 207: valve, 208: carry-in/out port, 209: transfer device, 210: inlet, 211: outlet

The invention claimed is:

1. Manufacturing equipment for a light-emitting device, comprising:
  a load chamber;
  a first etching apparatus;
  a plasma treatment apparatus;
  a standby chamber;
  a deposition apparatus;
  a second etching apparatus;
  an unload chamber;
  a transfer chamber; and
  a carrying device,
  wherein the carrying device is provided in the transfer chamber,
  wherein the load chamber, the first etching apparatus, the plasma treatment apparatus, the standby chamber, the deposition apparatus, the second etching apparatus, and the unload chamber are each connected to the transfer chamber through a gate valve,
  wherein the carrying device is configured to transfer an object to be processed from one of the load chamber, the first etching apparatus, the plasma treatment apparatus, the standby chamber, the deposition apparatus, the second etching apparatus, and the unload chamber to another one of the load chamber, the first etching apparatus, the plasma treatment apparatus, the standby chamber, the deposition apparatus, the second etching apparatus, and the unload chamber, wherein the object to be processed comprising an organic compound film over a substrate, a first inorganic film over the organic compound film, and a resist mask over the first inorganic film is carried into the load chamber, wherein the object to be processed is carried to the first etching apparatus, the plasma treatment apparatus, the standby chamber, the deposition apparatus, and the second etching apparatus in this order, and wherein the organic compound film is processed into an island-shaped organic compound layer, a protective layer is formed on a side surface of the island-shaped organic compound layer, and the object to be processed is carried out to the unload chamber.

2. The manufacturing equipment for a light-emitting device according to claim 1, wherein the first etching apparatus is a dry etching apparatus in which the first inorganic film is formed to have an island shape using the resist mask as a mask and the organic compound film is processed into the island-shaped organic compound layer using the island-shaped first inorganic film as a mask.

3. The manufacturing equipment for a light-emitting device according to claim 2, wherein the first etching apparatus is configured to perform ashing to remove the resist mask.

4. The manufacturing equipment for a light-emitting device, according to claim 1, wherein in the plasma treatment apparatus, a side surface of the island-shaped organic compound layer is irradiated with plasma generated from an inert gas to perform cleaning on the side surface of the island-shaped organic compound layer.

5. The manufacturing equipment for a light-emitting device according to claim 1, wherein the standby chamber is configured to store a plurality of the objects to be processed.

6. The manufacturing equipment for a light-emitting device according to claim 1, wherein the deposition apparatus is an ALD apparatus in which a second inorganic film covering the first inorganic film and the island-shaped organic compound layer is deposited.

7. The manufacturing equipment for a light-emitting device according to claim 6, wherein the deposition apparatus is of a batch processing type.

8. The manufacturing equipment for a light-emitting device according to claim 6, wherein the second etching apparatus is a dry etching apparatus in which the protective layer is formed on the side surface of the island-shaped organic compound layer by performing anisotropic etching on the second inorganic film.

9. Manufacturing equipment for a light-emitting device, wherein the manufacturing equipment for a light-emitting device according to claim 1 is a third cluster, wherein a plurality of apparatuses in which a photolithography process with the resist mask is performed is a second cluster, and wherein a plurality of apparatuses in which a deposition process of the organic compound film and the first inorganic film is performed is a first cluster.

10. The manufacturing equipment for a light-emitting device according to claim 9, wherein the first cluster, the second cluster, and the third cluster are connected in sequence.

11. The manufacturing equipment for a light-emitting device according to claim 9, wherein the object to be processed stored in a container having an inert gas atmosphere is transferred between the first cluster and the second cluster and between the second cluster and the third cluster.

12. The manufacturing equipment for a light-emitting device according to claim 9, wherein three combinations of the first cluster, the second cluster, and the third cluster are included.

13. The manufacturing equipment for a light-emitting device according to claim 9, wherein the first cluster comprises a surface treatment apparatus, and wherein the surface treatment apparatus uses plasma generated from a halogen-containing gas.

14. The manufacturing equipment for a light-emitting device according to claim 9, wherein the first cluster comprises one or more deposition apparatuses selected from an evaporation apparatus, a sputtering apparatus, a CVD apparatus, and an ALD apparatus.

15. The manufacturing equipment for a light-emitting device according to claim 9, wherein the second cluster comprises an application apparatus, a light exposure apparatus, a development apparatus, and a baking apparatus.

16. Manufacturing equipment for a light-emitting device, comprising:

a load chamber;

a first etching apparatus;

a plasma treatment apparatus;

a standby chamber;

a deposition apparatus;

a second etching apparatus;

an unload chamber;

a transfer chamber; and a carrying device, wherein the carrying device is provided in the transfer chamber, wherein the carrying device is configured to transfer an object to be processed between the load chamber, the first etching apparatus, the plasma treatment apparatus, the standby chamber, the deposition apparatus, the second etching apparatus, and the unload chamber, wherein the object to be processed is carried into the load chamber, wherein the object to be processed is carried to the first etching apparatus, the plasma treatment apparatus, the standby chamber, the deposition apparatus, and the second etching apparatus in this order, and wherein the object to be processed is carried out to the unload chamber.

* * * * *